United States Patent
Chiang et al.

(10) Patent No.: US 12,369,369 B2
(45) Date of Patent: Jul. 22, 2025

(54) FIELD EFFECT TRANSISTOR WITH ASYMMETRICAL SOURCE/DRAIN REGION AND METHOD

(71) Applicant: Taiwan Semiconductor Manufacturing Company Ltd., Hsinchu (TW)

(72) Inventors: Kuo-Cheng Chiang, Hsinchu (TW); Shi Ning Ju, Hsinchu (TW); Guan-Lin Chen, Hsinchu (TW); Chia-Hao Chang, Hsinchu (TW); Chih-Hao Wang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 457 days.

(21) Appl. No.: 17/751,573

(22) Filed: May 23, 2022

(65) Prior Publication Data

US 2023/0223442 A1     Jul. 13, 2023

Related U.S. Application Data

(60) Provisional application No. 63/299,355, filed on Jan. 13, 2022.

(51) Int. Cl.
H10D 62/13     (2025.01)
H10D 64/23     (2025.01)

(52) U.S. Cl.
CPC ......... H10D 62/151 (2025.01); H10D 64/259 (2025.01)

(58) Field of Classification Search
CPC .................... H01L 29/0847; H01L 29/41783
See application file for complete search history.

(56) References Cited

U.S. PATENT DOCUMENTS

| | | | |
|---|---|---|---|
| 2020/0105871 A1 | 4/2020 | Glass et al. | |
| 2020/0219970 A1* | 7/2020 | Mannebach | H01L 29/66439 |
| 2021/0020644 A1 | 1/2021 | Paul et al. | |
| 2021/0074729 A1* | 3/2021 | Kim | H01L 21/823814 |
| 2021/0376076 A1 | 12/2021 | Su et al. | |

FOREIGN PATENT DOCUMENTS

| | | |
|---|---|---|
| TW | 202129971 A | 8/2021 |
| TW | 202201720 A | 1/2022 |

* cited by examiner

*Primary Examiner* — Jay C Kim
*Assistant Examiner* — Woo K Lee
(74) *Attorney, Agent, or Firm* — Seed IP Law Group

(57) ABSTRACT

A device includes a first vertical stack of nanostructures over a substrate, a second vertical stack of nanostructures over the substrate, a wall structure between and in direct contact with the first and second vertical stacks, a gate structure wrapping around three sides of the nanostructures and a source/drain region beside the first vertical stack of nanostructures.

20 Claims, 41 Drawing Sheets

US 12,369,369 B2

1

FIELD EFFECT TRANSISTOR WITH ASYMMETRICAL SOURCE/DRAIN REGION AND METHOD

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
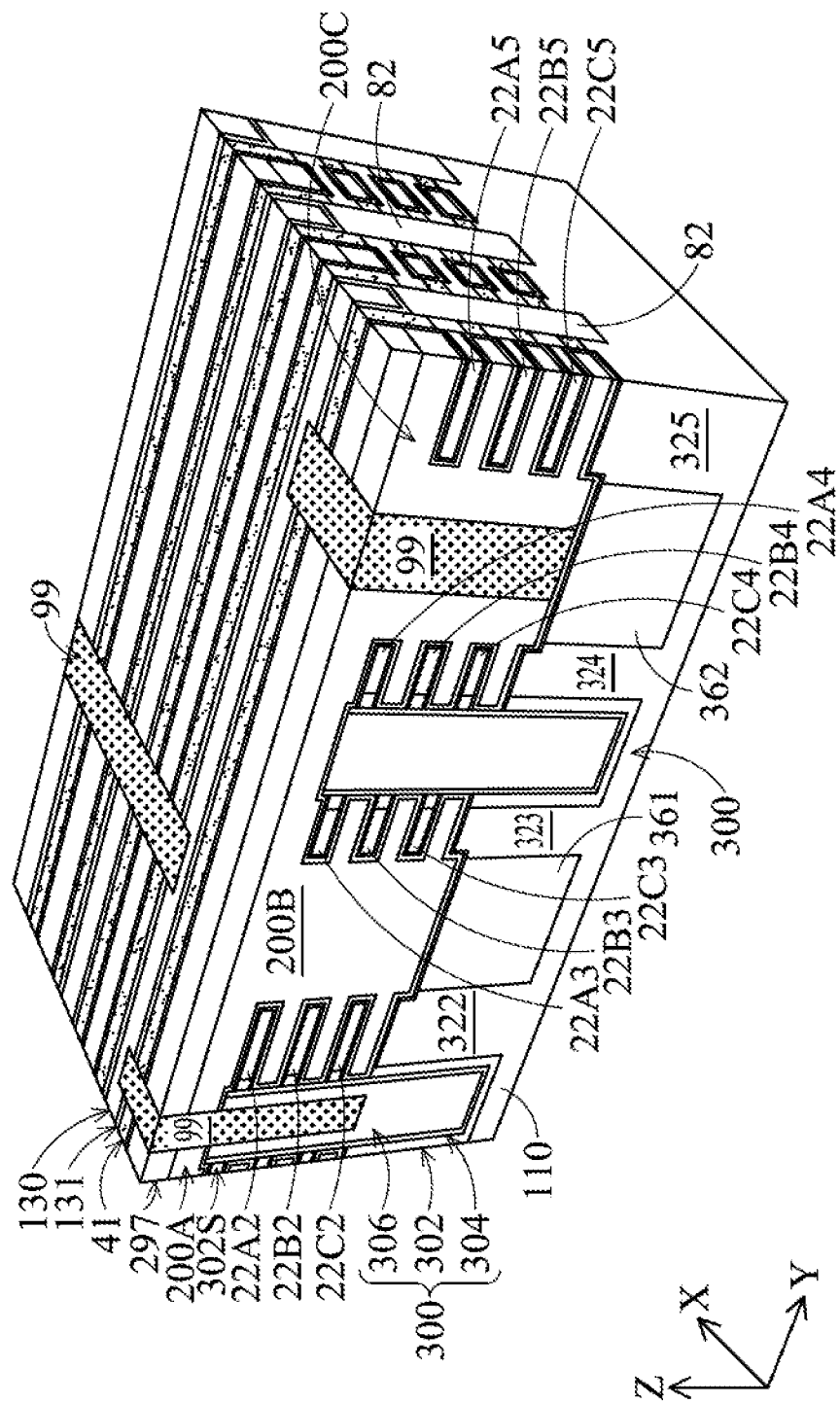
FIGS. 1A-1S are diagrammatic top and cross-sectional side views of a portion of an IC device fabricated according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Terms indicative of relative degree, such as "about," "substantially," and the like, should be interpreted as one having ordinary skill in the art would in view of current technological norms.

The present disclosure is generally related to semiconductor devices, and more particularly to field-effect transistors (FETs), such as planar FETs, three-dimensional fin-line FETs (FinFETs), or nanostructure devices. Examples of nanostructure devices include gate-all-around (GAA) devices, nanosheet FETs (NSFETs), nanowire FETs (NWFETs), and the like. In advanced technology nodes, active area spacing between nanostructure devices is generally uniform, source/drain epitaxy structures are symmetrical, and a metal gate surrounds four sides of the nanostructures (e.g., nanosheets). Gate-drain capacitance ("Cgd") is increased due to larger metal gate endcap and increased source/drain epitaxy size.

Embodiments of the disclosure reduce gate-drain capacitance by reducing metal gate endcap and source/drain epitaxy size. Active area spacing is also reduced. In some embodiments, a wall structure is formed at cell boundaries. The wall structure may be a multi-layer structure. Source/drain epitaxies adjacent the wall structure are cut or trimmed to prevent merger of neighboring source/drain epitaxies. By reducing the metal gate endcap and source/drain epitaxy lateral dimensions, gate-drain capacitance may be reduced. As such, device performance is boosted, and active area spacing between nanostructure devices may be reduced, which saves chip area.

The nanostructure transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the nanostructure transistor structure.

Figure 1B:
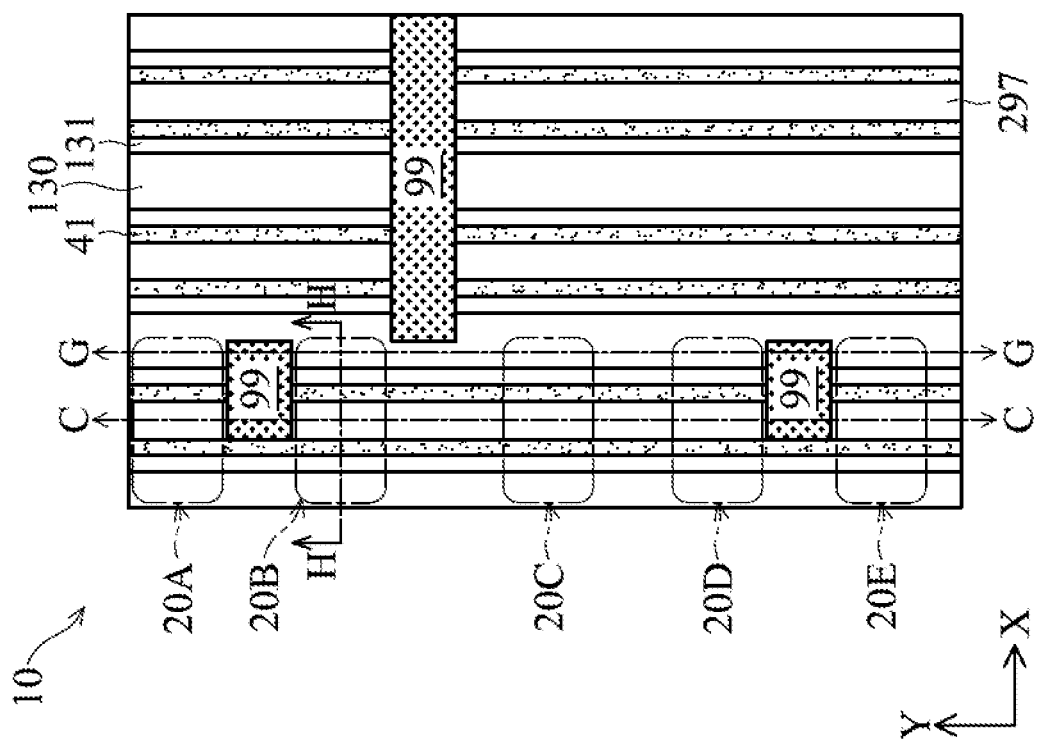
Figure 1C:
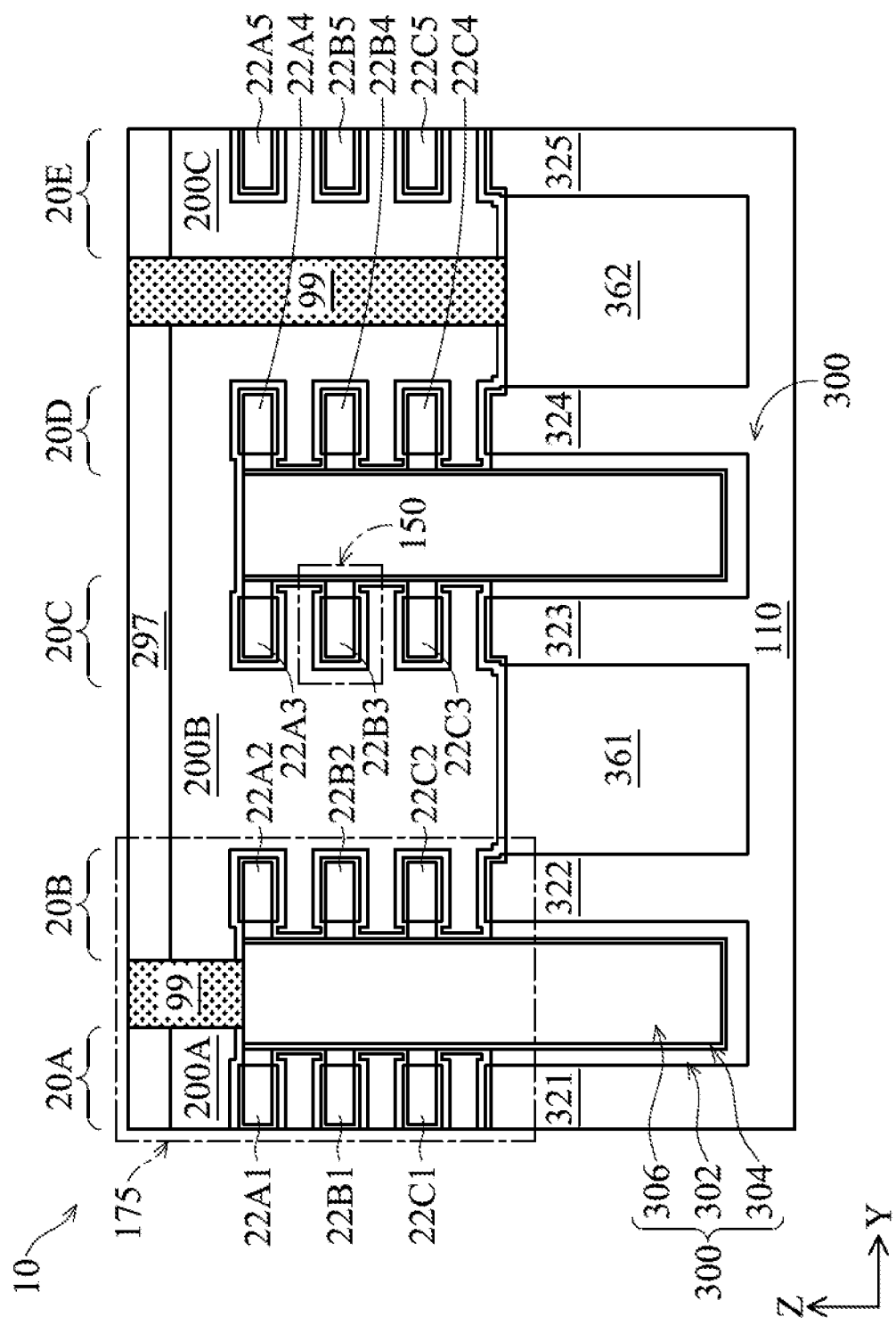
Figure 1E:
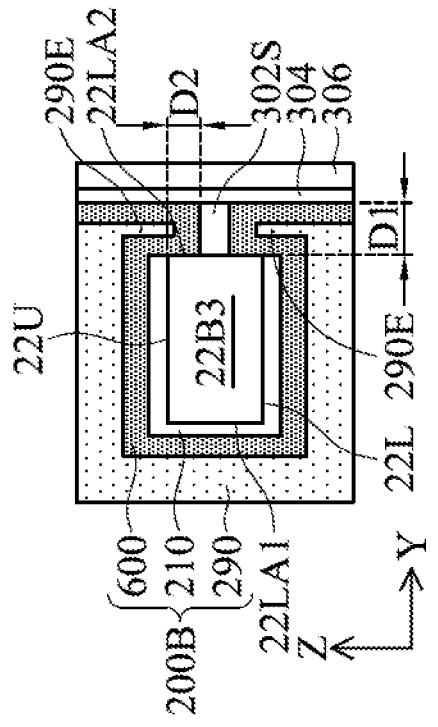
Figure 1F:
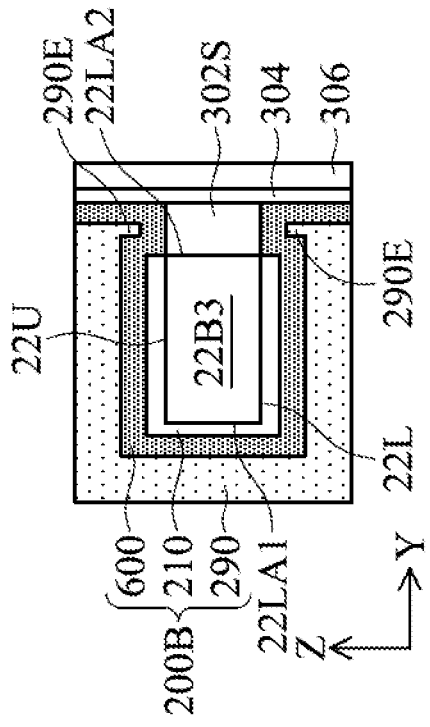
Figure 1D:
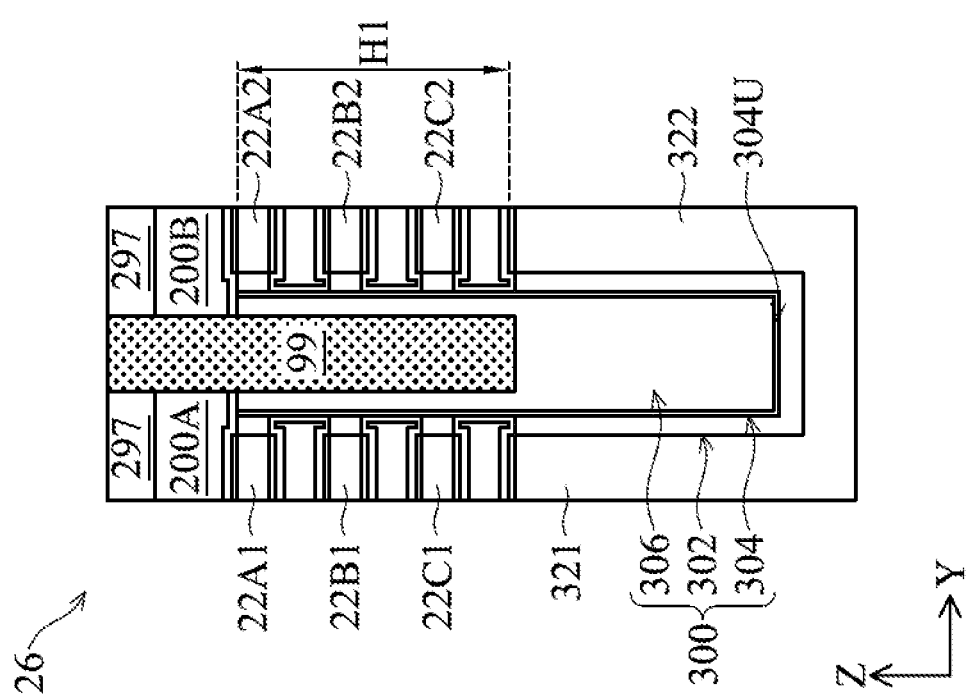
Figure 1G:
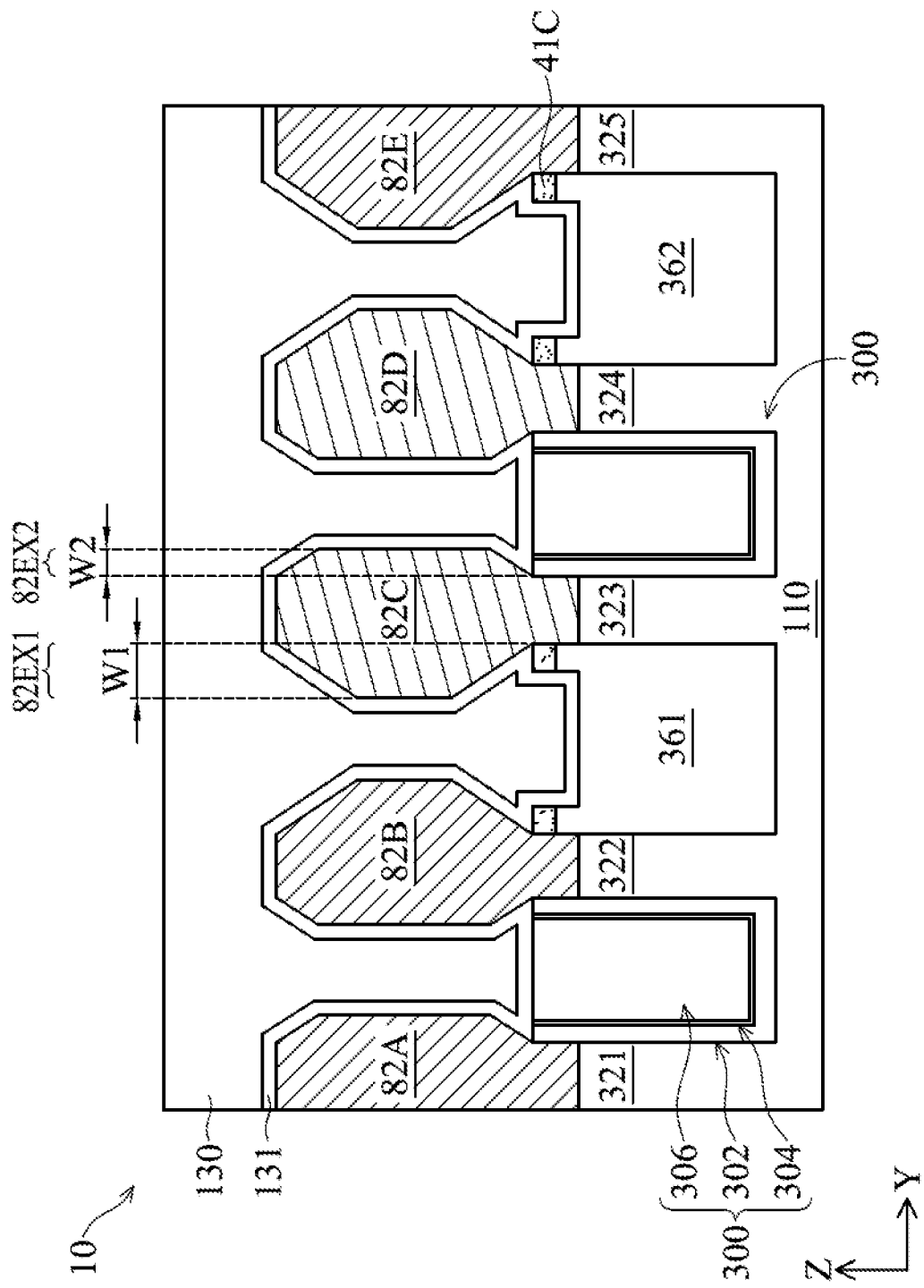
Figure 1H:
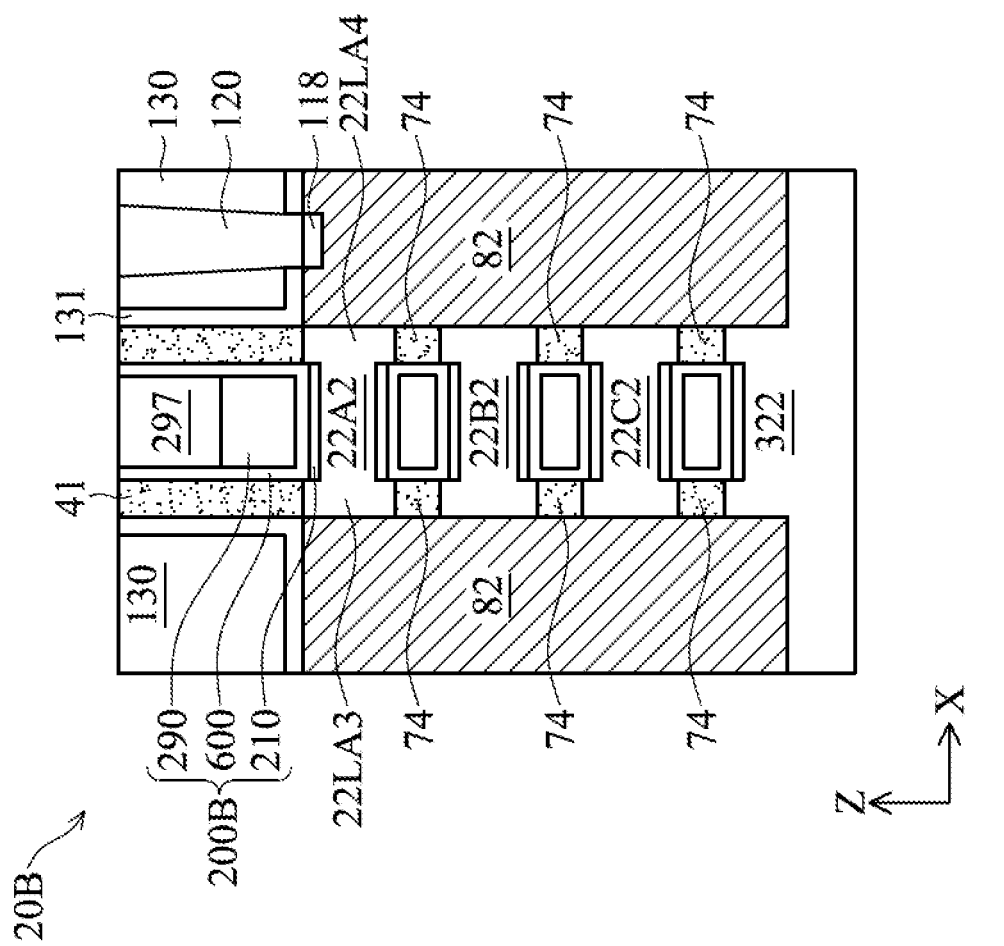
Figure 1I:
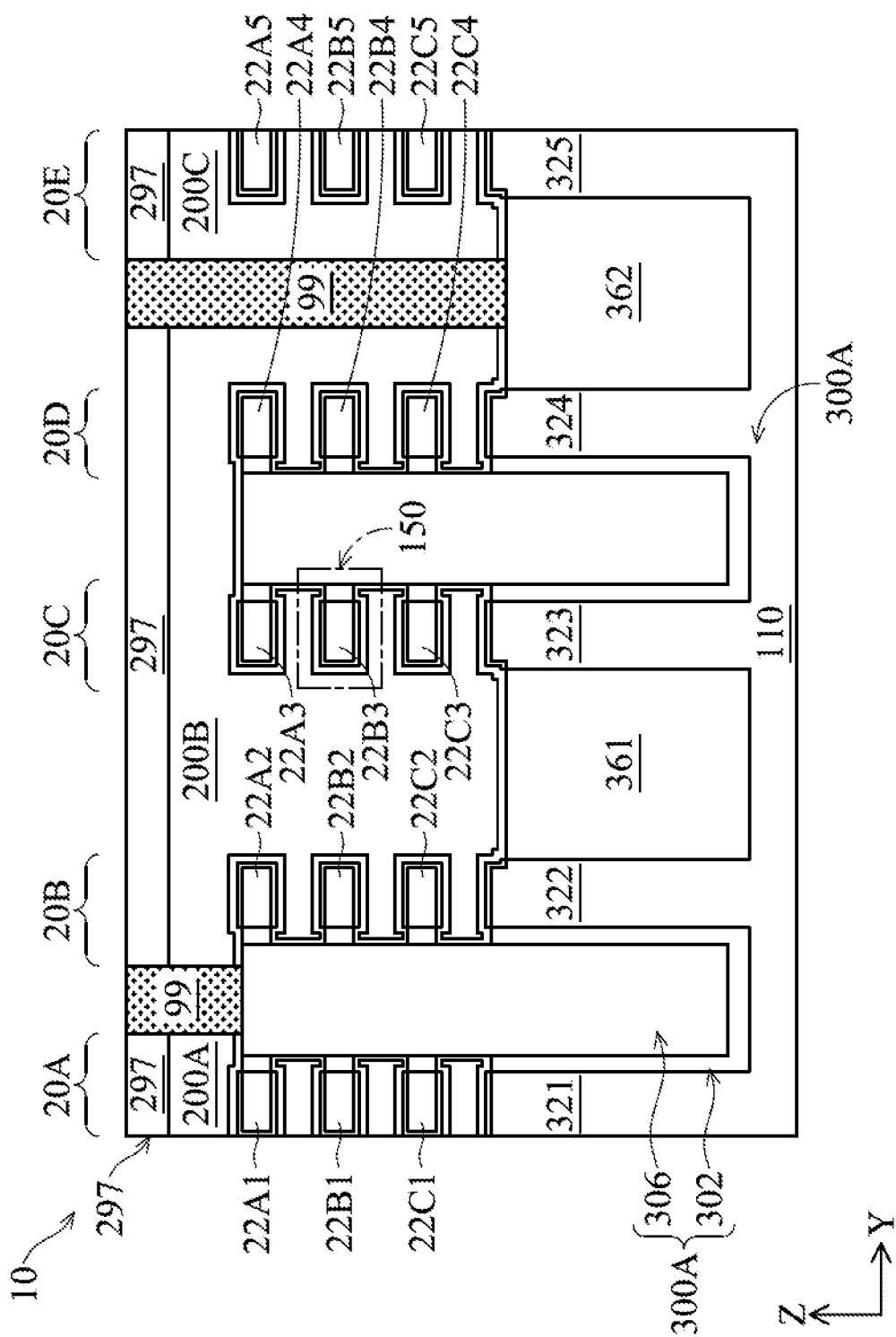
Figure 1K:
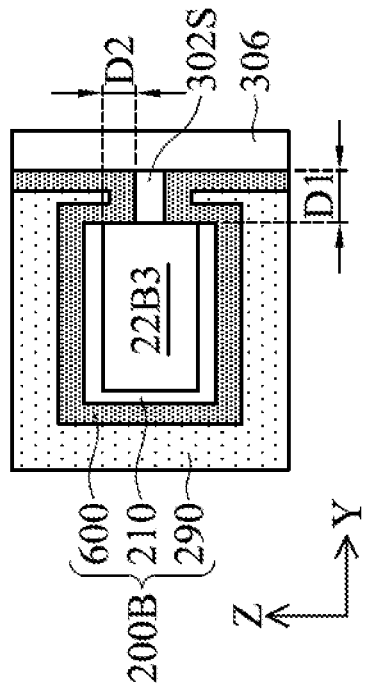
Figure 1L:
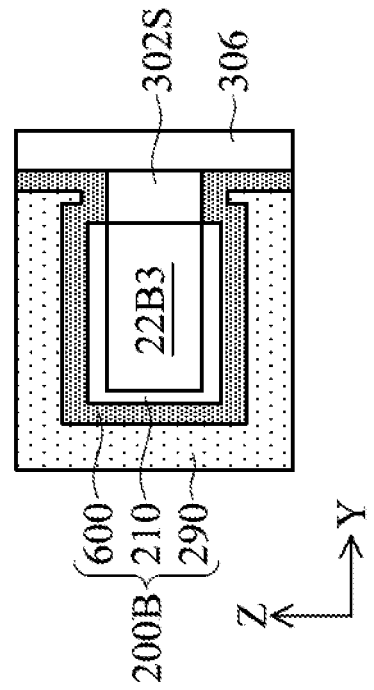
Figure 1J:
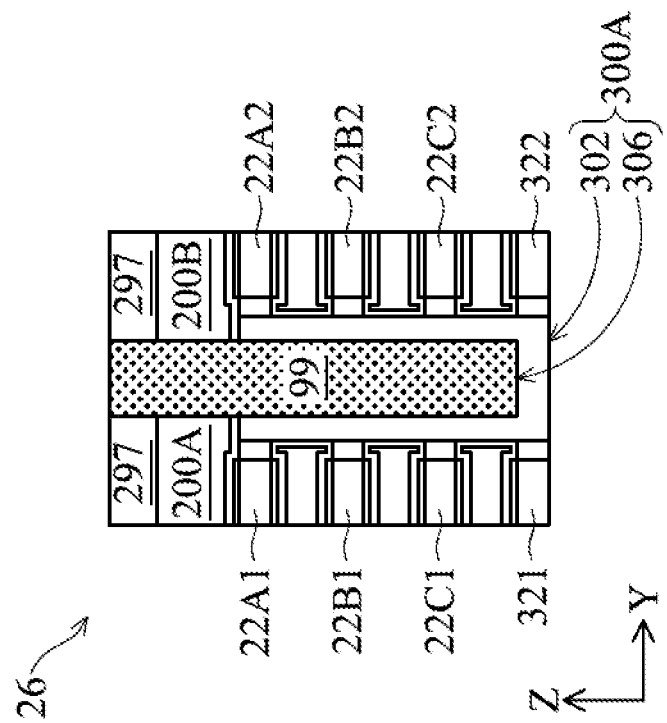
Figure 1M:
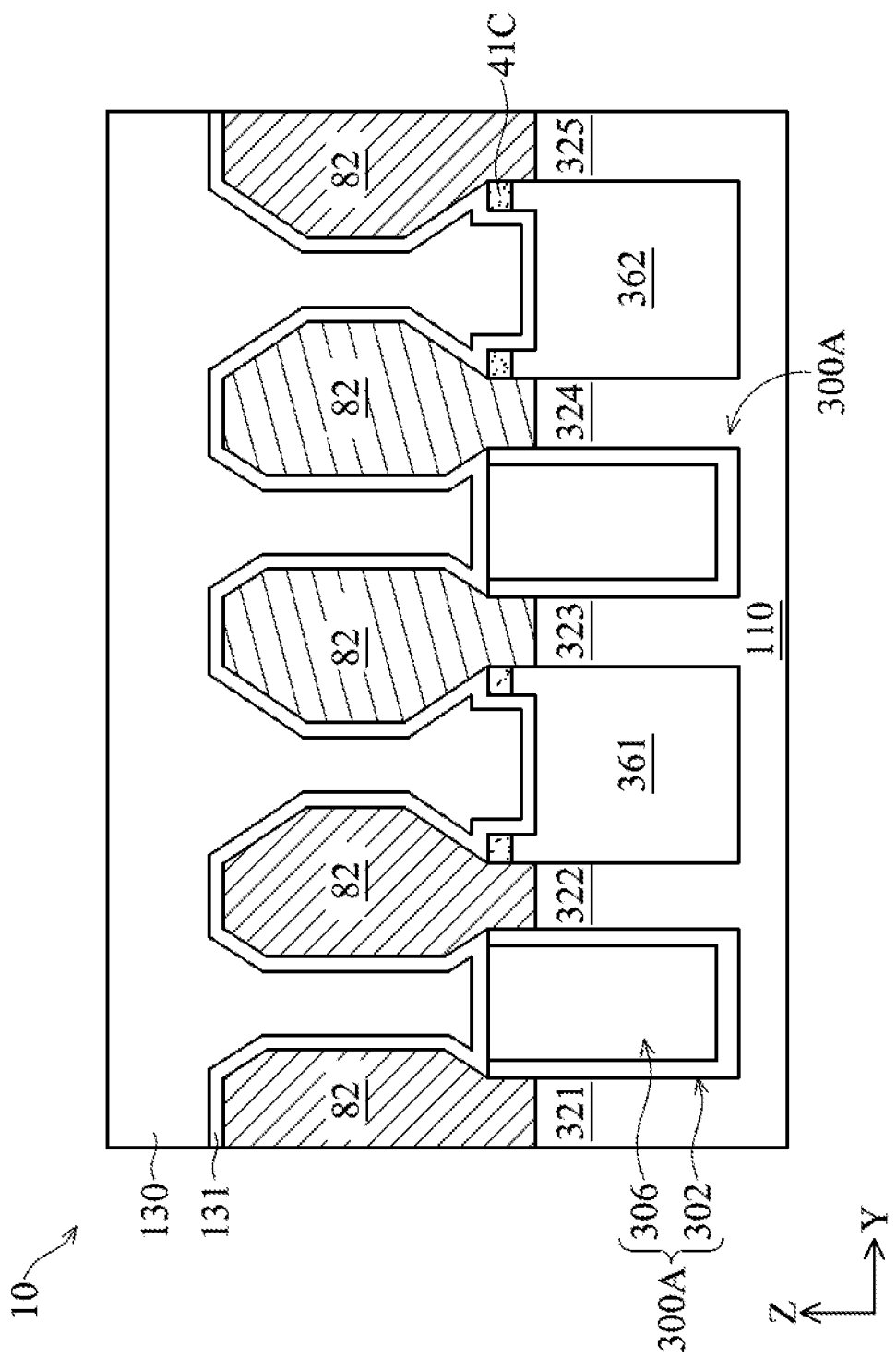
Figure 1N:
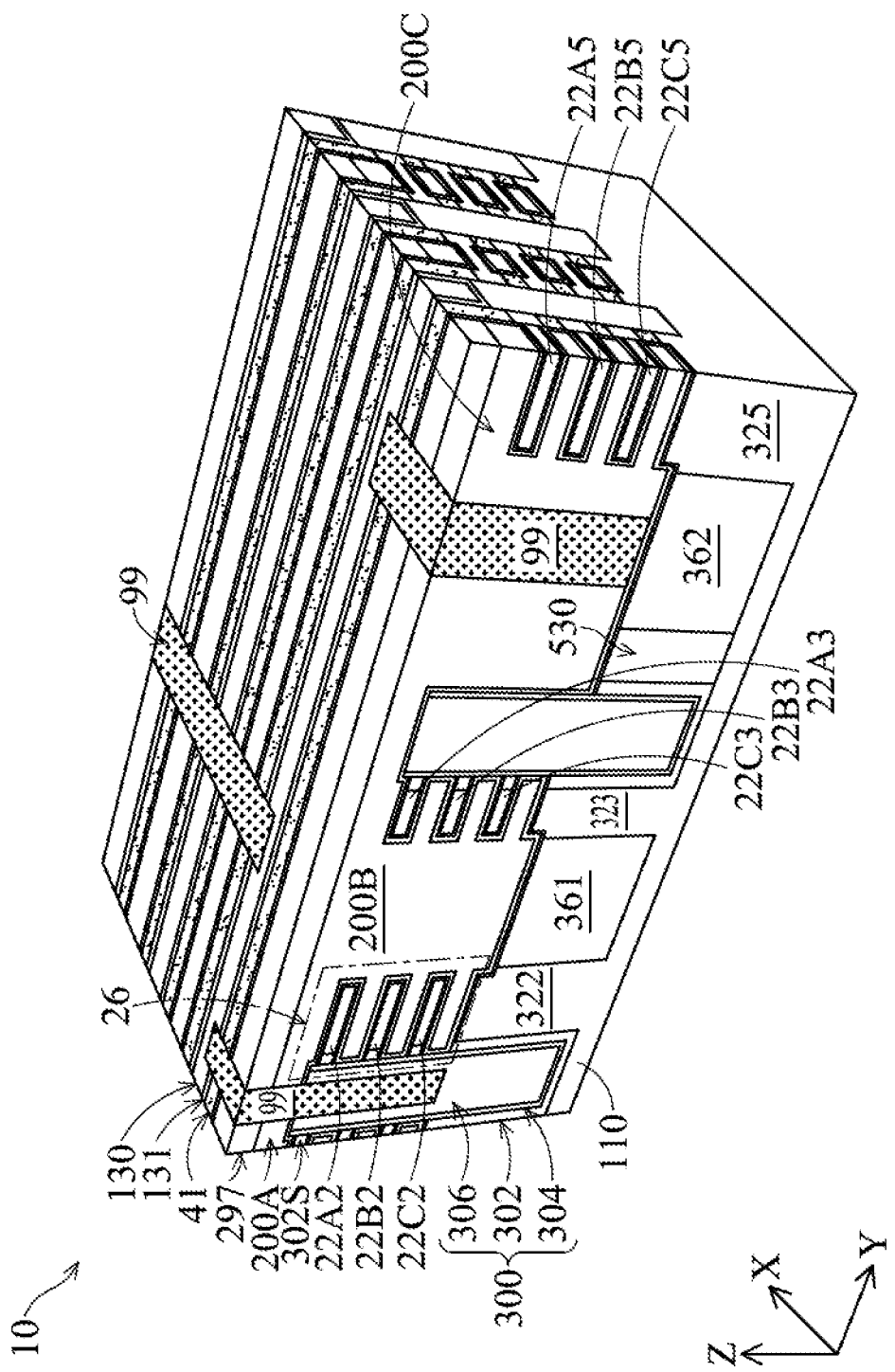
Figure 10:
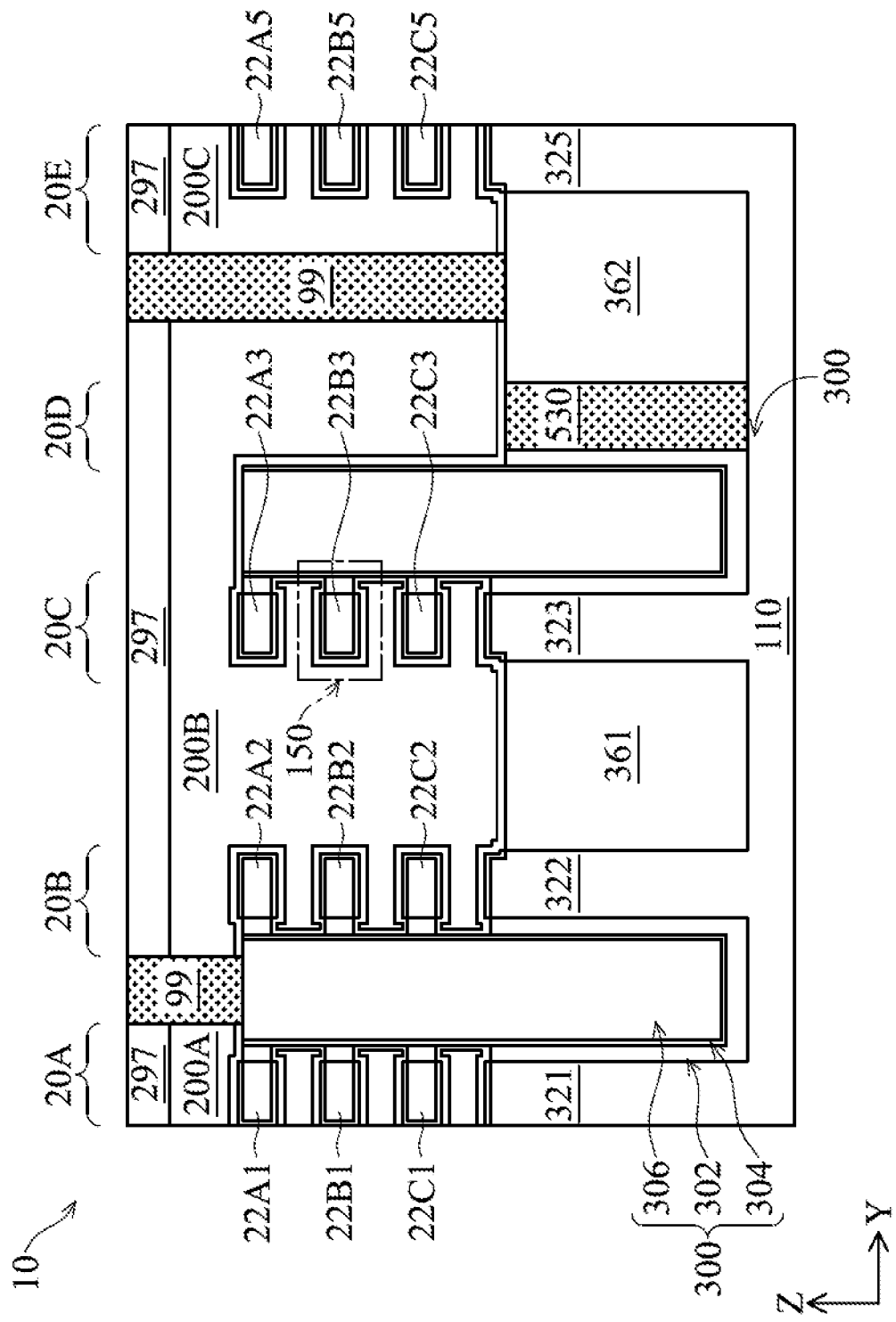
Figure 1Q:
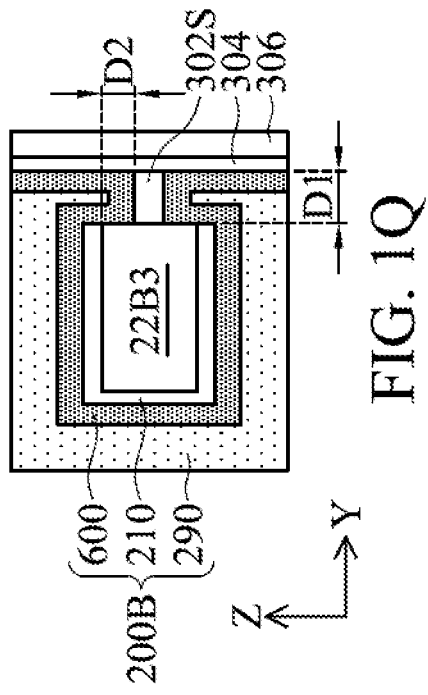
Figure 1R:
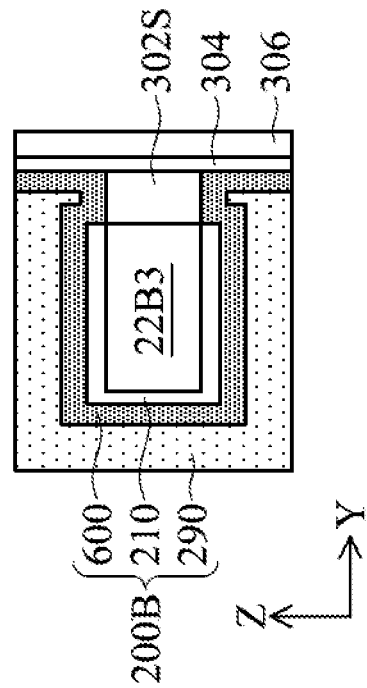
Figure 1P:
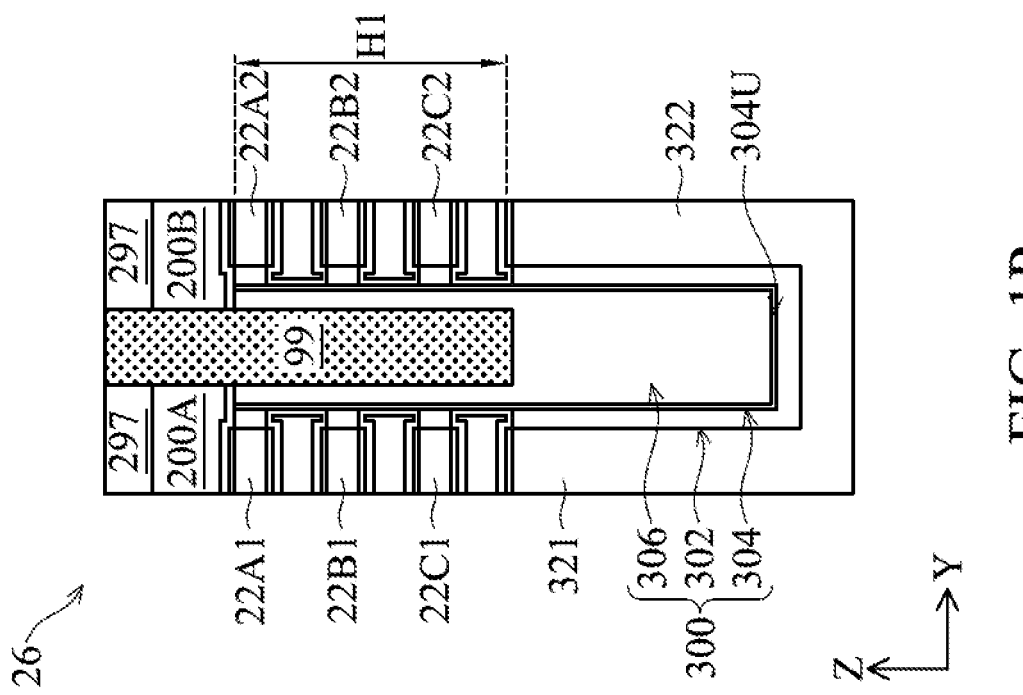
Figure 1S:
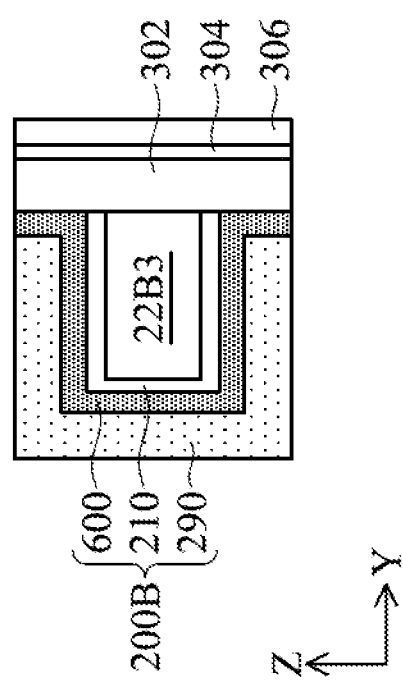

FIGS. 1A-1S illustrate diagrammatic perspective and cross-sectional top and side views of a portion of an IC device 10 fabricated according to embodiments of the present disclosure, where the IC device 10 includes nanostructure devices 20A-20E, which may be gate-all-around FETs (GAAFETs). FIG. 1A is a diagrammatic perspective view of a portion of the IC device 10 in accordance with various embodiments. FIG. 1B is a diagrammatic top view of the portion of the IC device 10 including the nanostructure devices 20A-20E. FIG. 1C is a diagrammatic cross-sectional side view of a portion of the IC device 10 including the nanostructure devices 20A-20E along line C-C shown in FIG. 1B. FIG. 1D is a diagram of region 175 having configuration different from that shown in FIG. 1C. FIGS. 1E and 1F are detailed views of region 150 shown in FIG. 1C in accordance with various embodiments. FIG. 1G is a diagrammatic cross-sectional side view of the portion of the IC device 10 along line G-G shown in FIG. 1B. FIG. 1H is a diagrammatic cross-sectional side view of a portion of the IC device 10 along line H-H shown in FIG. 1B. Certain features may be removed from view intentionally in the views of FIGS. 1A-1H for simplicity of illustration.

The nanostructure devices 20A-20E may include at least an N-type FET (NFET) or a P-type FET (PFET) in some embodiments. Integrated circuit devices such as the IC device 10 frequently include transistors having different threshold voltages based on their function in the IC device. For example, input/output (IO) transistors typically have the highest threshold voltages, core logic transistors typically have the lowest threshold voltages, and a third threshold voltage between that of the IO transistors and that of the core logic transistors may also be employed for certain other functional transistors, such as static random access memory (SRAM) transistors. Some circuit blocks within the IC device 10 may include two or more NFETs and/or PFETs of two or more different threshold voltages.

The nanostructure devices 20A-20E are formed over and/or in a substrate 110, and generally include gate structures 200A-200C straddling and/or wrapping around semiconductor channels, alternately referred to as "nanostructures," located over semiconductor fins 321-325 protruding from, and separated by, isolation structures 361, 362. The channels are labeled "22AX" to "22CX," where "X" is an integer from 1 to 5, corresponding to the five transistors 20A-20E, respectively. Each gate structure 200A-200C controls current flow through the channels 22A1-22C5.

In many IC devices, it is beneficial for the gate structures of two or more neighboring nanostructure devices to be electrically connected. In a typical process, material layers of gate structures are formed over a large number of adjacent semiconductor fins, and isolation structures formed before or after the material layers are used to "cut" the material layers to isolate certain portions of the material layers from other portions. Each portion of the material layers may be one or more gate structures corresponding to one or more nanostructure devices. For illustrative purposes, in the configuration shown in FIGS. 1A-1H, two gate isolation structures 99 isolate three gate structures 200A-200C, such that the gate structure 200B and the gate structures 200A, 200C are electrically isolated from each other (see FIG. 1C, for example). The gate isolation structures 99 are alternatively referred to as "dielectric plugs 99." The gate structure 200B overlies and wraps around the nanostructures 22 of the nanostructure devices 20B-20D. It should be understood that "wrapping around" includes the meaning of surrounding three or more sides of the nanostructures 22. For example, as shown in FIG. 1C, the gate structure 200B extends between nanostructure 22B2 and nanostructures 22A2, 22C2 so as to abut upper, lower and right sides of the nanostructure 22B2 without substantially or fully abutting the left side of the nanostructure 22B2 (e.g., the side of the nanostructure 22B2 facing nanostructure 22B1). As another example, FIGS. 1E and 1F show nanostructure 22B3 in expanded view, in which the gate structure 200B abuts upper, lower and left sides of the nanostructure 22B3, and partially abuts the right side of the nanostructure 22B3 (FIG. 1E) or does not abut the right side of the nanostructure 22B3 (FIG. 1F). As shown in FIG. 1A, two sidewalls of the nanostructures 22 may face in the positive or negative X-axis direction, respectively, and are not abutted by a gate structure 200. As such, as shown in FIG. 1A, the gate structures 200A-200C may each "wrap around" respective nanostructures 22 in cross-section, e.g., in the Y-Z plane illustrated in FIG. 1A.

Referring to FIG. 1H, the channels 22 (e.g., the channels 22A2, 22B2, 22C2) are laterally abutted by source/drain regions 82 along the X-axis direction, and covered and surrounded by the gate structure 200B. The gate structure 200B controls flow of electrical current through the channels 22A2-22C2 to and from the source/drain regions 82 based on voltages applied at the gate structure 200B and at the source/drain regions 82. Source/drain region(s) may refer to a source or a drain, individually or collectively dependent upon the context.

FIG. 1G illustrates the source/drain regions 82 in the Y-Z plane. In FIG. 1G, source/drain regions 82A, 82B, 82C, 82D, 82E, which may be referred to collectively as the source/drain regions 82, overlie fins 321, 322, 323, 324, 325, respectively. The source/drain regions 82 have asymmetrical cross-sectional profile in the Y-Z plane, as shown. For example, the source/drain region 82C has a first lateral extension 82EX1 that extends laterally beyond the fin 323 and the nanostructures 22 thereover in a first direction (e.g., the negative Y-axis direction) by a first width W1, and a second lateral extension 82EX2 that extends laterally beyond the fin 323 and the nanostructures 22 in a second direction (e.g., the positive Y-axis direction) by a second width W2. The first and second widths W1, W2 are different from each other. In some embodiments, the first width W1 is in a range of about 10 nm to about 20 nm, and the second width W2 is smaller than the first width W1, such as in a range of about 0 nm to about 10 nm. The first width W1 may be larger than the second width W2 by about 0 nm to about 15 nm, such as by about 1 nm to about 15 nm. If the first width W1 is larger than the second width W2 by more than about 15 nm, the source/drain regions 82 may be insufficiently large, resulting in resistance that is too high. If the first width W1 is larger than the second width W2 by too little, neighboring source/drain regions 82 (e.g., the source/drain region 82B and the source/drain region 82C) may merge instead of being kept separate, resulting in electrical bridging between device cells. Generally, neighboring source/drain regions 82 may be kept separate by trimming one or more sides of the source/drain regions 82 (or so-called "epitaxial cut"), reducing size of the source/drain regions 82, or employing higher sidewalls during epitaxial growth to grow the source/drain regions 82 to a smaller size.

In some embodiments, the fins 321-325 include silicon. The fins 321-325 may not be present. In some embodiments, the nanostructure device 20B is an NFET, and the source/drain regions 82 thereof include silicon phosphorous (SiP). In some embodiments, the nanostructure device 20B is a PFET, and the source/drain regions 82 thereof include silicon germanium (SiGe).

The channels 22A2-22C2 each include a semiconductive material, for example silicon or a silicon compound, such as silicon germanium, or the like. The channels 22A2-22C2 are nanostructures (e.g., having sizes that are in a range of a few nanometers) and may also each have an elongated shape and extend in the X-direction. In some embodiments, the channels 22A2-22C2 each have a nano-wire (NW) shape, a nano-sheet (NS) shape, a nano-tube (NT) shape, or other suitable nanoscale shape. The cross-sectional profile of the channels 22A2-22C2 in the Y-Z plane may be rectangular, round, square, circular, elliptical, hexagonal, or combinations thereof.

In some embodiments, the lengths (e.g., measured in the X-direction) of the channels 22A2-22C2 may be different from each other, for example due to tapering during a fin etching process. In some embodiments, length of the channel 22A2 may be less than a length of the channel 22B2, which may be less than a length of the channel 22C2. The channels 22A2-22C2 each may not have uniform thickness, for example due to a channel trimming process used to expand spacing (e.g., measured in the Z-direction) between the channels 22A2-22C2 to increase gate structure fabrication process window. For example, a middle portion of each of the channels 22A2-22C2 may be thinner than the two ends of each of the channels 22A2-22C2. Such shape may be collectively referred to as a "dog-bone" shape, and is illustrated in FIG. 1H.

In some embodiments, the spacing between the channels 22A2-22C2 (e.g., between the channel 22B2 and the channel 22A2 or the channel 22C2) is in a range between about 8 nanometers (nm) and about 12 nm. In some embodiments, a thickness (e.g., measured in the Z-axis direction) of each of the channels 22A2-22C2 is in a range between about 5 nm and about 8 nm. In some embodiments, a width (e.g., measured in the Y-axis direction, not shown in FIG. 1H, orthogonal to the X-Z plane) of each of the channels 22A2-22C2 is at least about 8 nm.

The gate structure 200B is disposed over and between the channels 22A2-22C2, respectively. In some embodiments, the gate structure 200B is disposed over and between the channels 22A2-22C2, which are silicon channels for N-type devices or silicon germanium channels for P-type devices. In some embodiments, the gate structure 200B includes an interfacial layer (IL) 210, one or more gate dielectric layers 600, one or more work function tuning layers 900 (shown in FIG. 4), and a conductive fill layer 290.

The interfacial layer 210, which may be an oxide of the material of the channels 22A2-22C2, is formed on exposed areas of the channels 22A2-22C2 and the top surface of the fin 322. The interfacial layer 210 promotes adhesion of the gate dielectric layers 600 to the channels 22A2-22C2. In some embodiments, the interfacial layer 210 has thickness of about 5 Angstroms (A) to about 50 Angstroms (A). In some embodiments, the interfacial layer 210 has thickness of about 10 A. The interfacial layer 210 having thickness that is too thin may exhibit voids or insufficient adhesion properties. The interfacial layer 210 being too thick consumes gate fill window, which is related to threshold voltage tuning and resistance as described above. In some embodiments, the interfacial layer 210 is doped with a dipole, such as lanthanum, for threshold voltage tuning.

In some embodiments, the gate dielectric layer 600 includes at least one high-k gate dielectric material, which may refer to dielectric materials having a high dielectric constant that is greater than a dielectric constant of silicon oxide (k≈3.9). Exemplary high-k dielectric materials include $HfO_2$, HfSiO, HfSiON, HfTaO, HfSiO, HfZrO, $ZrO_2$, $Ta_2O_5$, or combinations thereof. In some embodiments, the gate dielectric layer 600 has thickness of about 5 A to about 100 A.

In some embodiments, the gate dielectric layer 600 may include dopants, such as metal ions driven into the high-k gate dielectric from $La_2O_3$, MgO, $Y_2O_3$, $TiO_2$, $Al_2O_3$, $Nb_2O_5$, or the like, or boron ions driven in from $B_2O_3$, at a concentration to achieve threshold voltage tuning. As one example, for N-type transistor devices, lanthanum ions in higher concentration reduce the threshold voltage relative to layers with lower concentration or devoid of lanthanum ions, while the reverse is true for P-type devices. In some embodiments, the gate dielectric layer 600 of certain transistor devices (e.g., IO transistors) is devoid of the dopant that is present in certain other transistor devices (e.g., N-type core logic transistors or P-type IO transistors). In N-type IO transistors, for example, relatively high threshold voltage is desirable, such that it may be preferable for the IO transistor high-k dielectric layers to be free of lanthanum ions, which would otherwise reduce the threshold voltage.

In some embodiments, the gate structure 200B further includes one or more work function metal layers, represented collectively as work function metal layer 900. When configured as an NFET, the work function metal layer 900 of the nanostructure device 20B may include at least an N-type work function metal layer, an in-situ capping layer, and an oxygen blocking layer. In some embodiments, the N-type work function metal layer is or comprises an N-type metal material, such as TiAlC, TiAl, TaAlC, TaAl, or the like. The in-situ capping layer is formed on the N-type work function metal layer, and may comprise TiN, TiSiN, TaN, or another suitable material. The oxygen blocking layer is formed on the in-situ capping layer to prevent oxygen diffusion into the N-type work function metal layer, which would cause an undesirable shift in the threshold voltage. The oxygen blocking layer may be formed of a dielectric material that can stop oxygen from penetrating to the N-type work function metal layer, and may protect the N-type work function metal layer from further oxidation. The oxygen blocking layer may include an oxide of silicon, germanium, SiGe, or another suitable material. In some embodiments, the work function metal layer 900 includes more or fewer layers than those described.

The work function metal layer 900 may further include one or more barrier layers comprising a metal nitride, such as TiN, WN, MoN, TaN, or the like. Each of the one or more barrier layers may have thickness ranging from about 5 A to about 20 A. Inclusion of the one or more barrier layers provides additional threshold voltage tuning flexibility. In general, each additional barrier layer increases the threshold voltage. As such, for an NFET, a higher threshold voltage device (e.g., an IO transistor device) may have at least one or more than two additional barrier layers, whereas a lower threshold voltage device (e.g., a core logic transistor device) may have few or no additional barrier layers. For a PFET, a higher threshold voltage device (e.g., an IO transistor device) may have few or no additional barrier layers, whereas a lower threshold voltage device (e.g., a core logic transistor device) may have at least one or more than two additional barrier layers. In the immediately preceding discussion, threshold voltage is described in terms of magnitude. As an example, an NFET IO transistor and a PFET IO transistor may have similar threshold voltage in terms of magnitude, but opposite polarity, such as +1 Volt for the NFET IO transistor and −1 Volt for the PFET IO transistor. As such, because each additional barrier layer increases threshold voltage in absolute terms (e.g., +0.1 Volts/layer), such an increase confers an increase to NFET transistor threshold voltage (magnitude) and a decrease to PFET transistor threshold voltage (magnitude).

The gate structure 200B also includes conductive fill layer 290. The conductive fill layer 290 may include a conductive material such as tungsten, cobalt, ruthenium, iridium, molybdenum, copper, aluminum, or combinations thereof. Between the channels 22A2-22C2, the conductive fill layer 290 are circumferentially surrounded (in the cross-sectional view) by the one or more work function metal layers 900, which are then circumferentially surrounded by the gate dielectric layers 600. The gate structure 200B may also include a glue layer that is formed between the one or more work function layers 900 and the conductive fill layer 290 to increase adhesion. The glue layer is not specifically illustrated in FIGS. 1A-1H for simplicity. It should be understood that "fill" includes the meaning of fully filled or partially filled. For example, the conductive fill layer 290 shown in FIG. 1H partially fills space between gate spacers 41 above the uppermost nanostructure 22A2.

The nanostructure devices 20A-20E also include gate spacers 41 and inner spacers 74 that are disposed on sidewalls of the gate dielectric layer 600 and the IL 210. The inner spacers 74 are disposed between the channels 22A2-22C2. The gate spacers 41 and the inner spacers 74 may include a dielectric material, for example a low-k material such as SiOCN, SiON, SiN, or SiOC.

The nanostructure devices 20A-20E may include source/drain contacts 120 (a single source/drain contact 120 is shown in FIG. 1H) that are formed over the source/drain regions 82. The source/drain contacts 120 may include a conductive material such as tungsten, cobalt, ruthenium, iridium, molybdenum, copper, aluminum, or combinations thereof. The source/drain contacts 120 may be surrounded by barrier layers (not shown), such as SiN or TiN, which help prevent or reduce diffusion of materials from and into the source/drain contacts 120. A silicide layer 118 may also be formed between the source/drain regions 82 and the source/drain contacts 120, so as to reduce the source/drain contact resistance. The silicide layer 118 may contain a metal silicide material, such as cobalt silicide in some embodiments, or TiSi in some other embodiments.

The nanostructure devices 20A-20E further include an interlayer dielectric (ILD) 130. The ILD 130 provides electrical isolation between the various components of the nanostructure devices 20A-20E discussed above, for example between the gate structure 200B and the source/drain contacts 120. An etch stop layer 131 may be formed prior to forming the ILD 130, and may be positioned laterally between the ILD 130 and the gate spacers 41 and vertically between the ILD 130 and the source/drain regions 82.

FIGS. 1C and 1G are cross-sectional views along the lines C-C and G-G shown in FIG. 1B, respectively. The cross-sectional views shown in FIGS. 1C and 1G are orthogonal to the semiconductor fins 321-325 and parallel to the gate structures 200A-200E, cutting at the gate structures 200A-200C (FIG. 1C) and the source/drain regions 82 (FIG. 1G), respectively.

Wall structures 300 may be located at cell boundaries so as to prevent in-cell active area jog from degrading wall dielectric deposition, etch back, or both. The wall structures 300 include a liner dielectric layer 302, an etch stop layer 304 and a core dielectric layer 306. The liner dielectric layer 302 may have thickness in a range of about 2 nm to about 5 nm. Thickness of the liner dielectric layer 302 that is greater than about 5 nm may result in insufficiently low gate-drain capacitance Cgd. Thickness of the liner dielectric layer 302 less than about 2 nm may result in reduced gate control due to insufficient lateral extension of the gate structure 200 (see dimension D1 of FIG. 1E, for example). The core dielectric layer 306 may have thickness (e.g., width) greater than about 15 nm. Thickness of the core dielectric layer 306 being less than about 15 nm may result in insufficient active area spacing, such that source/drain regions 82 are too short, causing difficulty driving the channels 22 by the gate structures 200. As shown in FIG. 1C, the liner dielectric layer 302 and the core dielectric layer 306 may be the same or substantially the same material, such as SiN, SiCN, SiOC, SiOCN or the like. The liner and core dielectric layers 302, 306 being the same or substantially the same material may simplify etching operations due to similar etch selectivity for the liner and core dielectric layers 302, 306.

The etch stop layer 304 is beneficial to formation of the gate structure 200, which has pi shape that may be trimmed up to the etch stop layer 304 without overetching into the core dielectric layer 306. The etch stop layer 304 is between the liner dielectric layer 302 and the core dielectric layer 306. In some embodiments, the etch stop layer 304 has thickness in a range of about 0.1 nm to about 2 nm, such as about 1 nm. Generally, the etch stop layer 304 should be thinner than the liner and core dielectric layers 302, 306, and should have high etch selectivity against the liner dielectric layer 302, which is beneficial during a gate trimming operation that forms the structure shown in FIGS. 1E, 1F. If the etch stop layer 304 is too thick (e.g., greater than about 2 nm), the etch stop layer 304 may be consumed or partially consumed during recessing of the isolation regions 361, 362, which may result in defects.

Gate isolation structures 99 are between the gate structures 200A, 200B, 200C, such that the gate structures 200A, 200B, 200C are electrically isolated from each other. As shown in FIG. 1C, a gate isolation structure 99 is between the gate structures 200A, 200B, and a gate isolation structure 99 is between the gate structures 200B, 200C. The gate isolation structures 99 may land on isolation regions 361, 362 or on wall structures 300. For example, the gate isolation structure 99 between the gate structures 200A, 200B lands on wall structure 300, and the gate isolation structure 99 between the gate structures 200B, 200C lands on the isolation region 362. In some embodiments, the gate isolation structures 99 include SiN or other suitable dielectric material.

In FIG. 1D, the gate isolation structure 99 extends into the wall structure 300, such as to a level about coplanar with upper surfaces of fins 321, 322. The gate isolation structure 99 may extend into the wall structure 300 by a distance H1 shown in FIG. 1D. The distance H1 is in a range from substantially the upper surface of the uppermost channels 22A1, 22A2 to substantially the upper surface 304U of the etch stop layer 304. In some embodiments, the distance H1 is equal to or substantially equal to distance between the upper surface of the uppermost channels 22A1-22A5 and the upper surface of the isolation regions 361, 362, such that the gate isolation structures 99 that land on the wall structure 300 and the isolation region 362 have substantially the same height in the Z-axis direction. Generally, a single device, such as the device 10, will include gate isolation structures 99 either landing on the upper surface of the wall structure 300 as shown in FIG. 1C or extending into the wall structure 300 as shown in FIG. 1D, and will not include a combination thereof. In some embodiments, masking techniques may be employed to form the gate isolation structures 99 of FIG. 1C and the gate isolation structures of FIG. 1D in different regions of the same device, such that gate isolation structures 99 landing on the upper surface of wall structures 300 and gate isolation structures 99 extending into wall structures 300 are formed (e.g., deposited) in different operations.

FIGS. 1E and 1F illustrate spacer portions 302S of the liner dielectric layer 302. FIG. 1E also illustrates sides of the channel 22B3, including an upper side 22U, a lower side 22L, a first lateral side 22LA1 and a second lateral side 22LA2. The lower side 22L is opposite the upper side 22U. The first lateral side 22LA1 is in contact with the gate structure 200B and faces away from the wall structure 300, for example, in a first lateral direction, such as the negative Y-direction. The second lateral side 22LA2 is opposite the first lateral side 22LA2, is in contact with the wall structure 300, and faces toward the wall structure 300, for example, in direction opposite the first lateral direction, such as the positive Y-direction. Third and fourth lateral sides of the channel 22B3 are not illustrated in FIG. 1E, as FIG. 1E is a cross-sectional diagram in the Y-Z plane. Each of the channels 22 includes the upper, lower and first to fourth lateral sides. In FIG. 1H, a third lateral side 22LA3 and a fourth lateral side 22LA4 of the channel 22A2 are labeled. The third lateral side 22LA3 faces in a second lateral direction (e.g., the negative X-direction) transverse the first lateral direction. The fourth lateral side 22LA4 faces in a direction opposite the second lateral direction, such as the positive X-direction.

The spacer portions 302S are positioned between the nanostructures 22 (e.g., the nanostructure 22B3 shown in FIGS. 1E and 1F) and the etch stop layer 304 and the core dielectric layer 306. As shown in FIGS. 1E and 1F, the spacer portion 302S is in contact with sidewalls of the channel 22B3 and the etch stop layer 304. Upper and lower surfaces of the spacer portion 302S are in contact with the gate structure 200, such as the gate dielectric layer 600. Distance or vertical extension D2 between the upper surface of the channel 22B3 and the upper surface of the spacer portion 302S is in a range of 0 nm to about 2 nm. FIG. 1F illustrates the spacer portion 302S when the distance D2 is zero, such that the upper surface of the spacer portion 302S is level with the upper surface of the nanostructure 22B3. Distance or lateral extension D1 between the etch stop layer 304 and the nanostructure 22B3 is in a range of about 2 nm to about 5 nm, such as about 3 nm to about 5 nm. The distances D1, D2 are beneficial for short channel effect control and alternating current capacitance penalty reduction. For example, when the lateral extension D1 is greater than about 5 nm, the gate-drain capacitance Cgd may be insufficiently small, and distance from the gate structure 200 to the source/drain regions 82 may be too short. When the lateral extension D1 is less than about 2 nm, control of the gate structures 200 may be difficult.

As shown in FIGS. 1E and 1F, due to trimming of the liner dielectric layer 302, the conductive fill layer 290 may include extension portions 290E adjacent the wall structure 300 and the channels 22. For example, in FIG. 1E, the extension portions 290E are laterally between the channel 22B3 and the etch stop layer 304 and the core dielectric layer 306. In FIG. 1F, the extension portions 290E are laterally between the gate dielectric layer 600 and the etch stop layer 304 and the core dielectric layer 306. In some embodiments, when the gate dielectric layer 600 is sufficiently thick, the extension portions 290E are not present, for example, when the gate dielectric layer 600 is thick enough to merge in the space between the channel 22B3 and the etch stop layer 304 during deposition of the gate dielectric layer 600. As shown in FIG. 1E, the gate structure 200 is in contact with the upper, lower and first lateral sides 22U, 22L, 22LA1 of the channel 22B3, and is in partial contact with the second lateral side 22LA2 of the channel 22B3, while being isolated from the third and fourth lateral sides 22LA3, 22LA4 of the channel 22B3. As shown in FIG. 1F, the gate structure 200 is in contact with the upper, lower and first lateral sides 22U, 22L, 22LA1 of the channel 22B3, while being isolated from the second, third and fourth lateral sides 22LA2, 22LA3, 22LA4 of the channel 22B3. The gate structure 200 is described in greater detail with reference to FIG. 4.

A second conductive layer 297 may be on the gate structure 200, as shown in FIG. 1A. The second conductive layer 297 may be or include a metal, such as tungsten. The gate isolation structures 99 may extend through the second conductive layer 297.

In some embodiments, a capping layer is positioned over the gate structures 200A-200C. The capping layer may be a self-aligned capping (SAC) layer. The capping layer provides protection to the underlying gate structures 200A-200C, and may also act as a CMP stop layer when planarizing the source/drain contacts 120 following formation thereof. The capping layer may be a dielectric layer including a dielectric material, such as SiO2, SiN, SiCN, SiC, SiOC, SiOCN, HfO2, ZrO2, ZrAlOx, HfAlOx, HfSiOx, Al2O3, BN, or other suitable dielectric material. Between the capping layer and the conductive layer 204 is the optional hard dielectric layer. The hard dielectric layer may prevent current leakage following one or more etching operations, which may be performed to form gate contacts, source/drain contacts 120, isolation structures (e.g., source/drain contact isolation structures 150), or the like. In some embodiments, the hard dielectric layer is or comprises a dielectric material that is harder than, for example, the capping layer, such as aluminum oxide, or other suitable dielectric material. The hard dielectric layer may also be between the capping layer and the spacer layer 41. The gate isolation structures 99 may extend through the capping layer.

FIG. 1I is a cross-sectional side view of the device 10 in accordance with various embodiments. In some embodiments, a wall structure 300A includes the liner dielectric layer 302 and the core dielectric layer 306 while the etch stop layer 304 is not present, as shown in FIG. 1I. The etch stop layer 304, which may be referred to as the oxide liner 304, oxidizes the liner dielectric layer 302 and the core dielectric layer 306 when present. Different materials may be selected for the liner and core dielectric layers 302, 306 so as to avoid forming the oxide liner 304. The liner dielectric layer 302 in such configurations may be a different material than the core dielectric layer 306. For example, the core dielectric layer 306 has high etch selectivity against the liner dielectric layer 302. In some embodiments, the liner dielectric layer 302 is SiN or SiCN, and the core dielectric layer 306 is SiOC or SiOCN. In some embodiments, the core dielectric layer 306 is SiN or SiCN, and the liner dielectric layer 302 is SiOC or SiOCN. Other details of the device 10 shown in FIG. 1I are similar to those of the device 10 described with reference to FIG. 1C, and are not repeated for brevity.

In FIG. 1I, the gate isolation structure 99 lands on the upper surface of the wall structure 300A, for example, on the upper surface of the core dielectric layer 306. In FIG. 1J, the gate isolations structure 99 extends into the wall structure 300A. As such, sidewalls of the gate isolation structure 99 are in contact with inner sidewalls of the core dielectric layer 306, which has different material than the liner dielectric layer 302.

In FIG. 1K and FIG. 1L, the spacer portions 302S contact the core dielectric layer 306. In some embodiments, the spacer portions 302S extend laterally from the sidewall of the channel 22B3 to the sidewall of the core dielectric layer 306, as shown. Other details of the spacer portions 302S are described with reference to FIGS. 1E and 1F.

FIG. 1M is similar in many respects to FIG. 1G, except that the device 10 shown in FIG. 1M includes the wall structure 300A instead of the wall structure 300 shown in FIG. 1G. Relevant details of the device 10 shown in FIG. 1M are described with reference to FIG. 1G, and not repeated here.

FIG. 1N is a perspective view of a device 10 in accordance with various embodiments. The device 10 of FIG. 1N may have structure beneficial for use in SRAM applications.

The device 10 of FIG. 1N is similar in many respects to the devices 10 of FIGS. 1A-1M, except that the fin 323 and overlying stack of nanostructures 22A3, 22B3, 22C3 are replaced (e.g., partially replaced) by an active area isolation structure 530 and the gate structure 200B, as shown in the perspective view. The active area isolation structure 530 may include a dielectric material, such as a low-k dielectric material, which may be SiN or an oxide, such as silicon oxide. The dielectric material of the isolation structure 530 may be different than the dielectric materials of one or more of the liner dielectric layer 302 and the core dielectric layer 306 of the wall structures 300. The active area isolation structure 530 may be used as an active area cutting structure that isolates transistors (e.g., fins 32 and nanostructures 22) on either side of the active area isolation structure 530.

FIG. 1O is a cross-sectional side view of the device 10 of FIG. 1N. In some embodiments, the active area isolation structure 530 has an upper surface that is coplanar or substantially coplanar with upper surfaces of the isolation region 362 and the liner dielectric layer 302 of the wall structure 300 adjacent the active area isolation structure 530. A lower surface of the active area isolation structure 530 may be coplanar or substantially coplanar with, or may be slightly above or slightly below, lower surfaces of the isolation region 362 and the liner dielectric layer 302 adjacent thereto. In some embodiments, the lower surface of the active area isolation structure 530 may be substantially horizontal as shown, or may have convex shape in the Y-Z plane. Lateral sidewalls of the active area isolation structure 530 may be in contact with the isolation region 362 and the liner dielectric layer 302. The upper surface of the active area isolation structure 530 may be in contact with the gate structure 200B, such as the gate dielectric layer 600 of the gate structure 200B. The lower surface of the active area isolation structure 530 may be in contact with the substrate 110 when the substrate 110 is present.

FIG. 1P shows the gate isolation structure 99, which may extend into the wall structure 300 in the device 10 of FIG. 1N. FIGS. 1Q and 1R illustrate embodiments of the spacer portion 302S in the device 10 of FIG. 1N. FIGS. 1P-1R are similar to FIGS. 1D-1F, and description thereof is provided with reference to FIGS. 1D-1F, and not repeated here for brevity. It should be understood that the device 10 of FIG. 1N including the active area isolation structure 530 may include the wall structure 300 or the wall structure 300A.

FIG. 1S is a detailed cross-sectional side view of the wall structure 300 adjacent the channel 22B3 and the gate structure 200B in accordance with various embodiments. In some embodiments, as shown in FIG. 1S, the liner dielectric layer 302 is not trimmed prior to forming the gate structure 200B, which reduces number of operations used to manufacture the device 10. As such, the conductive fill layer 290 may extend short of the sidewall of the channel 22B3 adjacent the wall structure 300, and the gate dielectric layer 600 may have a sidewall substantially coplanar with sidewalls of the channel 22B3 and the liner dielectric layer 302.

Figure 2A:
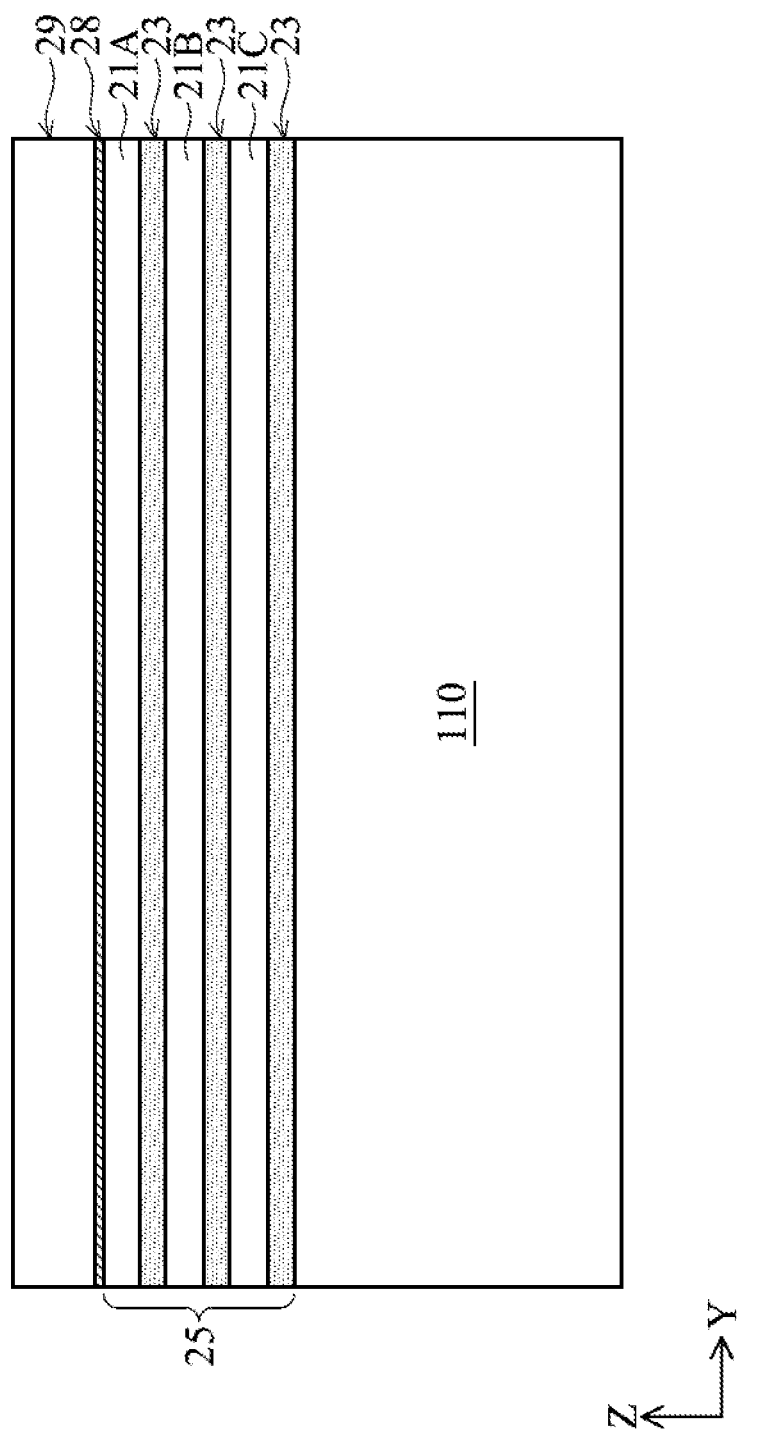
FIGS. 2A-2Q are intermediate perspective views of an IC device at various stages of fabrication according to various aspects of the present disclosure.
Figure 2B:
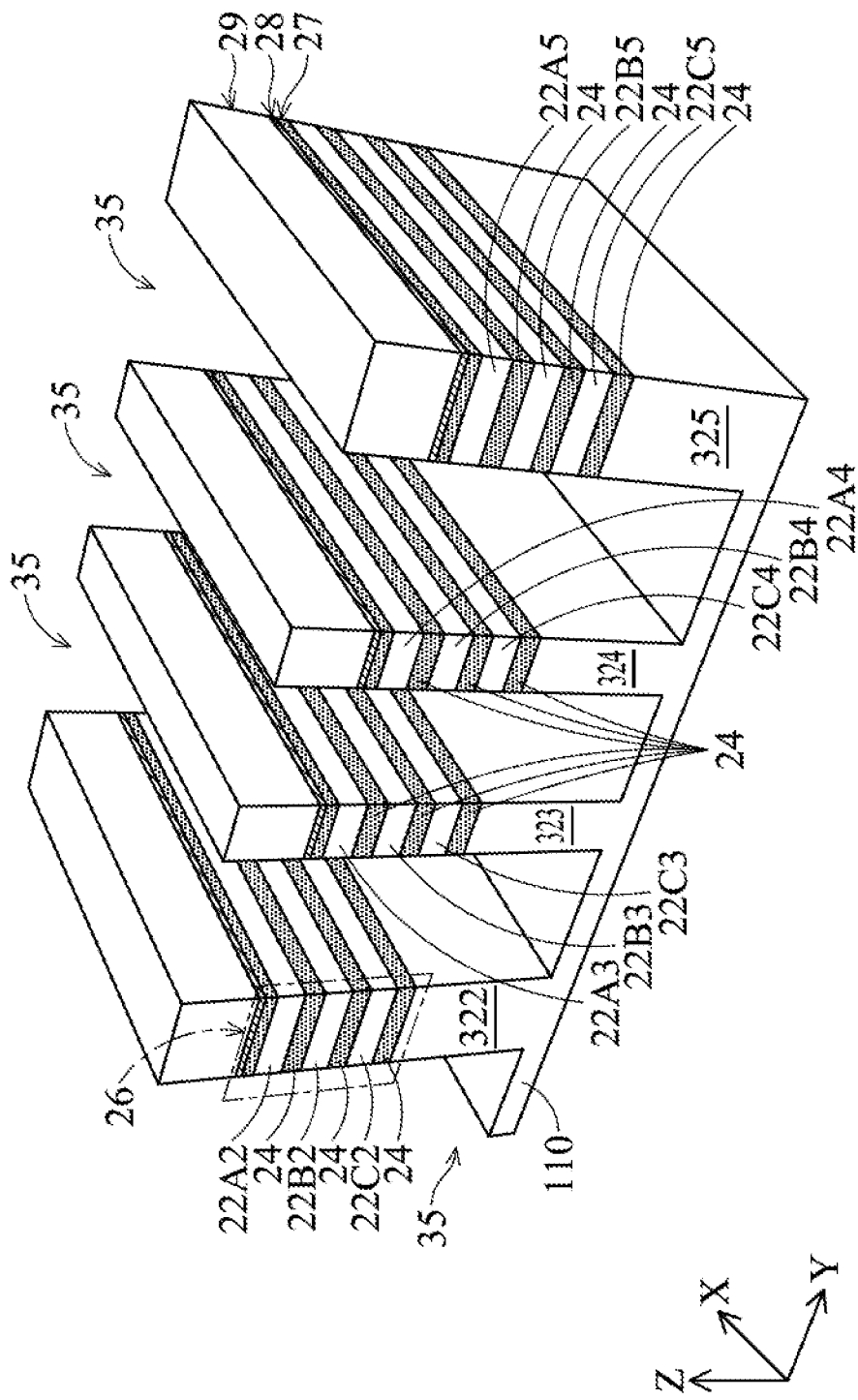
Figure 2C:
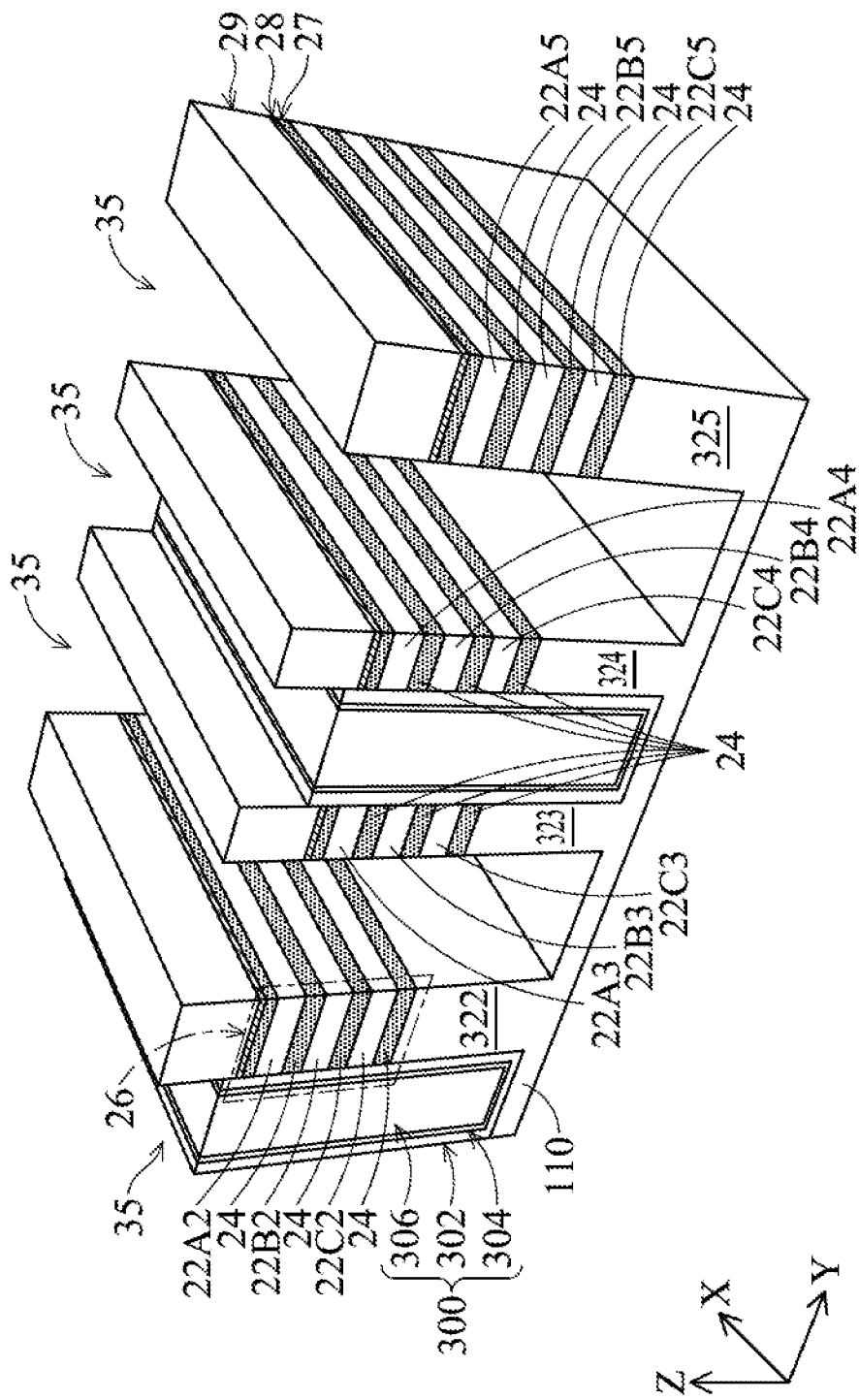
Figure 2D:
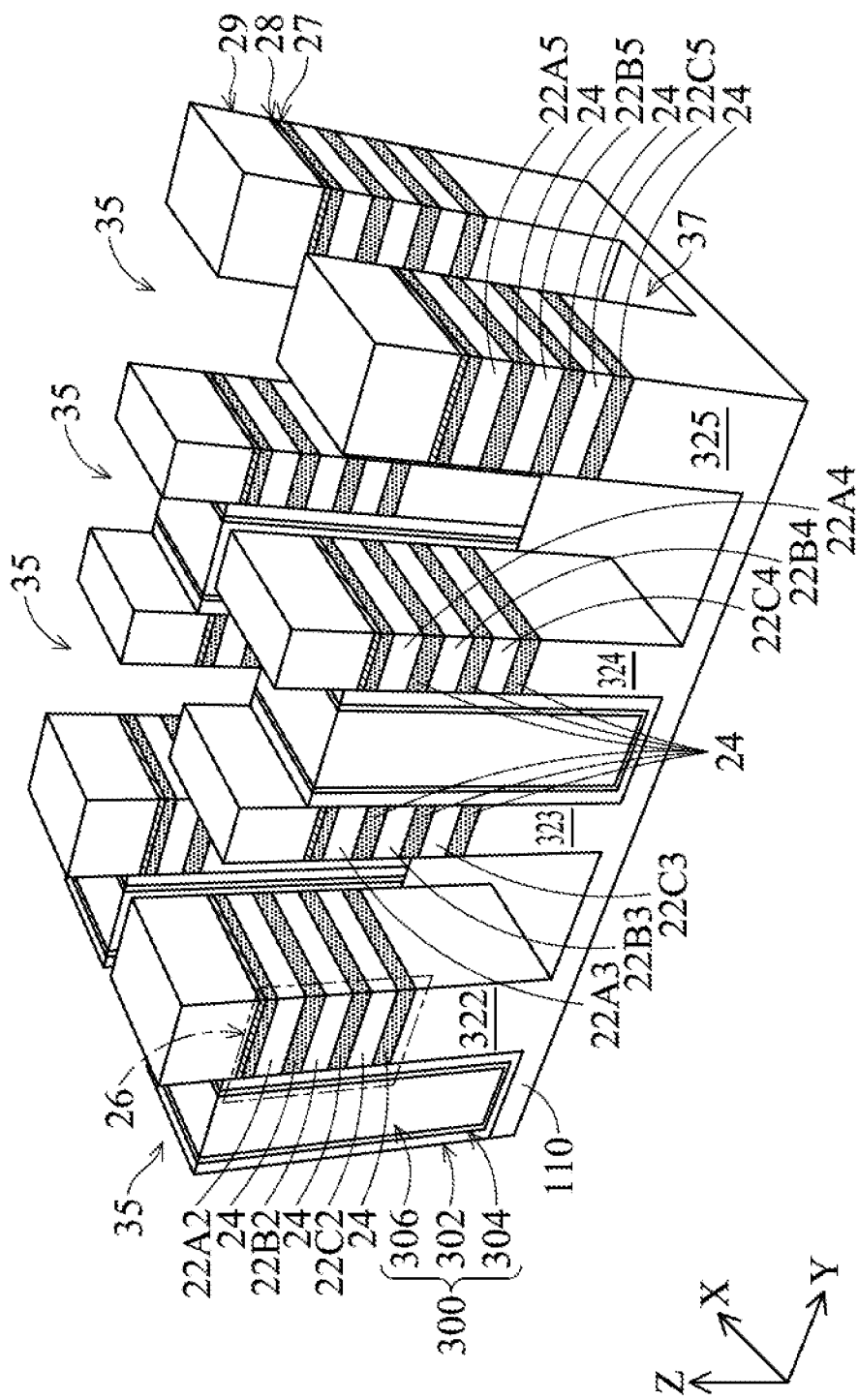
Figure 2E:
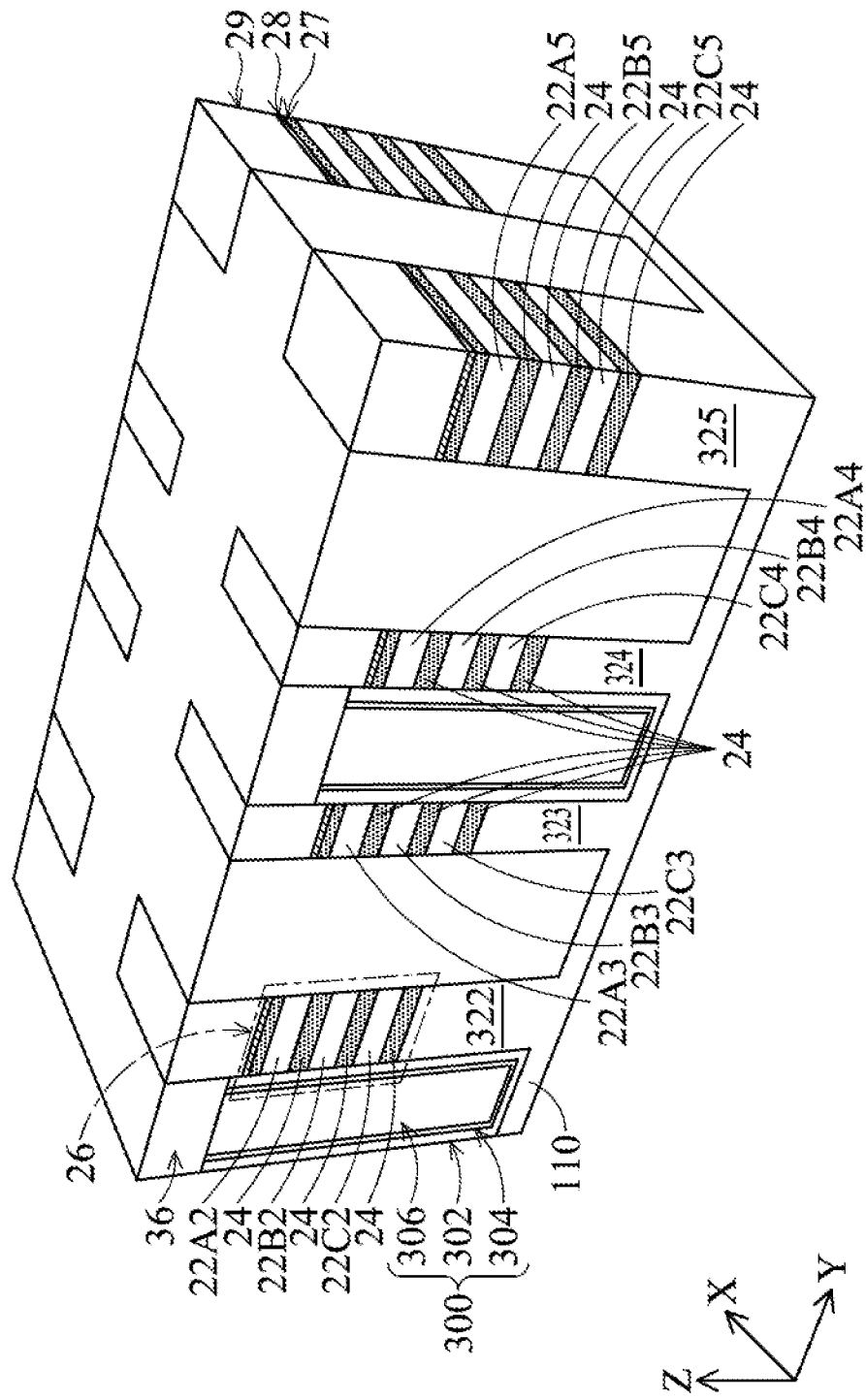
Figure 2F:
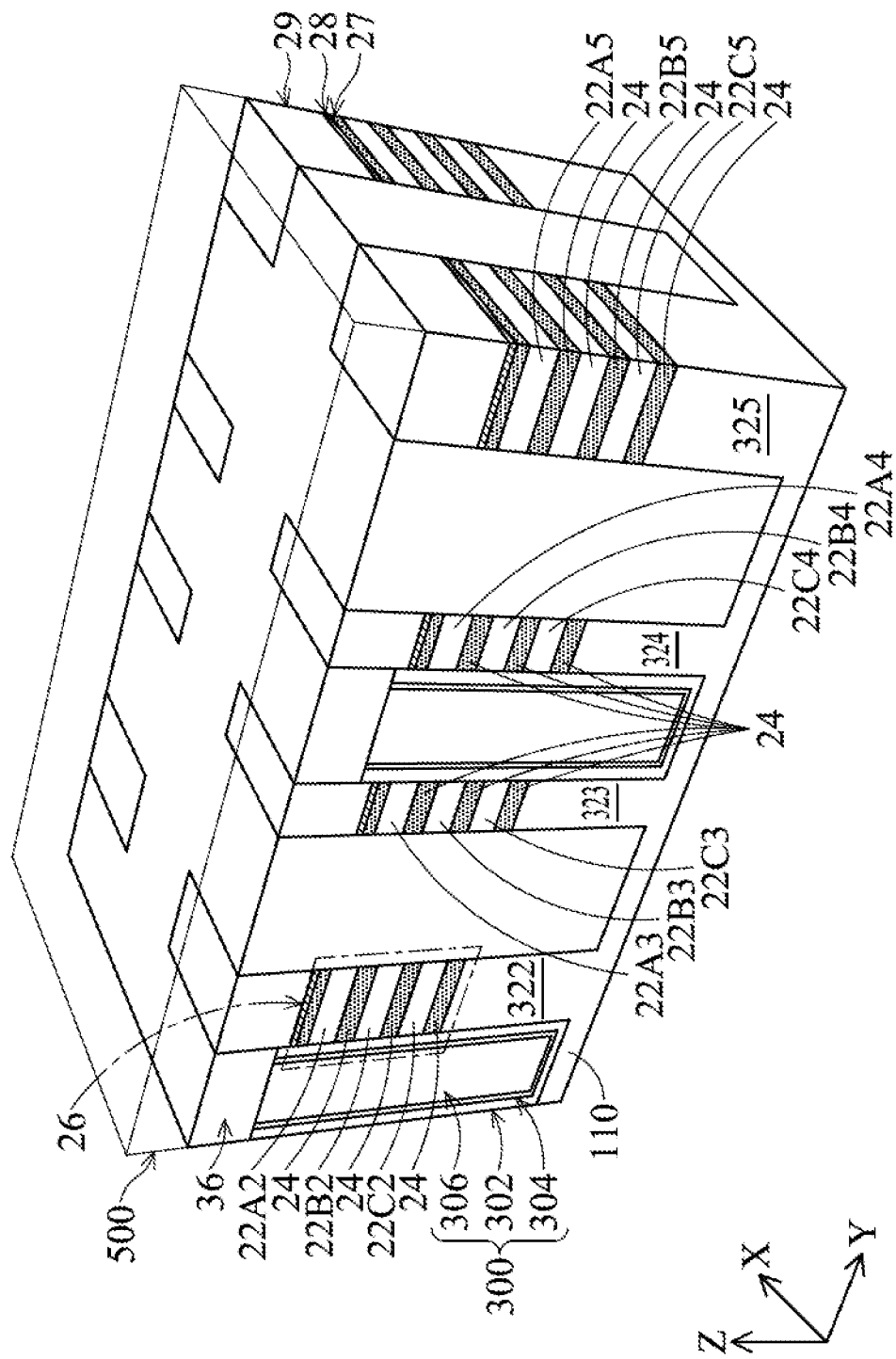
Figure 2G:
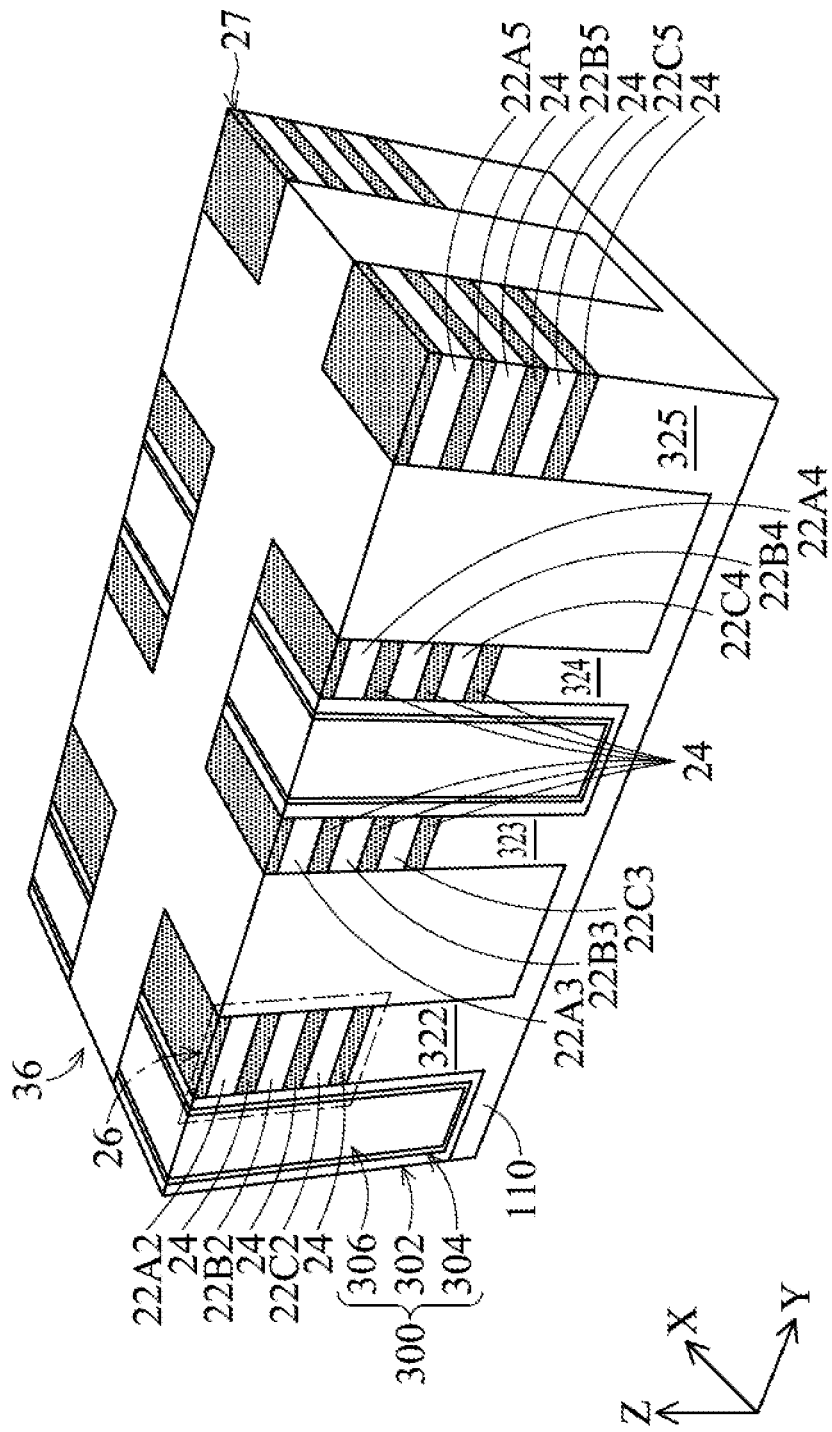
Figure 2H:
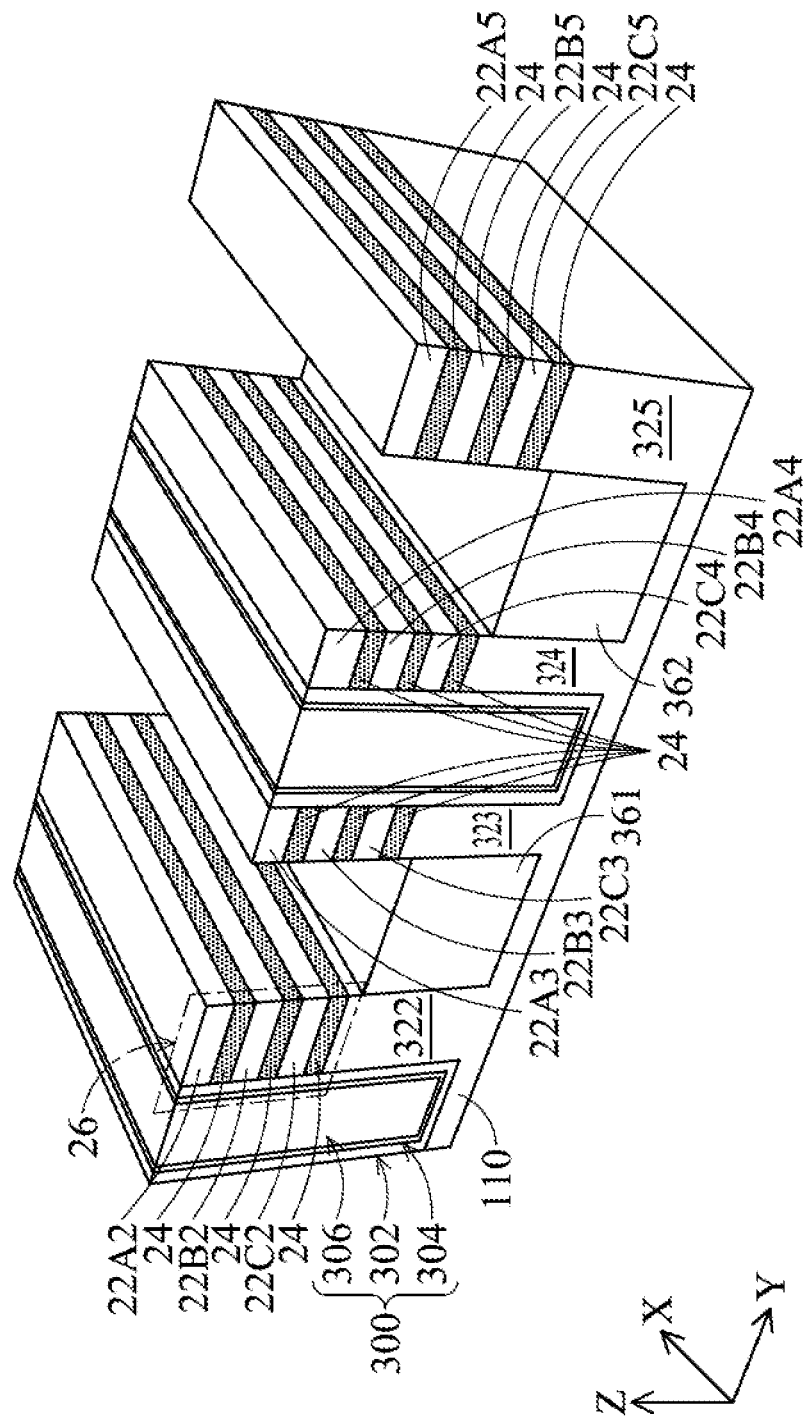
Figure 2I:
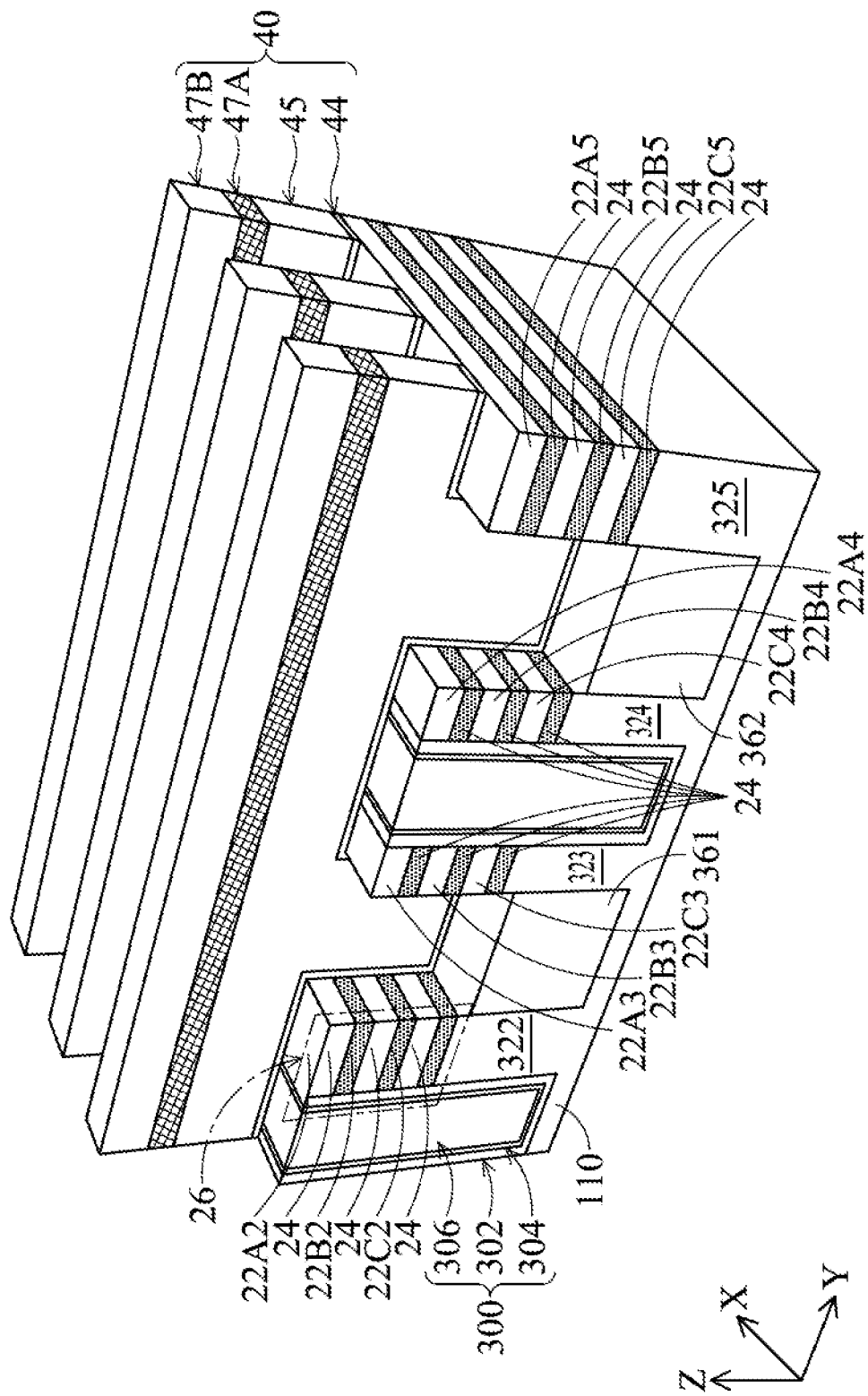
Figure 2J:
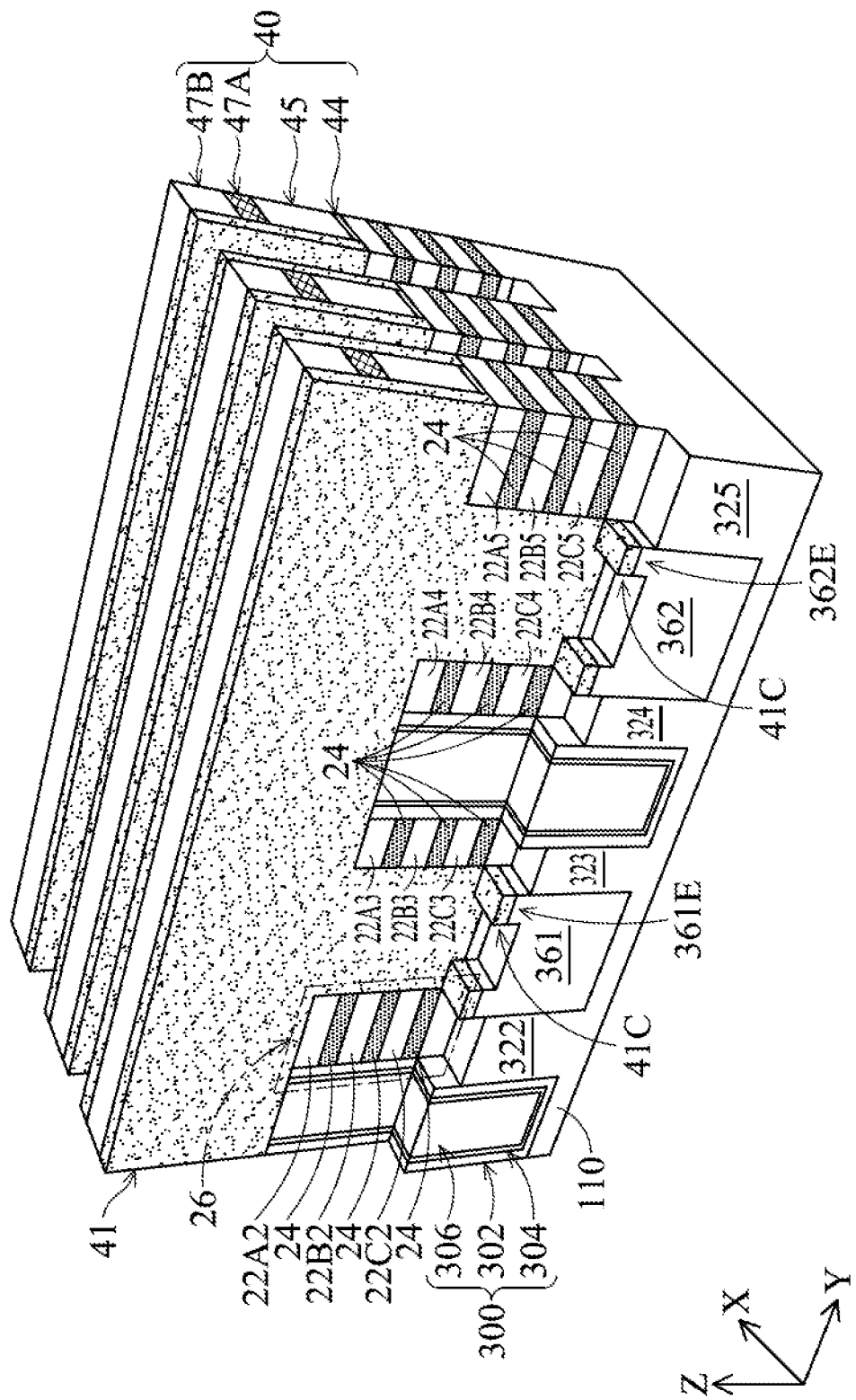
Figure 2K:
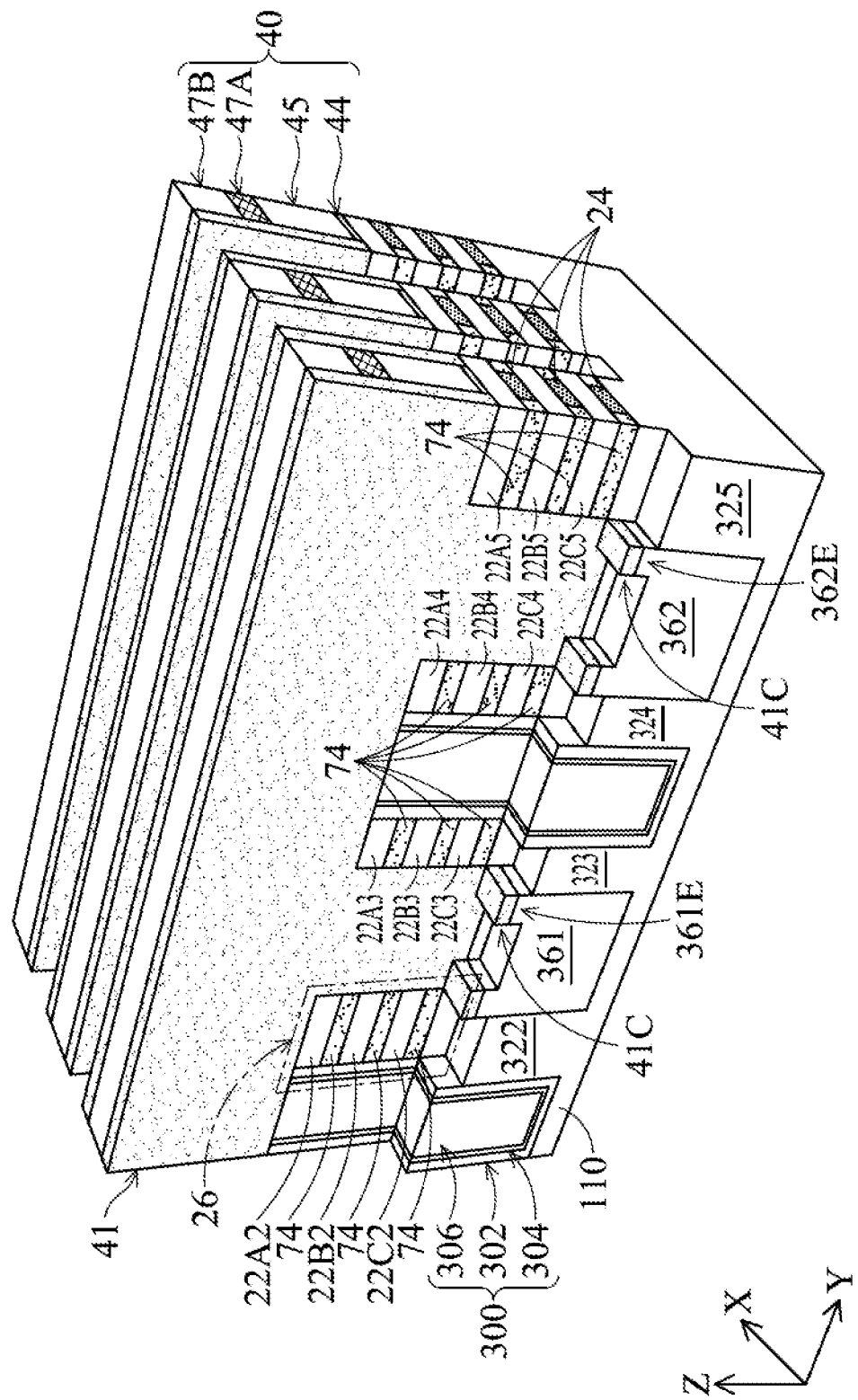
Figure 2L:
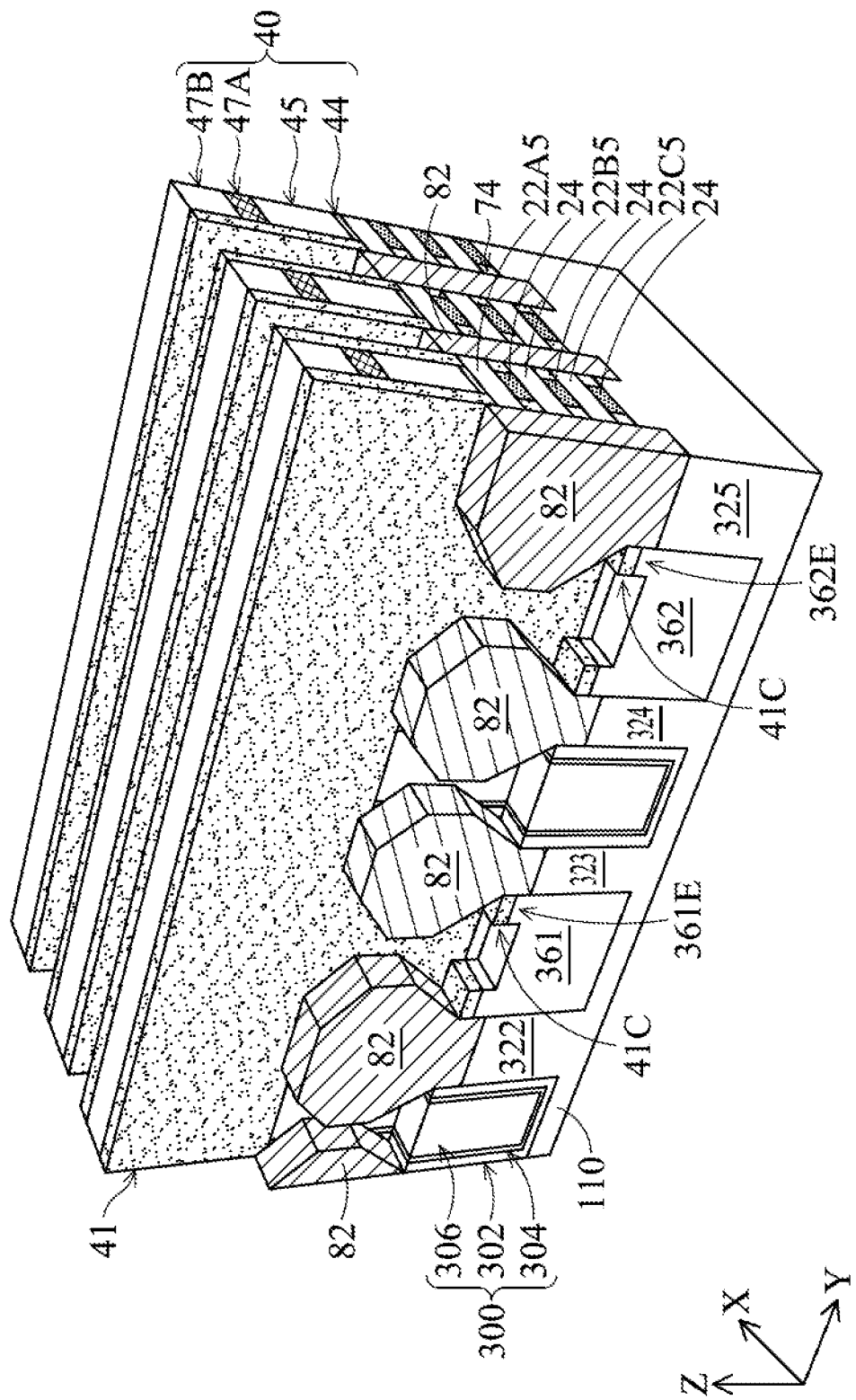
Figure 2M:
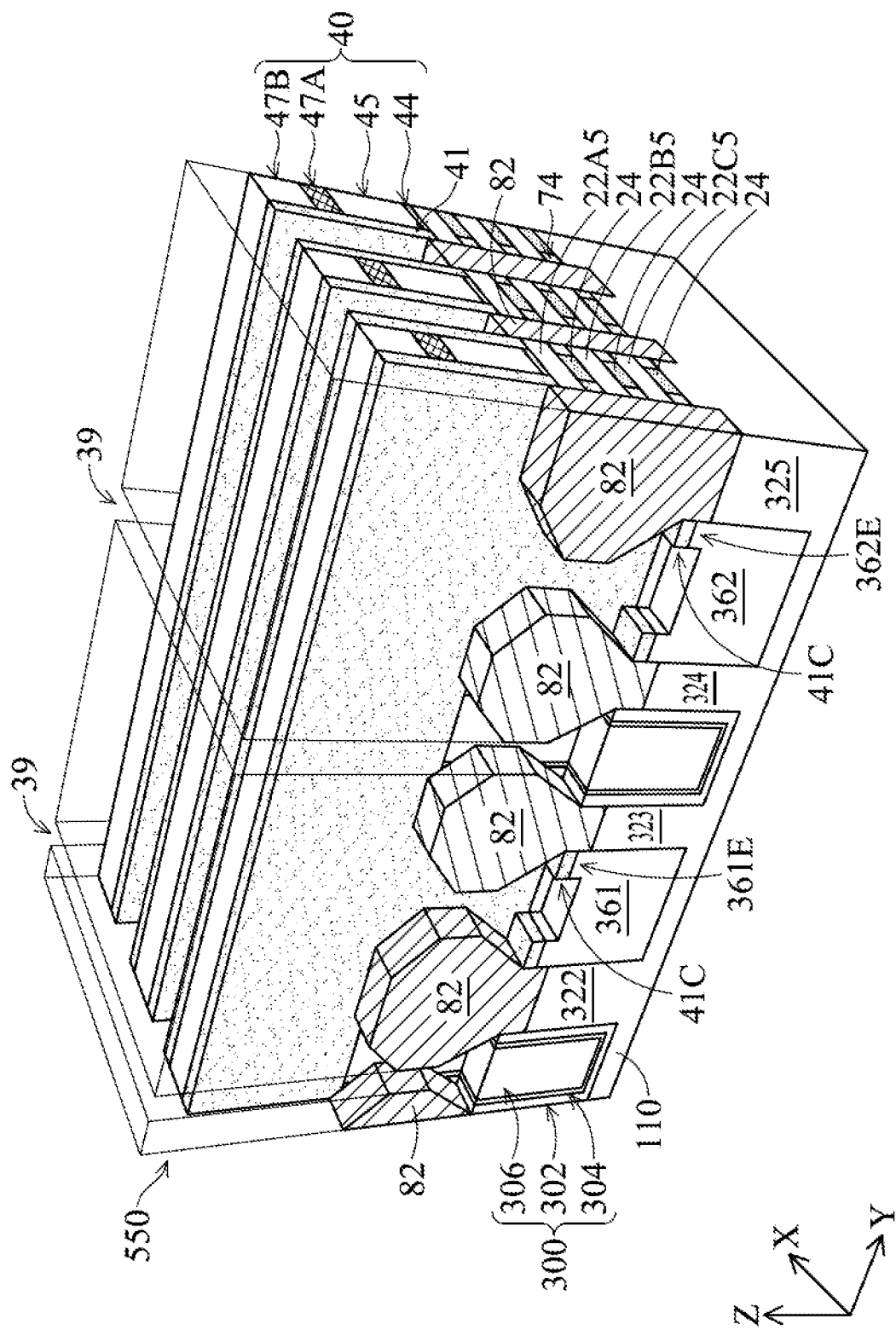
Figure 2N:
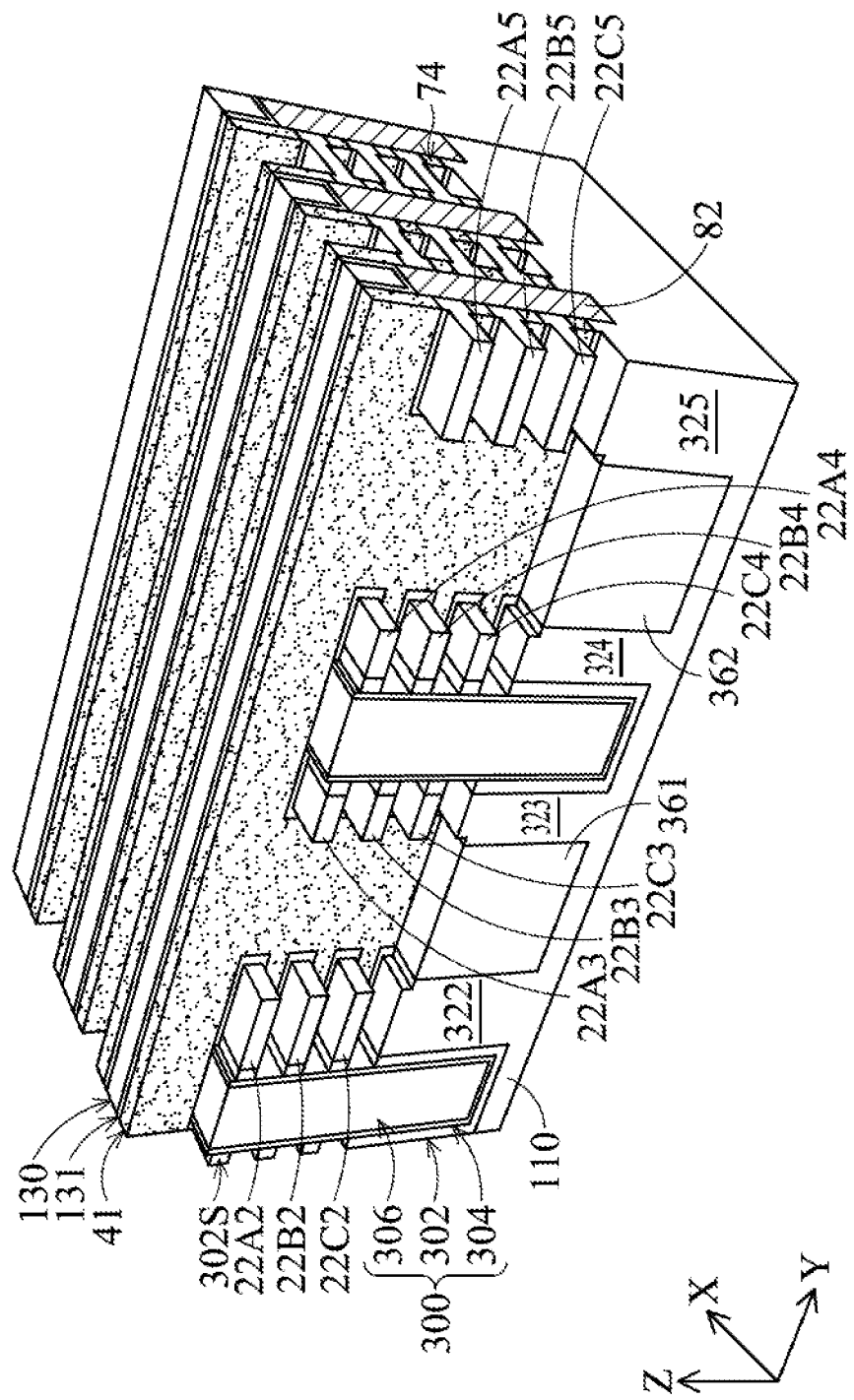
Figure 2O:
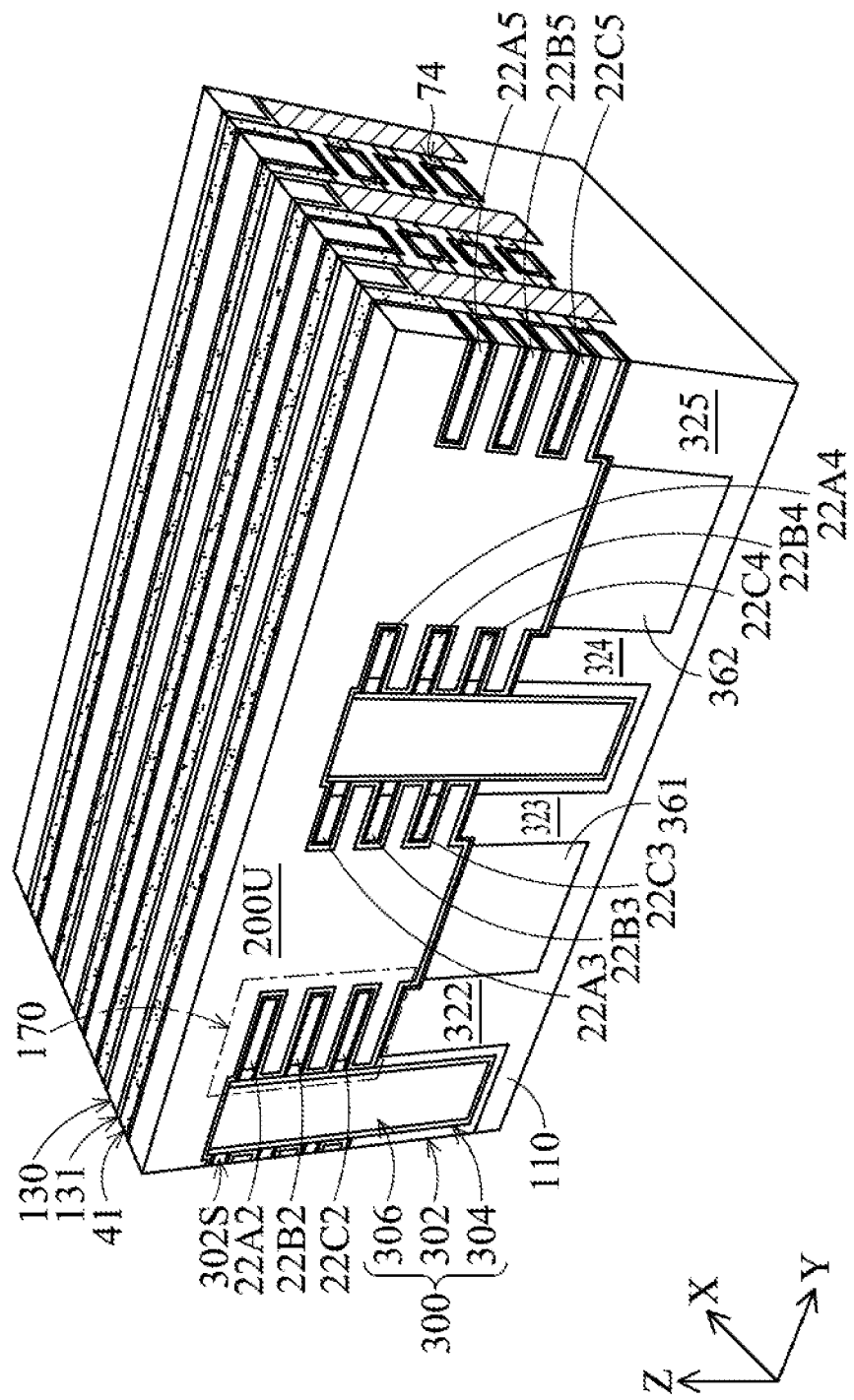
Figure 2P:
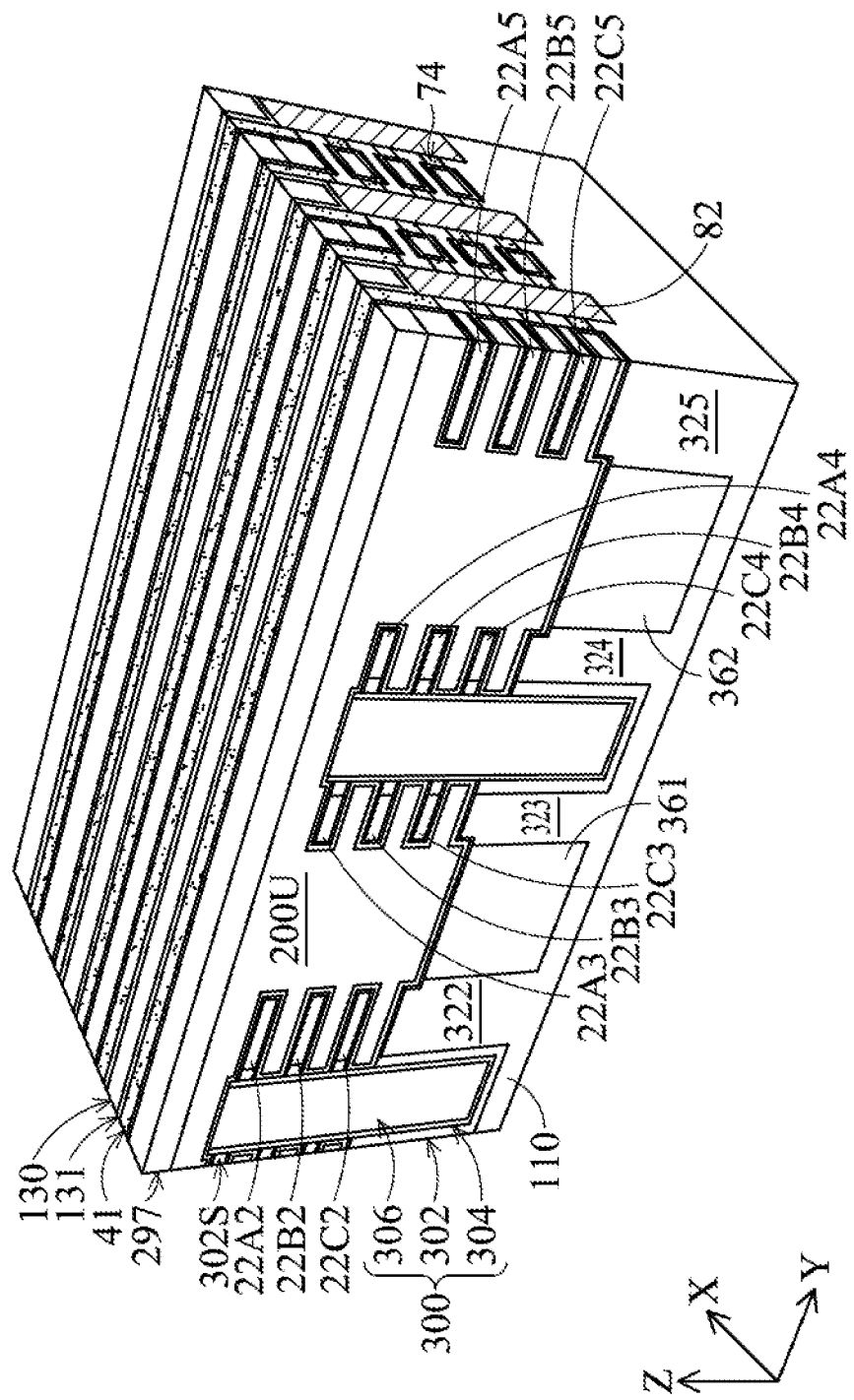
Figure 2Q:
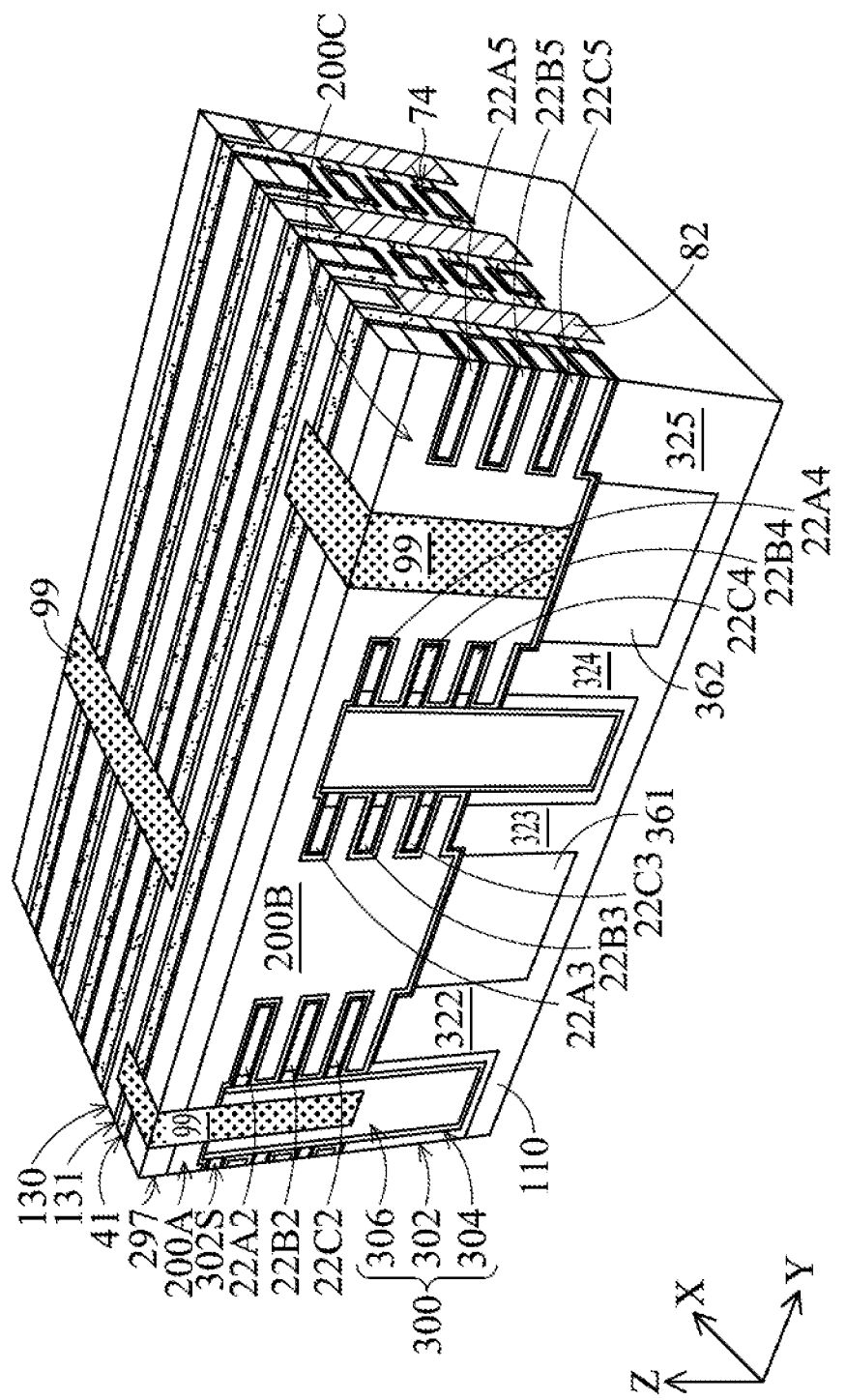

FIGS. 2A-2Q and FIGS. 3A-3I illustrate methods of forming the IC device 10 in accordance with various embodiments. FIGS. 2A-2Q show intermediate views of the IC device 10 illustrated in FIG. 1A at various operations of the method. FIGS. 3A-3I show intermediate views of the IC device 10 illustrated in FIG. 1N at various operations of the method. In some embodiments, the IC device 10 includes logic devices and SRAM devices. FIGS. 2A-2Q illustrate formation of the logic devices in accordance with various embodiments. FIGS. 3A-3I illustrate formation of the SRAM devices in accordance with various embodiments. Many operations illustrated by the views in FIGS. 2A-2Q are performed simultaneously and illustrated by the views in FIGS. 3A-3I. For example, FIGS. 2A-2H may correspond to FIGS. 3A-3H, respectively, with FIGS. 2A-2H illustrating operations performed in regions including the logic devices, and FIGS. 3A-3H illustrating the operations as performed in regions including the SRAM devices.

Figure 5:
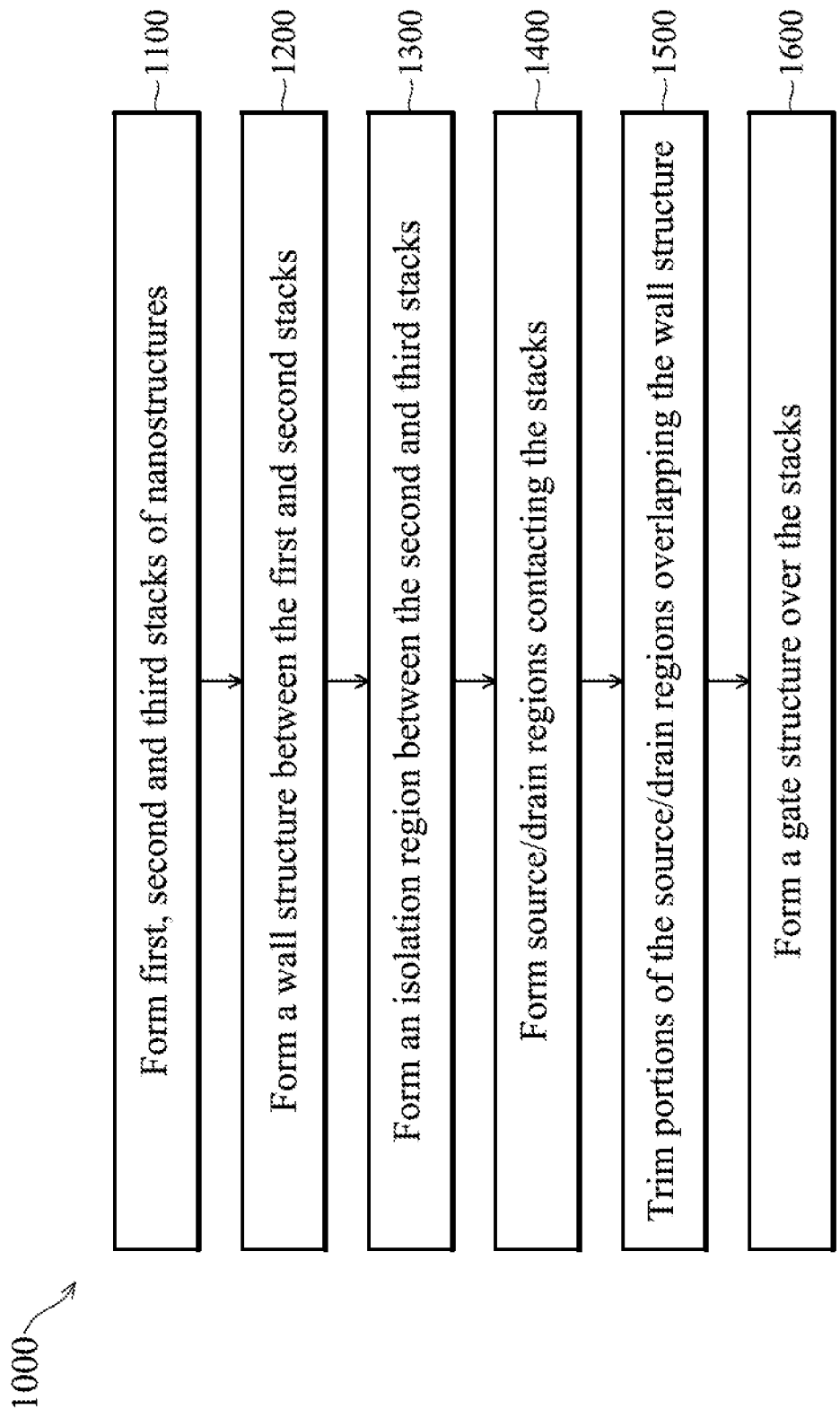
FIG. 5 is a flowchart of a method in accordance with various embodiments.

FIG. 5 illustrates a flowchart of a method 1000 for forming an IC device or a portion thereof from a workpiece, according to one or more aspects of the present disclosure. Method 1000 is merely an example and is not intended to limit the present disclosure to what is explicitly illustrated in method 1000. Additional acts can be provided before, during and after the method 1000, and some acts described can be replaced, eliminated, or moved around for additional embodiments of the methods. Not all acts are described herein in detail for reasons of simplicity. Method 1000 is described below in conjunction with fragmentary perspective and/or cross-sectional views of a workpiece, shown in FIGS. 2A-3I, at different stages of fabrication according to embodiments of method 1000. For avoidance of doubt, throughout the figures, the X direction is perpendicular to the Y direction and the Z direction is perpendicular to both the X direction and the Y direction. It is noted that, because the workpiece may be fabricated into a semiconductor device, the workpiece may be referred to as the semiconductor device as the context requires.

Figure 3A:
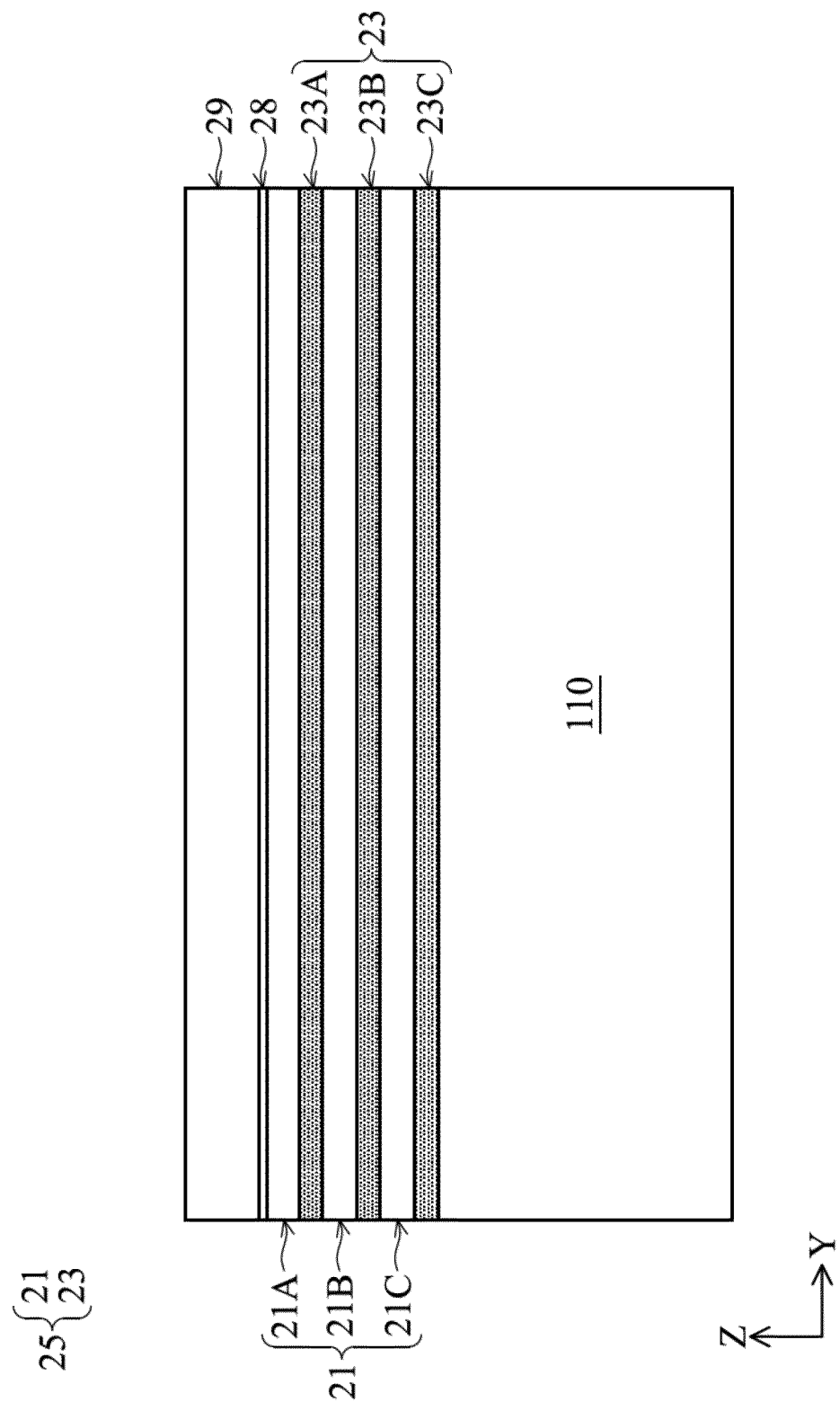
FIGS. 3A-3I are intermediate perspective views of an IC device at various stages of fabrication according to various aspects of the present disclosure.

In FIG. 2A and FIG. 3A, a substrate 110 is provided. The substrate 110 may be a semiconductor substrate, such as a bulk semiconductor, or the like, which may be doped (e.g., with a p-type or an n-type dopant) or undoped. The semiconductor material of the substrate 110 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as single-layer, multi-layered, or gradient substrates may be used.

Figure 3B:
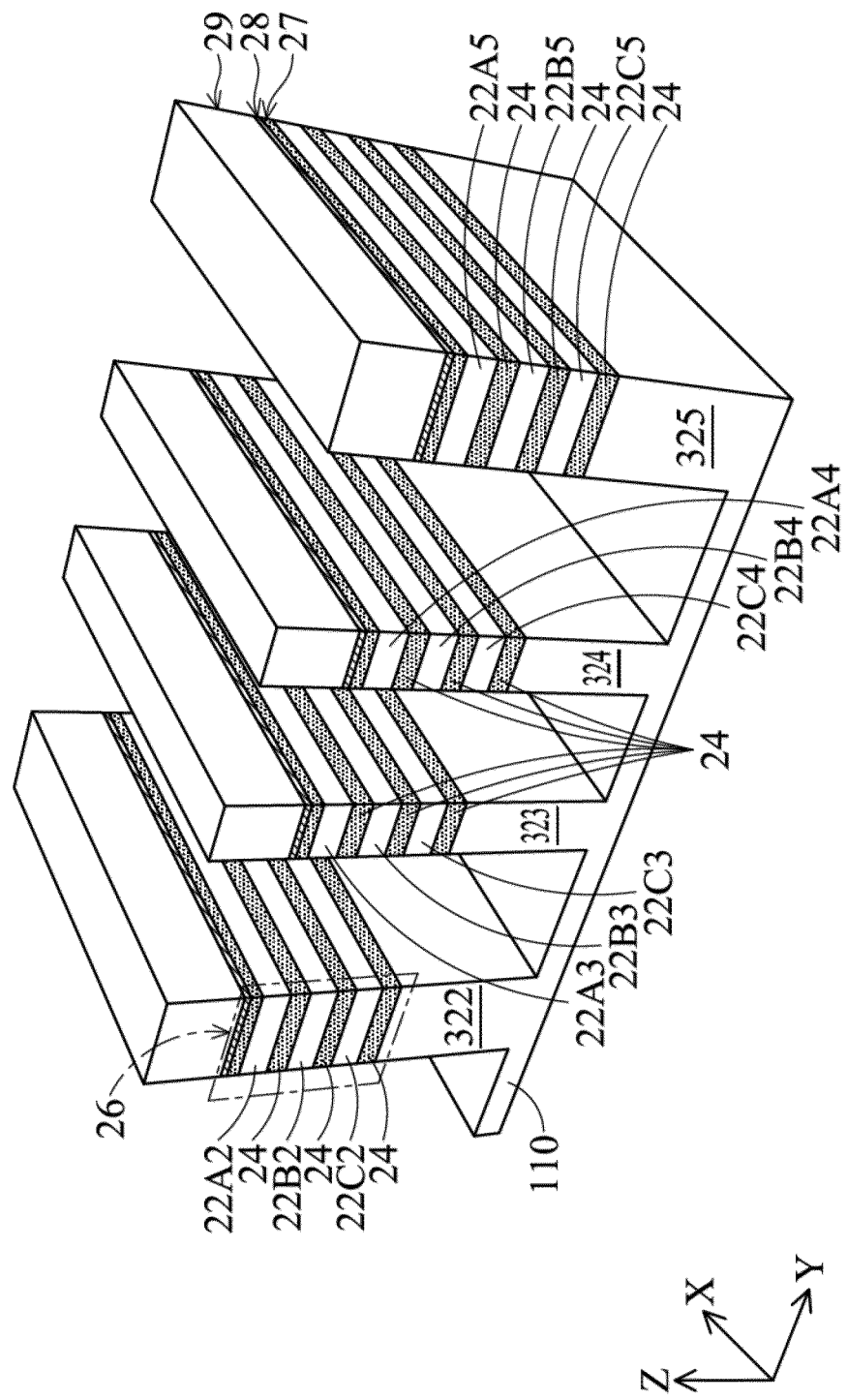

Further in FIG. 2A and FIG. 3A, a multi-layer stack 25 or "lattice" is formed over the substrate 110 of alternating layers of first semiconductor layers 21A-21C (collectively referred to as first semiconductor layers 21) and second semiconductor layers 23. In some embodiments, the first semiconductor layers 21 may be formed of a first semiconductor material suitable for n-type nano-FETs, such as silicon, silicon carbide, or the like, and the second semiconductor layers 23 may be formed of a second semiconductor material suitable for p-type nano-FETs, such as silicon germanium or the like. Each of the layers of the multi-layer stack 25 may be epitaxially grown using a process such as chemical vapor deposition (CVD), atomic layer deposition (ALD), vapor phase epitaxy (VPE), molecular beam epitaxy (MBE), or the like. As shown in FIG. 2A and FIG. 3A, an oxide layer 28 and hard mask layer 29 are formed over the top first semiconductor layer 21A. In some embodiments, the oxide layer 28 is a pad oxide layer, and the hard mask layer 29 may include silicon. In some embodiments, a second semiconductor layer 27 may be present between the top first semiconductor layer 21 and the oxide layer 28, as shown in FIG. 2B and FIG. 3B.

Three layers of each of the first semiconductor layers 21 and the second semiconductor layers 23 are illustrated. In some embodiments, the multi-layer stack 25 may include one or two each or four or more each of the first semiconductor layers 21 and the second semiconductor layers 23. Although the multi-layer stack 25 is illustrated as including a second semiconductor layer 23 as the bottommost layer of the multi-layer stack 25, in some embodiments, the bottommost layer of the multi-layer stack 25 may be a first semiconductor layer 21.

Due to high etch selectivity between the first semiconductor materials and the second semiconductor materials, the second semiconductor layers 23 of the second semiconductor material may be removed without significantly removing the first semiconductor layers 21 of the first semiconductor material, thereby allowing the first semiconductor layers 21 to be released to form channel regions of nano-FETs. In some embodiments, the first semiconductor layers 21 are removed and the second semiconductor layers 23 are patterned to form channel regions. The high etch selectivity allows the first semiconductor layers 21 of the first semiconductor material to be removed without significantly removing the second semiconductor layers 23 of the second semiconductor material, thereby allowing the second semiconductor layers 23 to be patterned to form channel regions of nano-FETs.

In FIG. 2B, fins 321-325 and stacks of nanostructures 22 are formed in the multi-layer stack 25, corresponding to operation 1100 of FIG. 5. First nanostructures 22A1-22C5 (also referred to collectively as "channels 22") are formed from the first semiconductor layers 21, and second nanostructures 24 are formed from the second semiconductor layers 23. The fin 321 is not illustrated in FIG. 2B and FIG. 3B, but can be seen in FIG. 1C and FIG. 1O, for example. In the following, description is given with reference to the fins 322-325, and it should be understood that the description is equally applicable to the fin 321. In some embodiments, the nanostructures 22, 24 and the fins 322-325 may be formed by etching trenches 35 in the multi-layer stack 25 and the substrate 110. The etching may be any acceptable etch process, such as a reactive ion etch (RIE), neutral beam etch (NBE), the like, or a combination thereof. The etching may be anisotropic. Distance between adjacent fins 322-325 and nanostructures 22, 24 in the Y-axis direction may be from about 18 nm to about 100 nm. The nanostructures 22A3, 22B3, 22C3 are a first stack, the nanostructures 22A4, 22B4, 22C4 are a second stack, and the nanostructures 22A5, 22B5, 22C5 are a third stack.

The fins 322-325 and the nanostructures 22, 24 may be patterned by any suitable method. For example, one or more photolithography processes, including double-patterning or multi-patterning processes, may be used to form the fins 322-325 and the nanostructures 22, 24. Generally, double-patterning or multi-patterning processes combine photolithography and self-aligned processes, allowing for pitches smaller than what is otherwise obtainable using a single, direct photolithography process. As an example of one multi-patterning process, a sacrificial layer may be formed over a substrate and patterned using a photolithography process. Spacers are formed alongside the patterned sacrificial layer using a self-aligned process. The sacrificial layer is then removed, and the remaining spacers may then be used to pattern the fins 322-325. In some embodiments, the hard mask layer 29 is patterned, for example by a photolithography process, then the pattern is transferred by an etch process to form the fins 322-325 and the nanostructures 22, 24. Each of the fins 322-325 and its overlying nanostructures 22, 24 may be collectively referred to as a "fin stack." A fin stack 26 including the fin 322 and the nanostructures 22A2, 22B2, 22C2, 24 is outlined by a dashed line in FIG. 2B and FIG. 3B. Four fin stacks 26 are shown in FIG. 2B and FIG. 3B, though few or more than four fin stacks may also be formed by the patterning process. In some embodiments, fin stacks 26 overlying a first neighboring pair of the fins 322-325 (e.g., the fins 322, 323) may be separated by a first distance in the Y-axis direction of about 40 nm to about 60 nm, and fin stacks 26 overlying a second neighboring pair of the fins 322-325 (e.g., the fins 323, 324) may be separated by a second distance in the Y-axis direction of about 20 nm to about 60 nm.

FIG. 2B and FIG. 3B illustrate the fins 322-325 having vertically straight sidewalls. In some embodiments, the sidewalls are substantially vertical (non-tapered), such that width of the fins 322-325 and the nanostructures 22, 24 is substantially similar, and the nanostructures 22, 24 are rectangular in shape (e.g., has rectangular profile in the Y-Z plane). In some embodiments, the fins 322-325 have tapered sidewalls, such that a width of each of the fins 322-325 and/or the nanostructures 22, 24 continuously increases in a direction towards the substrate 110. In such embodiments, the nanostructures 22, 24 may have a different width from each other and be trapezoidal in shape (e.g., have trapezoidal profile in the Y-Z plane).

Figure 3C:
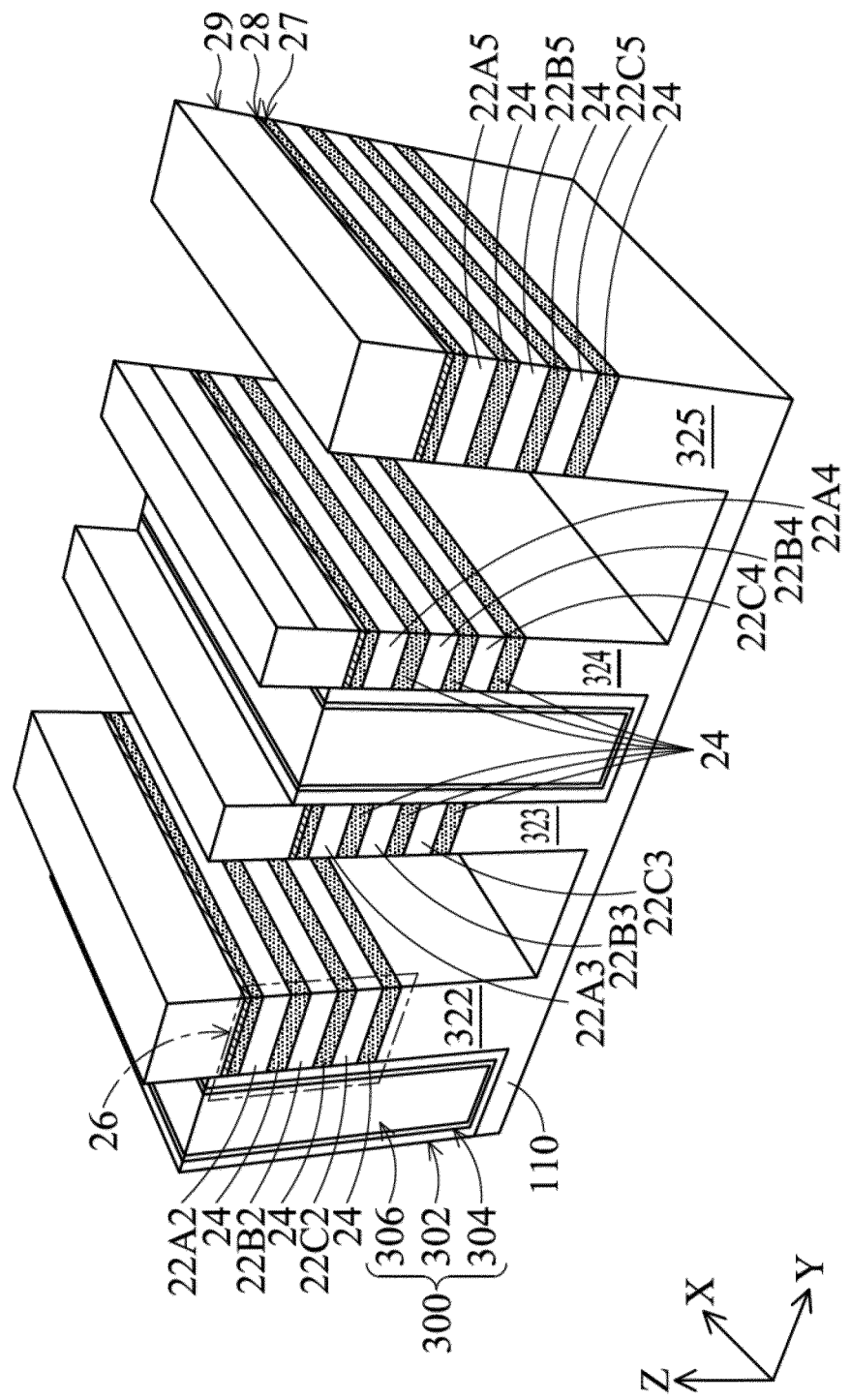

In FIG. 2C and FIG. 3C, wall structures 300 are formed in one or more of the trenches 35, corresponding to operation 1200 of FIG. 5. As shown, one wall structure 300 may be formed adjacent the fin 322 (e.g., between the fin 322 and the fin 321 shown in FIG. 1C and FIG. 1O), and another wall structure 300 may be formed between the fins 323, 324 and between the first stack and the second stack. Formation of the wall structures 300 may include one or more deposition operations. In some embodiments, the liner dielectric layer 302 is formed in a first deposition operation, such as a CVD, ALD or other suitable deposition operation. The liner dielectric layer 302 may be formed of a first dielectric material, such as a low-k dielectric material, which may be or include SiN, SiCN, SiOC, SiOCN, or the like, as described with reference to FIGS. 1A-1H.

Following formation of the liner dielectric layer 302, the etch stop layer 304 may be formed on the liner dielectric layer 302. Formation of the etch stop layer 304 may include an operation that oxidizes material of the liner dielectric layer 302. In some embodiments, the etch stop layer 304 is formed by depositing a layer of silicon oxide on the liner dielectric layer 302, for example, by high-density plasma CVD (HDP-CVD), flowable CVD (FCVD), the like, or a combination thereof.

Following formation of the etch stop layer 304, the core dielectric layer 306 is formed, for example, on the etch stop layer 304. In some embodiments, the core dielectric layer 306 is formed of the first dielectric material in a second deposition operation, or of a second dielectric material that is substantially different than the first dielectric material. The second deposition operation may be a CVD, ALD or other suitable deposition operation. The core dielectric layer 306 may be or include SiN, SiCN, SiOC, SiOCN, or the like.

As described with reference to FIG. 1I, the wall structure 300A may be formed instead of or in addition to the wall structure 300 shown in FIG. 2C or FIG. 3C. When forming the wall structure 300A, the etch stop layer 304 may not be formed, and the core dielectric layer 306 is a different material than the liner dielectric layer 302, such that the liner dielectric layer 302 has high etch selectivity against the core dielectric layer 306. For example, the liner dielectric layer 302 may be or include SiN or SiCN, and the core dielectric layer 306 may be or include SiOC or SiOCN. In some embodiments, the liner dielectric layer 302 may be or include SiOC or SiOCN, and the core dielectric layer 306 may be or include SiN or SiCN.

Following formation of the core dielectric layer 306 of the wall structure 300 or the wall structure 300A, the liner dielectric layer 302, the optional etch stop layer 304 and the core dielectric layer 306 may be etched to remove material thereof to a level below the upper surface of the hard mask layer 29. For example, as shown in FIG. 2C and FIG. 3C, the upper surface of the wall structure 300 (or the wall structure 300A) may be at a level above the uppermost channels 22A2, 22A3, 22A4, 22A5, above the second semiconductor layer 27, or above the oxide layer 28.

Figure 3D:
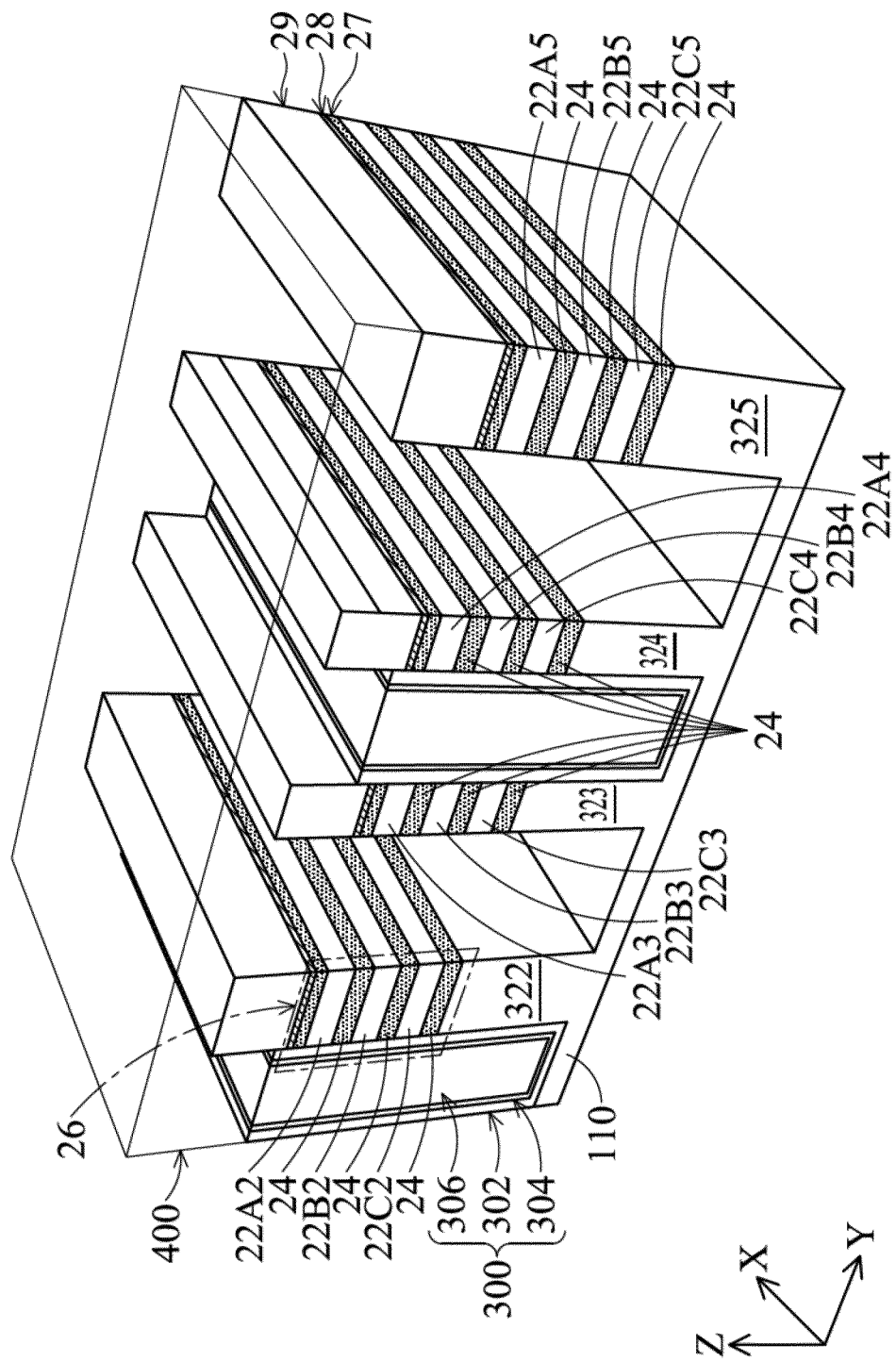

In FIG. 2D and FIG. 3D, laterally extending trenches 37 are formed (FIG. 2D) through the fins 322-325, overlying channels 22 and wall structures 300 (or wall structures 300A) in the region including logic devices, while a mask 400 is in place over the region including SRAM devices (FIG. 3D). The trenches 37 may extend to a level coplanar with, slightly above or slightly beneath that of the trenches 35. The trenches 37 extend in a direction (e.g., the Y-axis direction) that is perpendicular to or substantially perpendicular to the direction (e.g., the X-axis direction) in which the trenches 35 extend. One or more removal operations may be used to form the trenches 37. In some embodiments, the removal operations may be or include any acceptable etch process, such as a reactive ion etch (RIE), neutral beam etch (NBE), the like, or a combination thereof. The etching may be anisotropic. Distance between adjacent fins 322-325 and nanostructures 22, 24 in the X-axis direction may be from about 18 nm to about 100 nm. During formation of the trenches 37, a mask 400 may be in place over regions of the IC device 10 in which the SRAM devices are being formed. Isolation trenches or openings 520 for forming SRAM devices may be formed in a subsequent operation illustrated in FIGS. 2F and 3F.

Figure 3E:
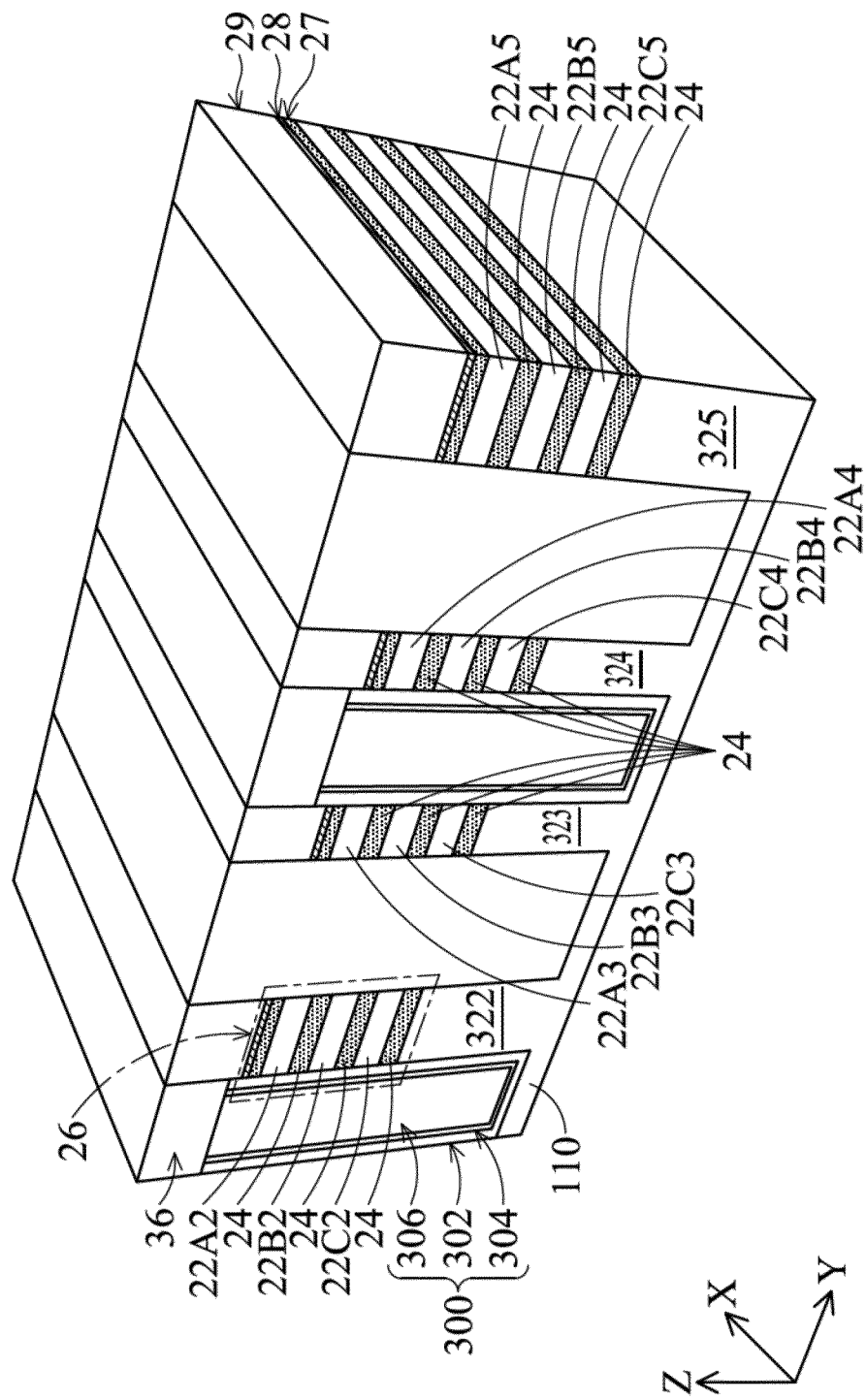

In FIGS. 2E-2H and FIGS. 3E-3H, isolation regions 361, 362, which may be shallow trench isolation (STI) regions, are formed adjacent and between the fins 322-325, corresponding to operation 1300 of FIG. 5. The isolation regions 361, 362 may be formed by depositing an insulation material layer 36 in the trenches 35, 37 (FIG. 2E) or in the trenches 35 (FIG. 3E). In some embodiments, the insulation material layer 36 is formed over the substrate 110, the fins 322-325, and nanostructures 22, 24, and between adjacent fins 322-325 and nanostructures 22, 24. The insulation material layer 36 may be an oxide, such as silicon oxide, a nitride, the like, or a combination thereof, and may be formed by high-density plasma CVD (HDP-CVD), flowable CVD (FCVD), the like, or a combination thereof. In some embodiments, a liner (not separately illustrated) may first be formed along surfaces of the substrate 110, the fins 322-325, and the nanostructures 22, 24. Thereafter, the insulation material layer 36 may be formed over the liner of a material such as those discussed above.

The insulation material layer 36 undergoes a removal process, such as a chemical mechanical polish (CMP), an etch-back process, combinations thereof, or the like, to remove excess insulation material of the insulation material layer 36 over hard mask 29, as shown in FIGS. 2E and 3E.

Figure 3F:
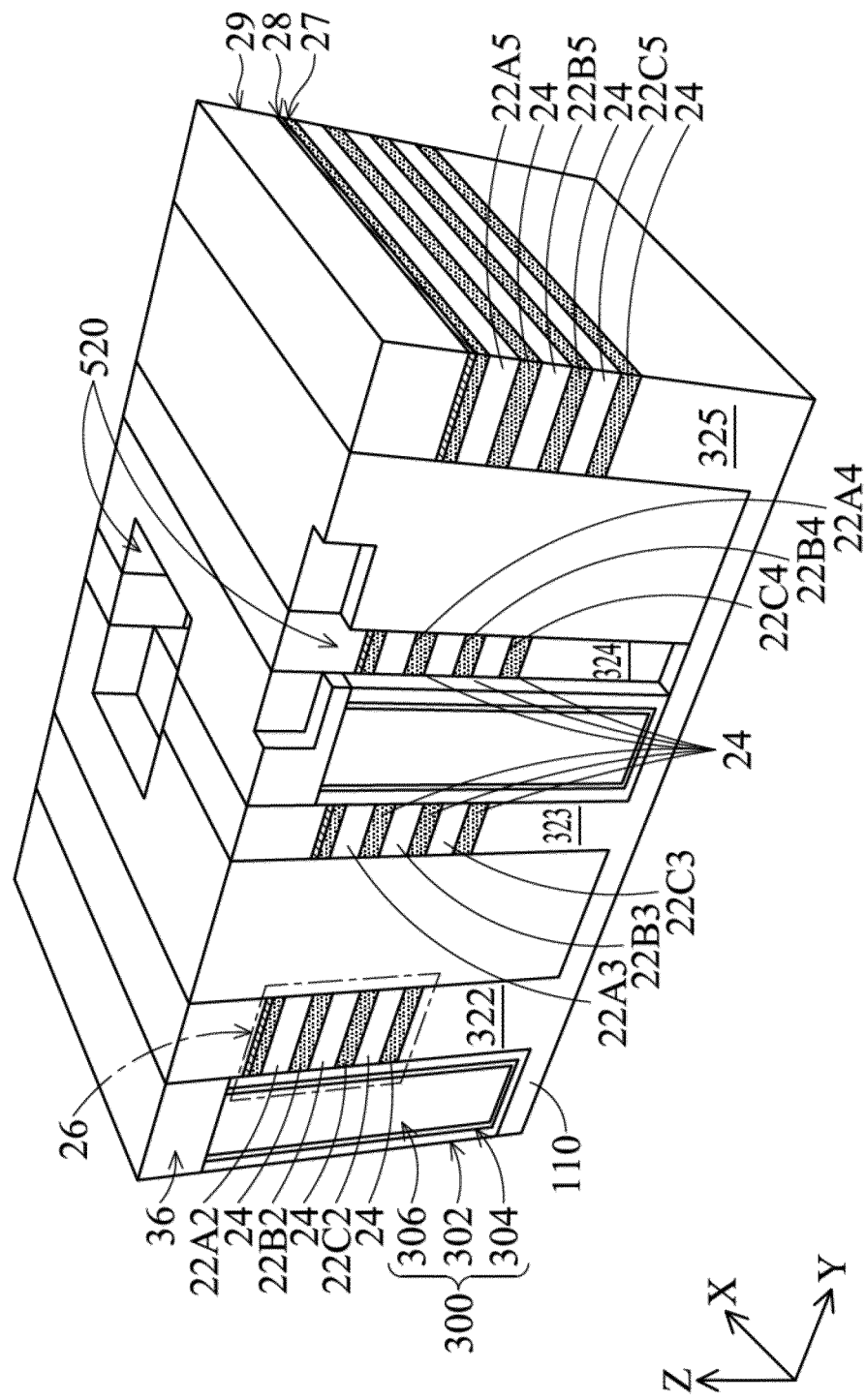

In FIGS. 2F and 3F, openings 520 are formed in the region including the SRAM devices (FIG. 3F) while a mask 500 is in place over the region including the logic devices (FIG. 2F). The openings 520 may be formed by one or more removal operations, such as suitable etch operations which may include RIE, NBE, atomic layer etch (ALE) or the like. As shown in FIG. 3F, the openings 520 extend through or partially through the insulation material layer 36, the hard mask 29, the oxide layer 28, the second semiconductor layer 27, the channels 22, the second semiconductor layers 24, and one or more of the fins 322-325 (e.g., the fin 323 and the fin 324, as shown). In some embodiments, the openings 520 land on the substrate 110, extend slightly into the substrate 110, or terminate slightly above the substrate 110 (e.g., leaving portions of the fins 323, 324 remaining). A portion of the insulation material layer 36 may cover the upper surface of the wall structure 300 (or the wall structure 300A) during formation of the openings 520.

Figure 3G:
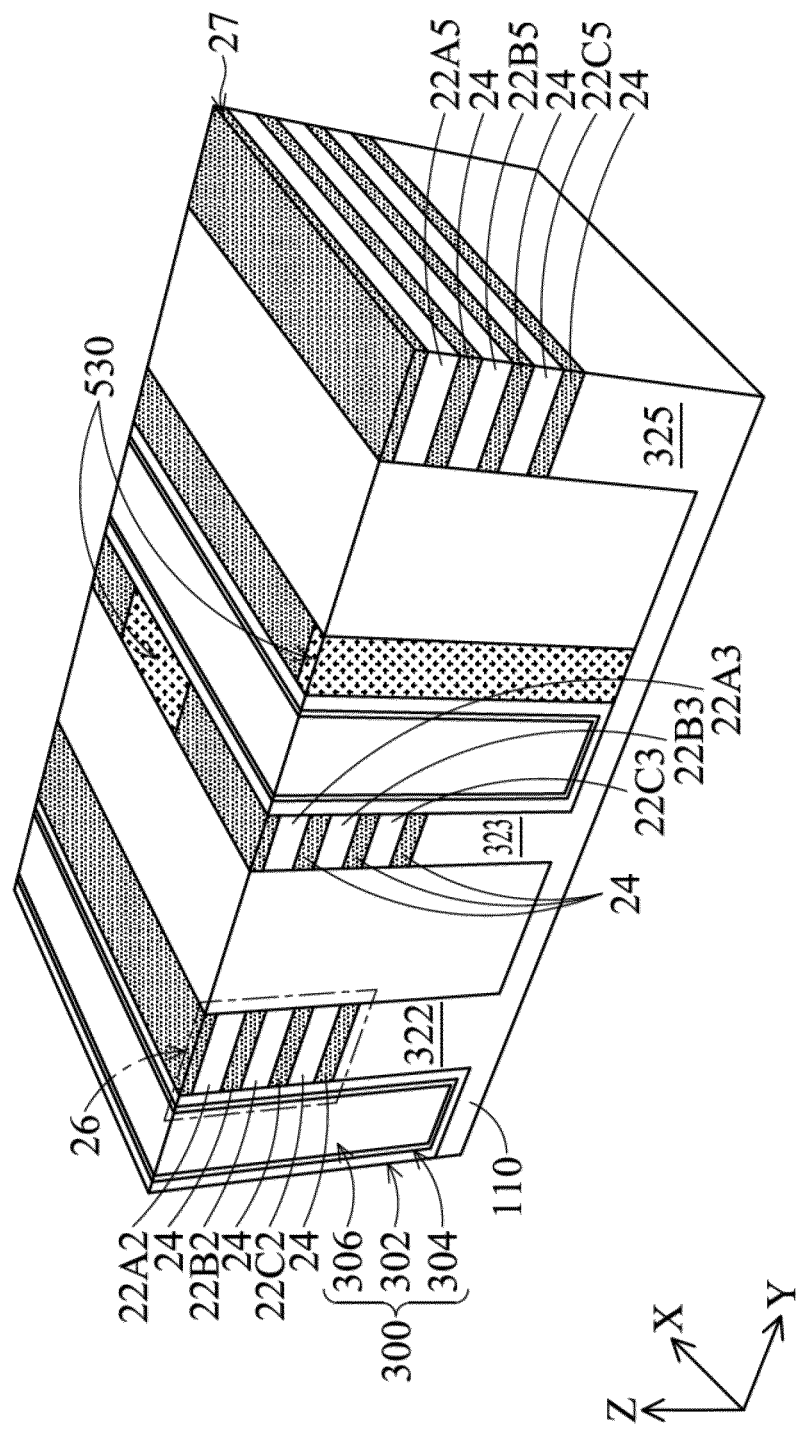

In FIGS. 2G and 3G, active area isolation structures 530 are formed in the region including the SRAM devices, then a second removal process is performed to remove the hard mask 29 and portions of the insulation material layer 36, the active area isolation structures 530 and the wall structure 300 (or the wall structure 300A) to expose the second semiconductor layer 27. The active area isolation structures 530 may be formed by a suitable deposition process, such as a CVD, ALD, or the like, that deposits the dielectric material of the active area isolation structures 530 in the openings 520. The second removal process may include a CMP, for example. Following the second removal process, upper surfaces of the wall structure 300 (or the wall structure 300A), the active area isolation structures 530 (in the region including SRAM device) the insulation material layer 36 and the second semiconductor layer 27 are coplanar or substantially coplanar.

Figure 3H:
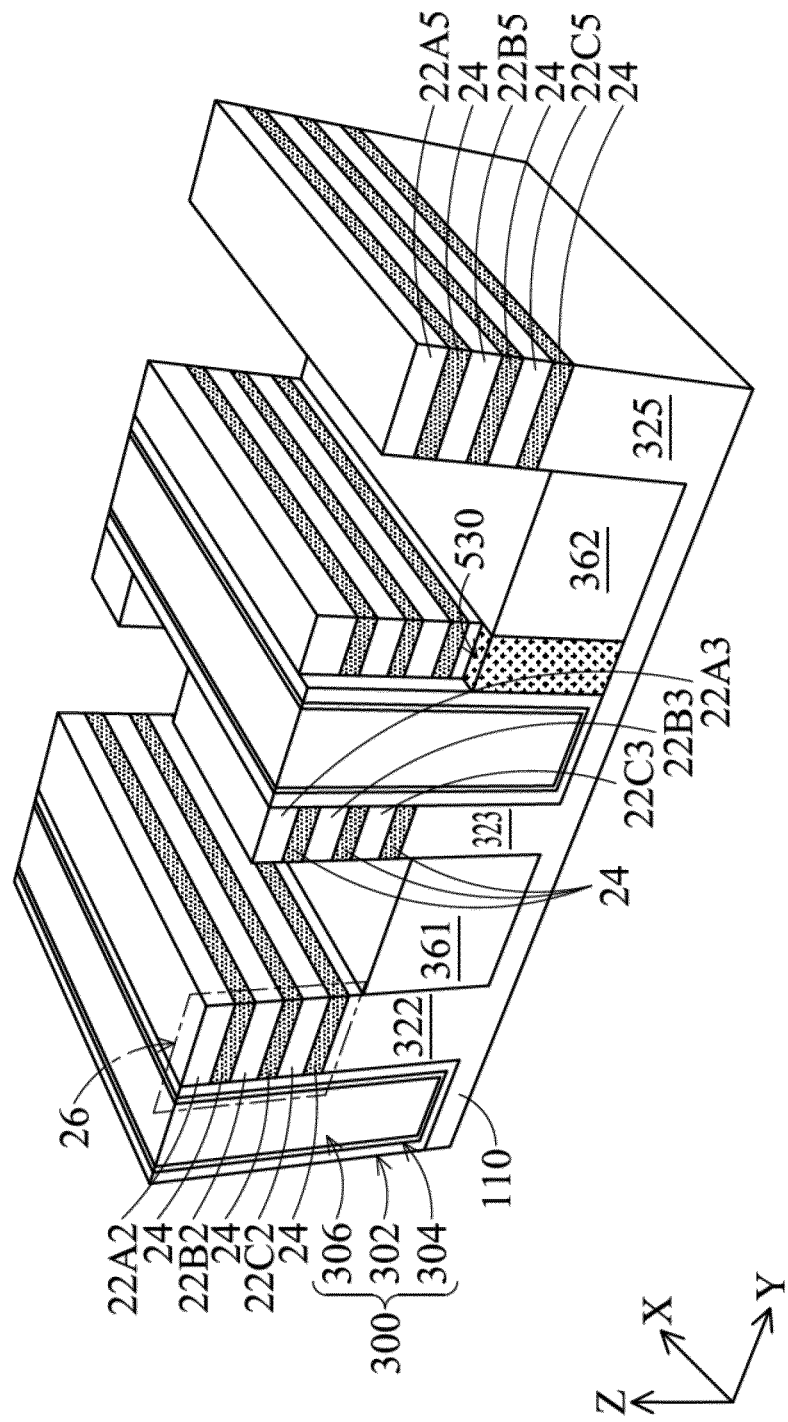

In FIGS. 2H and 3H, a third removal process is performed to remove the second semiconductor layer 27, and a fourth removal process is performed to recess the isolation regions 361, 362. The perspective view of FIG. 2H is shifted in the X-axis direction from that of FIGS. 2A-2G. In some embodiments, following the third removal process, top surfaces of the nanostructures 22 may be exposed and level with the insulation material layer 36 after the third removal process is complete. The insulation material layer 36 is then recessed to form the isolation regions 361, 362. After recessing the isolation regions 361, 362, the nanostructures 22, 24 and upper portions of the fins 322-325 may protrude over the isolation regions 361, 362. The isolation regions 361, 362 may have top surfaces that are flat as illustrated, convex, concave, or a combination thereof. In some embodiments, the isolation regions 361, 362 are recessed by an acceptable etching process, such as an oxide removal using, for example, dilute hydrofluoric acid (dHF), which is selective to the insulation material and leaves the fins 322-325 and the nanostructures 22, 24 substantially unaltered.

In FIG. 3H, in the region including SRAM devices, the active area isolation structures 530 are recessed, as shown. In some embodiments, the active area isolation structures 530 are recessed in the fourth removal process in which the isolation regions 361, 362 are formed. In some embodiments, the active area isolation structures 530 are recessed before or after the isolation regions 361, 362 are formed, for example, in a fifth removal process different than the fourth removal process. Following recessing of the insulation material layer 36 and the active area isolation structures 530, upper surfaces of the isolation regions 361, 362 and the active area isolation structures 530 may be coplanar or substantially coplanar (e.g., slightly offset from each other in the Z-axis direction).

In FIGS. 2H and 3H, appropriate wells (not separately illustrated) may be formed in the fins 322-325, the nanostructures 22, 24, and/or the isolation regions 361, 362. Using masks, an n-type impurity implant may be performed in p-type regions of the substrate 110, and a p-type impurity implant may be performed in n-type regions of the substrate 110. Example n-type impurities may include phosphorus, arsenic, antimony, or the like. Example p-type impurities may include boron, boron fluoride, indium, or the like. An anneal may be performed after the implants to repair implant damage and to activate the p-type and/or n-type impurities. In some embodiments, in situ doping during epitaxial growth of the fins 322-325 and the nanostructures 22, 24 may obviate separate implantations, although in situ and implantation doping may be used together.

FIGS. 2I-2P are perspective views illustrating formation of gate structures 200 and source/drain regions 82 in accordance with various embodiments. The description of FIGS. 2I-2P is applicable to both the region including logic devices and the region including SRAM devices.

In FIG. 2I, following formation of the isolation regions 361, 362, sacrificial gate structures 40 are formed over the fins 322-325, the wall structures 300 (or the wall structures 300A), the isolation regions 361, 362 and the nanostructures 22, 24. Three sacrificial gate structures 40 are shown in FIG. 2I, and many further sacrificial gate structures 40 may be formed substantially parallel to and concurrently with the sacrificial gate structures 40 shown.

When forming the sacrificial gate structures 40, a sacrificial gate layer 45 is formed over the fins 321-325 and/or the nanostructures 22, 24. The sacrificial gate layer 45 may be made of materials that have a high etch selectivity to the isolation regions 361, 362. The sacrificial gate layer 45 may be a conductive, semiconductive, or non-conductive material and may be or include amorphous silicon, polycrystalline-silicon (polysilicon), poly-crystalline silicon-germanium (poly-SiGe), metallic nitrides, metallic silicides, metallic oxides, and metals. The sacrificial gate layer 45 may be deposited by physical vapor deposition (PVD), CVD, sputter deposition, or other techniques for depositing the selected material. First and second mask layers 47A, 47B are formed over the sacrificial gate layer 45, and may include, for example, silicon nitride, silicon oxynitride, or the like. In some embodiments, a gate dielectric layer 44 is formed before the sacrificial gate layer 45 between the sacrificial gate layer 45 and the fins 322-325 and/or the nanostructures 22, 24.

In FIG. 2J, following formation of the sacrificial gate structures 40, one or more gate spacer layers 41 are formed covering the sacrificial gate structures 40 and exposed regions of the stacks 26, the fins 322-325, the isolation regions 361, 362 and the wall structures 300 (or the wall structures 300A). The gate spacer layer 41 is formed by any suitable deposition process, such as a PVD, CVD, ALD, or the like. Following formation of the gate spacer layer 41, horizontal portions (e.g., in the X-Y plane) of the gate spacer layer 41 may be removed, thereby exposing upper surfaces of the stacks 26, the wall structures 300 (or the wall structures 300A) and the isolation regions 361, 362. In some embodiments, capping portions 41C of the gate spacer layer 41 remain over edge portions 361E, 362E of the isolation regions 361, 362, respectively, after removal of the horizontal portions of the gate spacer layer 41.

Following removal of the horizontal portions of the gate spacer layer 41, one or more removal operations are performed to recess the stacks 26, the wall structures 300 (or the wall structures 300A), the isolation regions 361, 362 and the fins 322-325 exposed through the gate spacer layer 41. The removal operations may include suitable etch operations for removing materials of the channels 22, the second semiconductor layers 24, the fins 322-325, the wall structures 300 (or the wall structures 300A) and the isolation regions 361, 362, such as RIE, NBE, ALE, or the like.

In FIG. 2K, inner spacers 74 are formed. A selective etching process is performed to recess exposed end portions of the nanostructures 24 without substantially attacking the nanostructures 22. After the selective etching process, recesses are formed in the nanostructures 24 at locations where the removed end portions used to be. Next, an inner spacer layer is formed to fill the recesses between the nanostructures 22 formed by the previous selective etching process. The inner spacer layer may be a suitable dielectric material, such as silicon carbon nitride (SiCN), silicon oxycarbonitride (SiOCN), or the like, formed by a suitable deposition method such as PVD, CVD, ALD, or the like. An etching process, such as an anisotropic etching process, is performed to remove portions of the inner spacer layers disposed outside the recesses in the nanostructures 24. The remaining portions of the inner spacer layers (e.g., portions disposed inside the recesses in the nanostructures 24) form the inner spacers 74. The resulting structure is shown in FIG. 2K.

FIG. 2L illustrates formation of the source/drain regions 82, corresponding to operation 1400 of FIG. 5. In the illustrated embodiment, the source/drain regions 82 are epitaxially grown from epitaxial material(s). The source/drain regions 82 are grown on exposed portions of the fins 322-325 and contact the nanostructures 22. Initially, the source/drain regions 82 grow between neighboring isolation structures or between an isolation structure and a wall structure, for example, between the wall structure 300 and the isolation structure 361 on the fin 322, as shown. The capping portion 41C on the isolation structure 361 laterally confines the source/drain region 82 as it grows upward from the fin 322. In some embodiments, the source/drain regions 82 exert stress in the respective channels 22, thereby improving performance. The source/drain regions 82 are formed such that each sacrificial gate structure 40 is disposed between respective neighboring pairs of the source/drain regions 82. In some embodiments, the spacer layer 41 and the inner spacers 74 separate the source/drain regions 82 from the sacrificial gate layer 45 by an appropriate lateral distance (e.g., in the X-axis direction) to prevent electrical bridging to subsequently formed gates of the resulting device.

The source/drain regions 82 may include any acceptable material, such as appropriate for n-type or p-type devices. For n-type devices, the source/drain regions 82 include materials exerting a tensile strain in the channel regions, such as silicon, SiC, SiCP, SiP, or the like, in some embodiments. When p-type devices are formed, the source/drain regions 82 include materials exerting a compressive strain in the channel regions, such as SiGe, SiGeB, Ge, GeSn, or the like, in accordance with certain embodiments. The source/drain regions 82 may have surfaces raised from respective surfaces of the fins and may have facets. Neighboring source/drain regions 82 may merge in some embodiments to form a singular source/drain region 82 over two neighboring fins of the fins 322-325.

The source/drain regions 82 may be implanted with dopants followed by an anneal. The source/drain regions may have an impurity concentration of between about $10^{19}$ cm$^{-3}$ and about $10^{21}$ cm$^{-3}$. N-type and/or p-type impurities for source/drain regions 82 may be any of the impurities previously discussed. In some embodiments, the source/drain regions 82 are in situ doped during growth. A contact etch stop layer (CESL) and interlayer dielectric (ILD), not illustrated for simplicity, may then be formed covering the sacrificial gate structures 40 and the source/drain regions 82.

In FIG. 2M, one or more of the source/drain regions 82 are cut or trimmed, such that the source/drain regions 82 have cross-sectional profile in the Y-Z plane that is forksheet shaped, corresponding to operation 1500 of FIG. 5. Portions of the source/drain regions 82 overlapping the wall structure 300 or 300A are trimmed in operation 1500. Prior to an etch operation used to trim the source/drain regions 82, a patterned mask 550 may be formed overlying the source/drain regions 82, the sacrificial gate structures 40, the gate spacer layer 41 and the isolation regions 361, 362. The patterned mask 550 includes openings 39 that expose second lateral extensions 82EX2 (see FIG. 1G) of the source/drain regions 82 that overlie the wall structures 300 or 300A. In some embodiments, the openings 39 are trenches that extend in the X-axis direction. The etch operation is performed through the openings 39, and may include a suitable anisotropic etch that does not substantially attack portions of the source/drain regions 82 covered by the patterned mask 550. Following removal of the lateral edge portions of the source/drain regions 82, lateral extension of the source/drain region 82 past edges of the channels 22 may be in a range of about 0 nm to about 10 nm on the side that is trimmed, and may be in a range of about 10 nm to about 20 nm on the side that is covered by the patterned mask 550.

In FIG. 2N, channels 22 are released by removal of the nanostructures 24, the mask layer 47, and the sacrificial gate layer 45. Prior to release, a planarization process, such as a CMP, may be performed to level the top surfaces of the sacrificial gate layer 45 and gate spacer layer 41. The planarization process may also remove the mask layers 47A, 47B on the sacrificial gate layer 45, and portions of the gate spacer layer 41 along sidewalls of the mask layer 47. Accordingly, the top surfaces of the sacrificial gate layer 45 are exposed.

Next, the sacrificial gate layer 45 is removed in an etching process, so that recesses are formed. In some embodiments, the sacrificial gate layer 45 is removed by an anisotropic dry etch process. For example, the etching process may include a dry etch process using reaction gas(es) that selectively etch the sacrificial gate layer 45 without etching the spacer layer 41. The sacrificial gate dielectric 44, when present, may be used as an etch stop layer when the sacrificial gate layer 45 is etched. The sacrificial gate dielectric 44 may then be removed after the removal of the sacrificial gate layer 45.

The nanostructures 24 are removed to release the nanostructures 22. After the nanostructures 24 are removed, the nanostructures 22 form a plurality of nanosheets that extend horizontally (e.g., parallel to a major upper surface of the substrate 110). The nanosheets may be collectively referred to as the channels 22 of the nanostructure devices 20A-20E formed.

In some embodiments, the nanostructures 24 are removed by a selective etching process using an etchant that is selective to the material of the nanostructures 24, such that the nanostructures 24 are removed without substantially attacking the nanostructures 22. In some embodiments, the etching process is an isotropic etching process using an etching gas, and optionally, a carrier gas, where the etching gas comprises $F_2$ and HF, and the carrier gas may be an inert gas such as Ar, He, $N_2$, combinations thereof, or the like.

In some embodiments, the nanostructures 24 are removed and the nanostructures 22 are patterned to form channel regions of both PFETs and NFETs. In some other embodiments, the nanostructures 22 may be removed and the nanostructures 24 may be patterned to form channel regions of both PFETs and NFETs.

In some embodiments, the nanosheets 22 of the nanostructure devices 20A-20E are reshaped (e.g. thinned) by a further etching process to improve gate fill window. The reshaping may be performed by an isotropic etching process selective to the nanosheets 22. After reshaping, the nanosheets 22 may exhibit the dog bone shape in which middle portions of the nanosheets 22 are thinner than peripheral portions of the nanosheets 22 along the X-axis direction.

In some embodiments, prior to removal of the nanostructures 24, the mask layer 47, and the sacrificial gate layer 45, the ILD 130 is deposited over the source/drain regions 82. The etch stop layer 131 may also be formed prior to deposition of the ILD 130. Following deposition of the ILD 130, the ILD 130 may be recessed slightly, and a second etch stop layer may be formed over the ILD 130 in the recess (not specifically illustrated in the figures). A CMP operation or the like may then be performed to remove excess material of the second etch stop layer, such that an upper surface of the second etch stop layer is substantially planar with upper surfaces of the etch stop layer 131 and the gate spacers 41.

Figure 4:
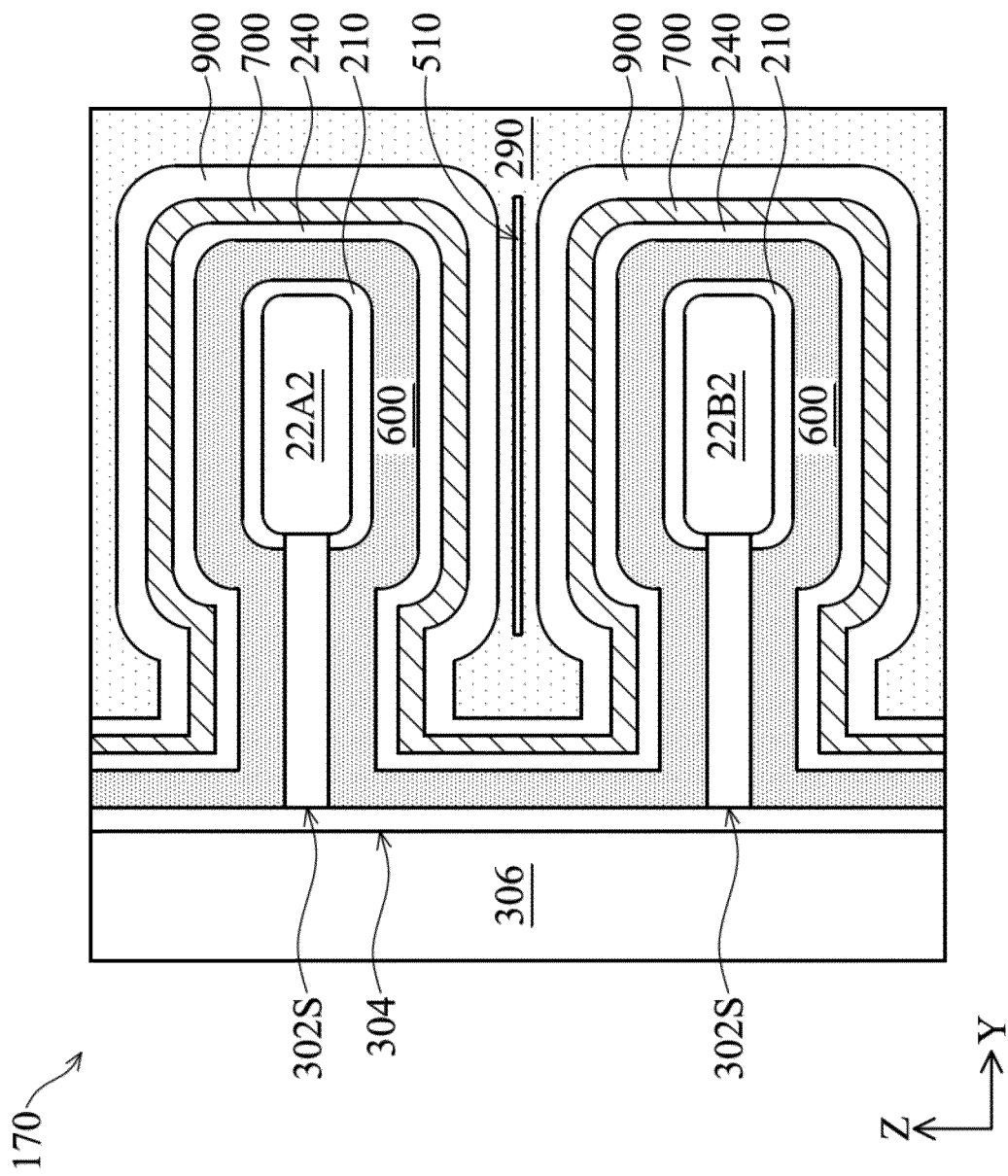
FIG. 4 is diagrammatic cross-sectional side view of a gate structure in accordance with various embodiments.

In FIG. 2O, uncut replacement gate 200U is formed, corresponding to operation 1600 of FIG. 5. The uncut replacement gate 200U may be formed by one or more deposition operations, such as a CVD, ALD, or the like. FIG. 4 is a detailed view of the region 170 of FIG. 2O corresponding to a portion of the gate structure 200B (see FIG. 2Q). Each replacement gate 200, as illustrated by the gate structure 200B in FIG. 4, generally includes the interfacial layer (IL, or "first IL" below) 210, at least one gate dielectric layer 600, the work function metal layer 900, and the conductive fill layer 290. In some embodiments, each replacement gate 200 further includes at least one of a second interfacial layer 240 or a second work function layer 700.

With reference to FIG. 4, in some embodiments, the first IL 210 includes an oxide of the semiconductor material of the substrate 110, e.g. silicon oxide. In other embodiments, the first IL 210 may include another suitable type of dielectric material. The first IL 210 has a thickness in a range between about 5 angstroms and about 50 angstroms. As shown in FIG. 4, due to presence of the spacer portions 302S adjacent the channels 22, the first IL 210 may terminate on bottom and top surfaces of the spacer portions 302S.

Still referring to FIG. 4, the gate dielectric layer 600 is formed over the first IL 210. In some embodiments, an atomic layer deposition (ALD) process is used to form the gate dielectric layer 600 to control thickness of the deposited gate dielectric layer 600 with precision. In some embodiments, the ALD process is performed using between about 40 and 80 deposition cycles, at a temperature range between about 200 degrees Celsius and about 300 degrees Celsius. In some embodiments, the ALD process uses HfCl4 and/or H2O as precursors. Such an ALD process may form the first gate dielectric layer 220 to have a thickness in a range between about 10 angstroms and about 100 angstroms. As shown in FIG. 4, the gate dielectric layer 600 may be a continuous layer that conforms to (e.g., is in contact with) sidewalls of the etch stop layer 304 of the wall structure 300 (or the core dielectric layer 306 of the wall structure 300A), the bottom and top surfaces of the spacer portions 302S and the first IL 210 or the channels 22 when the first IL 210 is not present.

In some embodiments, the gate dielectric layer 600 includes a high-k dielectric material, which may refer to dielectric materials having a high dielectric constant that is greater than a dielectric constant of silicon oxide (k≈3.9).

Exemplary high-k dielectric materials include $HfO_2$, HfSiO, HfSiON, HfTaO, HfTiO, HfZrO, $ZrO_2$, $Ta_2O_5$, or combinations thereof. In other embodiments, the gate dielectric layer 600 may include a non-high-k dielectric material such as silicon oxide. In some embodiments, the gate dielectric layer 600 includes more than one high-k dielectric layer, of which at least one includes dopants, such as lanthanum, magnesium, yttrium, or the like, which may be driven in by an annealing process to modify threshold voltage of the nanostructure devices 20A-20E.

With further reference to FIG. 4, the second IL 240 is formed on the gate dielectric layer 600, and the second work function layer 700 is formed on the second IL 240. The second IL 240 promotes better metal gate adhesion on the gate dielectric layer 600. In many embodiments, the second IL 240 further provides improved thermal stability for the gate structure 200B, and serves to limit diffusion of metallic impurity from the work function metal layer 900 and/or the work function barrier layer 700 into the gate dielectric layer 600. In some embodiments, formation of the second IL 240 is accomplished by first depositing a high-k capping layer (not illustrated for simplicity) on the gate dielectric layer 600. The high-k capping layer comprises one or more of the following: HfSiON, HfTaO, HfTiO, HfTaO, HfAlON, HfZrO, or other suitable materials, in various embodiments. In a specific embodiment, the high-k capping layer comprises titanium silicon nitride (TiSiN). In some embodiments, the high-k capping layer is deposited by an ALD using about 40 to about 100 cycles at a temperature of about 400 degrees C. to about 450 degrees C. A thermal anneal is then performed to form the second IL 240, which may be or comprise TiSiNO, in some embodiments. Following formation of the second IL 240 by thermal anneal, an atomic layer etch (ALE) with artificial intelligence (AI) control may be performed in cycles to remove the high-k capping layer while substantially not removing the second IL 240. Each cycle may include a first pulse of $WCl_5$, followed by an Ar purge, followed by a second pulse of $O_2$, followed by another Ar purge. The high-k capping layer is removed to increase gate fill window for further multiple threshold voltage tuning by metal gate patterning.

Further in FIG. 4, after forming the second IL 240 and removing the high-k capping layer, the work function barrier layer 700 is optionally formed, in accordance with some embodiments. The work function barrier layer 700 is or comprises a metal nitride, such as TiN, WN, MoN, TaN, or the like. In a specific embodiment, the work function barrier layer 700 is TiN. The work function barrier layer 700 may have thickness ranging from about 5 A to about 20 A. Inclusion of the work function barrier layer 700 provides additional threshold voltage tuning flexibility. In general, the work function barrier layer 700 increases the threshold voltage for NFET transistor devices, and decreases the threshold voltage (magnitude) for PFET transistor devices.

The work function metal layer 900, which may include at least one of an N-type work function metal layer, an in-situ capping layer, or an oxygen blocking layer, is formed on the work function barrier layer 700, in some embodiments. The N-type work function metal layer is or comprises an N-type metal material, such as TiAlC, TiAl, TaAlC, TaAl, or the like. The N-type work function metal layer may be formed by one or more deposition methods, such as CVD, PVD, ALD, plating, and/or other suitable methods, and has a thickness between about 10 A and 20 A. The in-situ capping layer is formed on the N-type work function metal layer. In some embodiments, the in-situ capping layer is or comprises TiN, TiSiN, TaN, or another suitable material, and has a thickness between about 10 A and 20 A. The oxygen blocking layer is formed on the in-situ capping layer to prevent oxygen diffusion into the N-type work function metal layer, which would cause an undesirable shift in the threshold voltage. The oxygen blocking layer is formed of a dielectric material that can stop oxygen from penetrating to the N-type work function metal layer, and may protect the N-type work function metal layer from further oxidation. The oxygen blocking layer may include an oxide of silicon, germanium, SiGe, or another suitable material. In some embodiments, the oxygen blocking layer is formed using ALD and has a thickness between about 10 A and about 20 A.

FIG. 4 further illustrates the conductive fill layer 290. In some embodiments, a glue layer (not separately illustrated) is formed between the oxygen blocking layer of the work function metal layer and the conductive fill layer 290. The glue layer may promote and/or enhance the adhesion between the conductive fill layer 290 and the work function metal layer 900. In some embodiments, the glue layer may be formed of a metal nitride, such as TiN, TaN, MoN, WN, or another suitable material, using ALD. In some embodiments, thickness of the glue layer is between about 10 A and about 25 A. The conductive fill layer 290 may be formed on the glue layer, and may include a conductive material such as tungsten, cobalt, ruthenium, iridium, molybdenum, copper, aluminum, or combinations thereof. In some embodiments, the conductive fill layer 290 may be deposited using methods such as CVD, PVD, plating, and/or other suitable processes. In some embodiments, a seam 510, which may be an air gap, is formed in the conductive fill layer 290 vertically between the channels 22A2, 22B2. In some embodiments, the conductive fill layer 290 is conformally deposited on the work function metal layer 900. The seam 510 may form due to sidewall deposited film merging during the conformal deposition. In some embodiments, the seam 510 is not present between the neighboring channels 22A2, 22B2.

FIG. 2P illustrates formation of the second conductive layer 297. Prior to deposition of the second conductive layer 297, the uncut gate structure 200U may be recessed by, for example, a suitable etch operation. The etch operation may include an isotropic etch or an anisotropic etch that removes the conductive fill layer 290 without substantially attacking the gate spacer layer 41, the etch stop layer 131 and the ILD 130. Following the etch operation that recesses the uncut gate structure 200U, the second conductive layer 297 may be deposited by an appropriate deposition operation, which may include a PVD, sputtering, a CVD, an ALD, or the like. In some embodiments, the second conductive layer 297 is formed by depositing a conductive material, such as tungsten. Following deposition of the second conductive layer 297, excess conductive material overlying the etch stop layer 131, the ILD 130 and the gate spacer layer 41 may be removed by, for example, a CHIP.

Figure 3I:
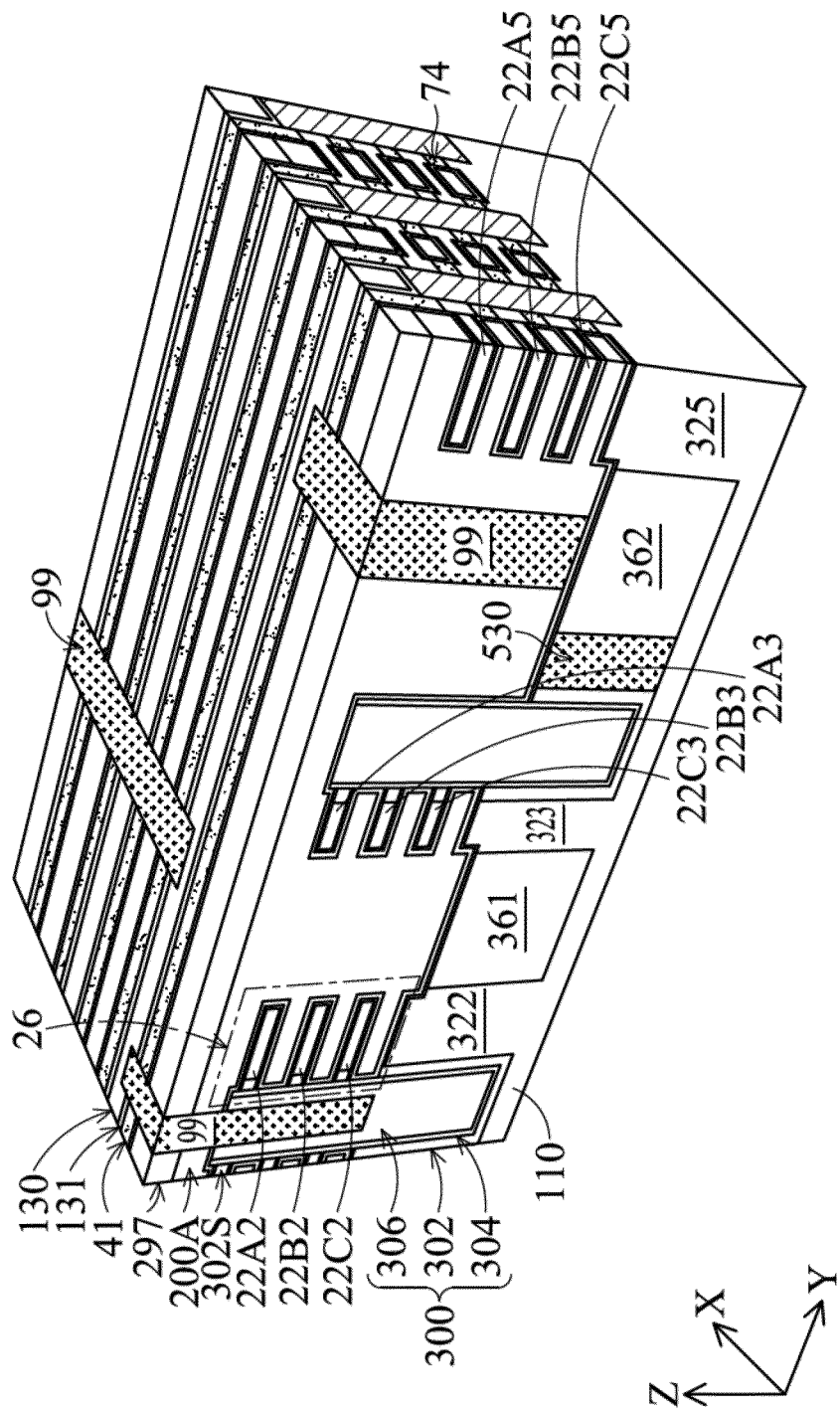

FIGS. 2Q and 3I illustrate formation of gate isolation structures 99. In FIG. 2Q and FIG. 3I, one or more mask layers may be formed over the uncut gate structure 200U. The mask layers may include silicon, such as polycrystalline silicon or amorphous silicon. The thickness of the mask layers may be in a range from about 100 nm to about 200 nm, in some embodiments. In some embodiments, an uppermost mask layer of the mask layers is subjected to a planarization operation. The mask layers may include a hard mask layer, which may be deposited using any suitable processes, including spin coating, LPCVD, PECVD, PVD, ALD, or other suitable processes. The hard mask layer includes one or more layers of SiN, SOC, or the like, in accordance with some embodiments.

The hard mask layer may be etched to form openings over one or more of the wall structures 300 or 300A, one or more of the isolation regions 361, 362, or both. As illustrated in FIG. 2Q and FIG. 3I, one of the openings is formed over and exposing the wall structure 300 between the fins 321, 322, and another of the openings is formed over the isolation structure 362. When formed over one of the wall structures 300 or 300A, the opening may have width (in the Y-axis direction) less than width of the wall structure 300, though larger widths may also be suitable.

To form the openings, in some embodiments, a photoresist pattern (not separately illustrated) is formed over the hard mask layer, and the hard mask layer is etched first by an anisotropic etching process selective to the material of the hard mask layer, which forms an upper portion of the openings extending from the upper surface of the hard mask layer to expose the upper surface of the second conductive layer 297. Following etching of the hard mask layer, the photoresist pattern may be removed, and the hard mask layer may be used as a mask while forming a lower portion of the openings extending through the second conductive layer 297, the uncut gate structure 200U and optionally into the wall structure 300 or 300A.

In FIGS. 2Q and 3I, following formation of the openings, the gate isolation structures 99 are formed in the openings. In some embodiments, the gate isolation structures 99 are or include silicon nitride, silicon oxide, Al2O3, ZrO2 or another suitable material. The gate isolation structures 99 may be deposited in the openings by a suitable process, such as CVD and/or other suitable technique. Following deposition of the gate isolation structures 99, a removal process, such as CHIP or another suitable process, can be performed to remove excess material of the gate isolation structures 99 from over the second conductive layer 297, such that upper surfaces of the gate isolation structures 99 are substantially level with upper surfaces of the second conductive layer 297. The gate isolation structures 99 generally inherit the shape of the openings. At this point, the gate structures 200A-200C are electrically isolated from each other.

Embodiments may provide advantages. By forming the wall structures 300 or 300A at cell boundaries, gate-drain capacitance is reduced by reducing metal gate endcap and source/drain epitaxy size. Active area spacing is also reduced. The wall structure may be a multi-layer structure, which allows for extending gate structure 200 overlap with channels 22 by removing portions of the liner dielectric layer 302 of the wall structure 300 or 300A, thereby increasing control of current through the channels 22 by the gate structure 200. Source/drain regions 82 adjacent the wall structure are cut or trimmed to prevent merger of neighboring source/drain regions 82. By reducing the metal gate endcap and source/drain region 82 lateral dimensions, gate-drain capacitance may be reduced. As such, device performance is boosted, and active area spacing between nanostructure devices 20A-20E may be reduced, which saves chip area.

In accordance with at least one embodiment, a device includes a first vertical stack of nanostructures over a substrate, a second vertical stack of nanostructures over the substrate, a wall structure between and in direct contact with the first and second vertical stacks, a gate structure wrapping around three sides of the nanostructures and a source/drain region beside the first vertical stack of nanostructures.

In accordance with at least one embodiment, a device includes a plurality of nanostructures, a gate structure and a source/drain region. The plurality of nanostructures is over a substrate. Each of the nanostructures includes: an upper side; a lower side opposite the upper side; a first lateral side facing a first lateral direction; a second lateral side opposite the first lateral side; a third lateral side facing a second lateral direction transverse the first lateral direction; and a fourth lateral side opposite the third lateral side. The gate structure extends in the first lateral direction, and contacts the upper, lower and first lateral sides of each of the nanostructures. The gate structure is isolated from the third and fourth lateral sides of each of the nanostructures. The source/drain region is beside the plurality of nanostructures, and has an asymmetric shape in the first lateral direction.

In accordance with at least one embodiment, a method includes: forming a first stack of nanostructures, a second stack of nanostructures, and a third stack of nanostructures, the first, second and third stacks being laterally separated from each other; forming a wall structure between the first and second stacks; forming an isolation region between the second and third stacks; forming a first source/drain region contacting the first stack, forming a second source/drain region contacting the second stack, and forming a third source/drain region contacting the third stack; trimming portions of the first and second source/drain regions, the portions facing each other and vertically overlapping the wall structure; and forming a gate structure over the first, second and third stacks.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
a first vertical stack of nanostructures over a substrate;
a second vertical stack of nanostructures over the substrate;
a wall structure between and in direct contact with the first and second vertical stacks, the wall structure including:
a core dielectric layer; and
a liner dielectric layer located between the core dielectric layer and the first and second vertical stacks;
a gate structure wrapping around three sides of the nanostructures; and
a source/drain region beside the first vertical stack of nanostructures,
wherein the liner dielectric layer includes spacer portions vertically separated from each other by the gate structure.

2. The device of claim 1, wherein the liner dielectric layer is or includes silicon nitride (SiN) or silicon carbon nitride (SiCN).

3. The device of claim 1, wherein the core dielectric layer and the liner dielectric layer have different etch selectivity.

4. The device of claim 3, wherein the core dielectric layer is in contact with the liner dielectric layer.

5. The device of claim 1, wherein the liner dielectric layer has substantially the same etch selectivity as the core dielectric layer, the wall structure further including:

an etch stop layer between the liner dielectric layer and the core dielectric layer.

6. The device of claim 1, wherein each nanostructure has an upper side, a lower side, and four lateral sides, and the gate structure contacts only three of the lateral sides.

7. The device of claim 1, wherein the gate structure includes:
a dielectric layer that is in contact with upper surfaces and lower surfaces of the spacer portions; and
a conductive layer that is vertically separated from the spacer portions by the dielectric layer.

8. The device of claim 1, further comprising:
a gate isolation structure that extends through the gate structure and contacts the wall structure.

9. The device of claim 8, wherein the gate isolation structure extends into the wall structure.

10. A device, comprising:
a plurality of nanostructures over a substrate, each of the nanostructures including:
an upper side;
a lower side opposite the upper side;
a first lateral side facing a first lateral direction;
a second lateral side opposite the first lateral side;
a third lateral side facing a second lateral direction transverse the first lateral direction; and
a fourth lateral side opposite the third lateral side;
a gate structure extending in the first lateral direction, the gate structure contacting the upper, lower and first lateral sides of each of the nanostructures, the gate structure being isolated from the third and fourth lateral sides of each of the nanostructures; and
a source/drain region beside the plurality of nanostructures, the source/drain region having an asymmetric shape in the first lateral direction,
wherein the plurality of nanostructures comprises a first vertical stack of nanostructures and a second vertical stack of nanostructures over the substrate; and
further comprising a wall structure between and in direct contact with the first vertical stack and the second vertical stack, the wall structure including:
a core dielectric layer; and
a liner dielectric layer located between the core dielectric layer and the first and second vertical stacks, wherein the liner dielectric layer includes spacer portions vertically separated from each other by the gate structure.

11. The device of claim 10, wherein the source/drain region includes:
a first lateral extension that extends laterally beyond the plurality of nanostructures in the first lateral direction by a first width; and
a second lateral extension that extends laterally beyond the plurality of nanostructures in a direction opposite the first lateral direction by a second width less than the first width.

12. The device of claim 10, wherein the source/drain region is epitaxially grown on sidewalls of the plurality of nanostructures and has a first lateral extension and a second lateral extension of different widths.

13. The device of claim 10, further comprising:
an isolation region on a first side of the source/drain region; and
a wall structure on a second side of the source/drain region, the second side being opposite the first side.

14. The device of claim 13, further comprising a gate spacer layer on the gate structure, the gate spacer layer including:
a capping portion on an edge portion of the isolation region.

15. The device of claim 14, wherein the capping portion is in contact with the source/drain region.

16. A device, comprising:
a first vertical stack of nanostructures over a substrate;
a second vertical stack of nanostructures over the substrate;
a wall structure between and in direct contact with the first and second vertical stacks, wherein the wall structure includes:
a core dielectric layer; and
a liner dielectric layer between the core dielectric layer and the first and second vertical stacks; and
a gate structure wrapping around three sides of the nanostructures;
wherein the liner dielectric layer includes spacer portions vertically separated from each other by the gate structure.

17. The device of claim 16, wherein the liner dielectric layer is or includes SiN or SiOC, and the core dielectric layer is or includes SiOCN.

18. The device of claim 16, wherein the liner dielectric layer has substantially the same etch selectivity as the core dielectric layer, the wall structure further including:
an etch stop layer between the liner dielectric layer and the core dielectric layer.

19. The device of claim 16, wherein the liner dielectric layer further comprises vertical extension from the substrate up to or above an uppermost nanostructure in each stack.

20. The device of claim 16, further comprising:
a gate isolation structure that extends through the gate structure and contacts the wall structure.

* * * * *